(12) United States Patent
Funyuu et al.

(10) Patent No.: US 10,840,452 B2
(45) Date of Patent: Nov. 17, 2020

(54) ORGANIC ELECTRONIC MATERIAL INCLUDING CHARGE TRANSPORT POLYMER OR OLIGOMER HAVING STRUCTURAL UNIT CONTAINING AROMATIC AMINE STRUCTURE SUBSTITUTED WITH FLUORINE ATOM, ORGANIC ELECTRONIC ELEMENT, AND ORGANIC ELECTROLUMINESCENT ELEMENT

(71) Applicant: HITACHI CHEMICAL COMPANY, LTD., Tokyo (JP)

(72) Inventors: Shigeaki Funyuu, Tsuchiura (JP);
Tomotsugu Sugioka, Ibaraki (JP);
Kenichi Ishitsuka, Nagareyama (JP);
Naoki Asano, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 16/068,726

(22) PCT Filed: Jan. 6, 2017

(86) PCT No.: PCT/JP2017/000265
§ 371 (c)(1),
(2) Date: Jul. 9, 2018

(87) PCT Pub. No.: WO2017/119483
PCT Pub. Date: Jul. 13, 2017

(65) Prior Publication Data
US 2019/0027689 A1    Jan. 24, 2019

(30) Foreign Application Priority Data

Jan. 8, 2016    (JP) ................................ 2016-002748

(51) Int. Cl.
*H01L 51/00* (2006.01)
*H01L 51/50* (2006.01)
*C09K 11/06* (2006.01)

(52) U.S. Cl.
CPC .......... *H01L 51/0035* (2013.01); *C09K 11/06* (2013.01); *H01L 51/0097* (2013.01);
(Continued)

(58) Field of Classification Search
CPC ............. H01L 51/0035; H01L 51/5056; H01L 51/5072
See application file for complete search history.

(56) References Cited

U.S. PATENT DOCUMENTS

2012/0017995 A1    1/2012 Pschirer et al.
2012/0181530 A1*   7/2012 Funyuu .................. C08G 61/12
                                                   257/40

(Continued)

FOREIGN PATENT DOCUMENTS

CN    1947274 A    4/2007
EP    1394617 A2   3/2004

(Continued)

OTHER PUBLICATIONS

Chauhan et al., "N-Aryl 2,7-Linked Carbazole Polymers and Copolymers with Fluorine Protecting Groups: A New Class of Blue Emitting Polymers for LED Applications," Mol. Cryst. Liq. Cryst., vol. 497, pp. 129 (2005) (Year: 2005).*

(Continued)

*Primary Examiner* — Stephen M Bradley
(74) *Attorney, Agent, or Firm* — Fitch, Even, Tabin & Flannery, LLP

(57) ABSTRACT

One embodiment relates to an organic electronic material containing a charge transport polymer or oligomer, wherein the charge transport polymer or oligomer has a structural (Continued)

unit containing an aromatic amine structure substituted with a fluorine atom.

25 Claims, 8 Drawing Sheets

(52) U.S. Cl.
CPC .......... *H01L 51/50* (2013.01); *H01L 51/5056* (2013.01); *C09K 2211/1007* (2013.01); *C09K 2211/1029* (2013.01); *C09K 2211/185* (2013.01)

(56) References Cited

U.S. PATENT DOCUMENTS

| | | | | |
|---|---|---|---|---|
| 2012/0199820 | A1* | 8/2012 | Ito | C07C 211/54 257/40 |
| 2012/0206336 | A1 | 8/2012 | Bruder | |
| 2012/0313086 | A1 | 12/2012 | Sadamitsu | |
| 2013/0037753 | A1* | 2/2013 | Ishitsuka | H01B 1/122 252/500 |
| 2013/0270545 | A1* | 10/2013 | Tanaka | B82Y 10/00 257/40 |
| 2014/0114040 | A1 | 4/2014 | Brown et al. | |
| 2014/0332791 | A1* | 11/2014 | Funyuu | H01L 51/506 257/40 |
| 2014/0374720 | A1* | 12/2014 | Kato | C07D 471/14 257/40 |
| 2018/0066000 | A1 | 3/2018 | Stoessel | |

FOREIGN PATENT DOCUMENTS

| | | |
|---|---|---|
| EP | 2299509 A1 | 3/2011 |
| JP | 2000-036390 A | 2/2000 |
| JP | 2003-213002 A | 7/2003 |
| JP | 2005-075948 A | 3/2005 |
| JP | 2009-043896 A | 2/2009 |
| JP | 2010-174051 A | 8/2010 |
| JP | 2010-199249 A | 9/2010 |
| JP | 2010-225950 A | 10/2010 |
| JP | 2011-082052 A | 4/2011 |
| JP | 2013-124271 A | 6/2013 |
| JP | 2013-155294 A | 8/2013 |
| JP | 2013-209300 A | 10/2013 |
| JP | 2014-519537 A | 8/2014 |
| JP | 2014-169418 A | 9/2014 |
| TW | 201125888 A | 8/2011 |
| WO | 2012/033073 A1 | 3/2012 |
| WO | 2011/040531 A1 | 2/2013 |
| WO | 2013/096921 A1 | 6/2013 |
| WO | 2016/180511 A1 | 11/2016 |

OTHER PUBLICATIONS

Endo, A., Ogasawara, M., Takahashi, A., Yokoyama, D., Kato, Y. and Adachi, C. (2009), Thermally Activated Delayed Fluorescence from Sn4+-Porphyrin Complexes and Their Application to Organic Light Emitting Diodes—A Novel Mechanism for Electroluminescence. Adv. Mater., 21: 4802-4806. doi:10.1002/adma.200900983.

Endo, A., Sato, K., Yoshimura, K., Kai, T., Kawada, A., et al. (2011) Efficient up-conversion of triplet excitons into a singlet state and its application for organic light emitting diodes. Appl. Phys. Lett. 98, 083302 ; doi: 10.1063/1.3558906.

Nakagawa, T., Ku, S., Wong, K., Adachi, C. Electroluminescence based on thermally activated delayed fluorescence generated by a spirobifluorene donor—acceptor structure. Chem. Commun., 2012,48, 9580-9582.

Lee, S., Yasuda, T., Nomura, H., and Adachi, C. High-efficiency organic light-emitting diodes utilizing thermally activated delayed fluorescence from triazine-based donor—acceptor hybrid molecules Appl. Phys. Lett. 101, 093306 (2012); doi: 10.1063/1.4749285.

Zhang, Q., Li, J., Shizu, K,. Huang, S., Hirata, S., Miyazaki, H., and Adachi, C. Design of Efficient Thermally Activated Delayed Fluorescence Materials for Pure Blue Organic Light Emitting Diodes. J. Am. Chem. Soc., 134, 14706 (2012).

Tanaka, H., Shizu, K., Miyazakiab, H., and Adachi, C. Efficient green thermally activated delayed fluorescence (TADF) from a phenoxazine—triphenyltriazine (PXZ-TRZ) derivative. Chem. Comm., 48, 11392 (2012).

Uoyama, H., Goushi, K., Shizu, K., Nomura, H., and Adachi, C. Highly efficient organic light-emitting diodes from delayed fluorescence. Nature, 492, 234 (2012).

Li, J., Nakagawa, T., MacDonald, J., Zhang, Q., Nomura, H., Miyazaki, H., and Adachi, C. Highly Efficient Organic Light-Emitting Diode Based on a Hidden Thermally Activated Delayed Fluorescence Channel in a Heptazine Derivative. Adv. Mater., 25, 3319 (2013).

Ishimatsu, R., Matsunami, S., Shizu, K., Adachi, C., Nakano, K., and Imato, T. Solvent Effect on Thermally Activated Delayed Fluorescence by 1,2,3,5-Tetrakis(carbazol-9-yl)-4,6-dicyanobenzene J. Phys. Chem. A, 117, 5607 (2013).

Serevicius, T., Nakagawa, T., Kuo, M., Cheng, S., Wong, K, Chang, C., Kwong, R. C., Xiae, S., and Adachi, C. Enhanced electroluminescence based on thermally activated delayed fluorescence from a carbazole-triazine derivative. Phys. Chem. Chem. Phys., 15, 15850 (2013).

Nasu, K, Nakagawa, T., Nomura, H., Lin, C., Cheng, C., Tseng, M., Yasudaad, T., and Adachi, C. A highly luminescent spiro-anthracenone-based organic light-emitting diode exhibiting thermally activated delayed fluorescence Chem. Comm., 49, 10385 (2013).

Li, B., Nomura, H., Miyazaki, H., Zhang, Q., Yoshida, K., Suzuma, Y., Orita, A., Otera, J., Adachi, C. Dicarbazolyldicyanobenzenes as Thermally Activated Delayed Fluorescence Emitters: Effect of Substitution Position on Photoluminescent and Electroluminescent Properties. Chem. Lett., 43, 319 (2014).

Aleksandrova, E. L. et al. "Spectroscopic study of Polyphenylquinolines—Materials with Efficient Intramolecular Charge Transfer", pp. 737-750, May 23, 2013, XP 35327736A I, Optics and Spectroscopy, vol. 114, No. 5 (cited in a Search report in counterpart EP Application No. 17736020.3 dated Jun. 27, 2019).

* cited by examiner (a) HOMO level (b) Energy gap between $S_0$ level and $S_1$ level (c) Energy gap between $S_0$ level and $T_1$ level (a) HOMO level (b) Energy gap between $S_0$ level and $S_1$ level (c) Energy gap between $S_0$ level and $T_1$ level (a) HOMO level (b) Energy gap between $S_0$ level and $S_1$ level (c) Energy gap between $S_0$ level and $T_1$ level

ORGANIC ELECTRONIC MATERIAL INCLUDING CHARGE TRANSPORT POLYMER OR OLIGOMER HAVING STRUCTURAL UNIT CONTAINING AROMATIC AMINE STRUCTURE SUBSTITUTED WITH FLUORINE ATOM, ORGANIC ELECTRONIC ELEMENT, AND ORGANIC ELECTROLUMINESCENT ELEMENT

CROSS-REFERENCE TO RELATED APPLICATIONS

This application is a U.S. national phase application filed under 35 U.S.C. § 371 of International Application No. PCT/JP2017/000265, filed Jan. 6, 2017, designating the United States, which claims priority from Japanese Patent Application No. 2016-002748 filed Jan. 8, 2016, which are hereby incorporated herein by reference in their entirety.

TECHNICAL FIELD

The present disclosure relates to an organic electronic material, an ink composition, an organic layer, an organic electronic element, an organic electroluminescent element (organic EL element), a display element, an illumination device and a display device, and also relates to methods for producing an organic layer, an organic electronic element and an organic EL element.

BACKGROUND ART

Organic electronic elements are elements which use an organic substance to perform an electrical operation. It is anticipated that organic electronic elements will be capable of providing advantages such as lower energy consumption, lower prices and greater flexibility, and they are therefore attracting considerable attention as a potential alternative technology to conventional inorganic semiconductors containing mainly silicon.

Among organic electronic elements, organic EL elements are attracting attention for potential use in large-surface area solid state lighting applications to replace incandescent lamps or gas-filled lamps. Further, organic EL elements are also attracting attention as the leading self-luminous display for replacing liquid crystal displays (LCD) in the field of flat panel displays (FPD), and commercial products are becoming increasingly available.

In recent years, as the size of organic EL elements has continued to increase, in order to enable formation of the elements with greater efficiency, methods of forming organic layers by using a wet process such as a spin coating method or inkjet method to apply an ink composition containing a charge transport polymer are being trialed (for example, see Patent Literature 1).

CITATION LIST

Patent Literature

PLT 1: WO 2011/040531

SUMMARY OF INVENTION

Technical Problem

An organic EL element produced using a charge transport polymer has the advantages of facilitating cost reductions and increases in the element surface area. However, further improvements in the characteristics of organic EL elements would be desirable. This also applies to other organic electronic elements such as organic photoelectric conversion elements and organic transistors.

Accordingly, the present disclosure provides an organic electronic material, an ink composition and an organic layer that are suited to improvements in the characteristics of organic electronic elements. Further, this disclosure also provides an organic electronic element, an organic EL element, a display element, an illumination device and a display device that have excellent element characteristics. Moreover, this disclosure also provides methods for efficiently producing the aforementioned organic layer, organic electronic element and organic EL element.

Solution to Problem

The present invention includes various embodiments. Examples of the embodiments are described below. However, the present invention is not limited to the following embodiments.

One embodiment relates to an organic electronic material containing a charge transport polymer or oligomer, wherein the charge transport polymer or oligomer has a structural unit containing an aromatic amine structure substituted with a fluorine atom.

Another embodiment relates to an ink composition containing the above organic electronic material and a solvent.

Another embodiment relates to an organic layer containing the above organic electronic material.

Another embodiment relates to an organic electronic element having at least one of the above organic layer.

Another embodiment relates to an organic electroluminescent element having at least one of the above organic layer.

Another embodiment relates to a display element or an illumination device containing the above organic electroluminescent element, or to a display device containing the above illumination device and a liquid crystal element as a display unit.

Another embodiment relates to a method for producing an organic layer that includes a step of applying the above ink composition, a method for producing an organic electronic element that includes a step of applying the above ink composition, or a method for producing an organic electroluminescent element that includes a step of applying the above ink composition.

The disclosure of the present application is related to the subject matter disclosed in prior Japanese Application 2016-002748 filed on Jan. 8, 2016, the entire contents of which are incorporated by reference herein.

Advantageous Effects of Invention

The present disclosure is able to provide an organic electronic material, an ink composition and an organic layer that are suited to improvements in the characteristics of organic electronic elements. Further, this disclosure is also able to provide an organic electronic element, an organic EL element, a display element, an illumination device and a display device that have excellent element characteristics. Moreover, this disclosure is also able to provide methods for efficiently producing the aforementioned organic layer, organic electronic element and organic EL element.

DESCRIPTION OF EMBODIMENTS

Figure 1:
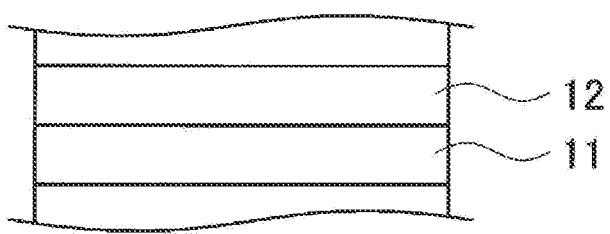
FIG. 1 is a schematic cross-sectional view illustrating one example of a structure contained in an organic EL element of one embodiment.

Embodiments of the present invention are described below. However, the present invention is not limited to the following embodiments.

<Organic Electronic Material>

According to one embodiment, an organic electronic material contains at least a charge transport polymer or oligomer having a structural unit containing an aromatic amine structure substituted with a fluorine atom (hereafter this charge transport polymer or oligomer is also referred to as the "charge transport polymer I"). The organic electronic material may contain only one type of the charge transport polymer I, or may contain two or more types.

Generally, a charge transport polymer used in an organic electronic material contains repeating carbon-carbon single bonds (C—C) and carbon-carbon double bonds (C=C) within the molecule, and has a well-developed conjugated system. Accordingly, the energy gap between the HOMO (highest occupied molecular orbital) and the LUMO (lowest unoccupied molecular orbital) tends to be small (namely, the energy gap between the $S_0$ level (singlet ground state) and the $S_1$ level (excited singlet state) tends to be small), and the energy gap between the $S_0$ level (singlet ground state) and the $T_1$ level (excited triplet state) also tends to be small (hereafter, the "energy gap between the $S_0$ level and the $S_1$ level" is also referred to as the "$S_1$ energy", and the "energy gap between the $S_0$ level and the $T_1$ level" is also referred to as the "$T_1$ energy"). A conjugated system is a required structure in order for the polymer to exhibit conductivity, but on the other hand, the charge transport polymer may require suitable energy levels for HOMO and LUMO and the like and suitable energy gaps depending on the intended application.

For example, from the viewpoint of enabling easier injection of holes into the light-emitting layer and from the viewpoint of suppressing intermolecular interactions with the material of the light-emitting layer, it is sometimes desirable that the charge transport polymer used as the material for the hole transport layer of an organic EL element has a deep HOMO level. Further, from the viewpoints of suppressing energy transfer of excitons produced in the light-emitting layer, and enabling light emission to be performed efficiently, it is sometimes desirable that the charge transport polymer has a large HOMO-LUMO energy gap ($S_1$ energy) and/or a large $T_1$ energy. The demands for characteristics including a deep HOMO level and a large HOMO-LUMO energy gap ($S_1$ energy) and/or a large $T_1$ energy increase particularly when the emission wavelength from the light-emitting layer shortens. However, designing a charge transport polymer having the desired energy levels and energy gaps is not an easy task.

As a result of intensive investigation, the inventors of the present invention discovered that by introducing a structural unit containing an aromatic amine structure substituted with a fluorine atom into the charge transport polymer, a deep HOMO level could be obtained, and the HOMO-LUMO energy gap ($S_1$ energy) could be adjusted significantly. By introducing a structural unit containing an aromatic amine structure substituted with a fluorine atom, a charge transport polymer having suitable energy levels and energy gaps could be provided.

By using a charge transport polymer having suitable energy levels and energy gaps, the compatibility between organic layers is favorable, and the characteristics of organic electronic elements can be improved. For example, an improvement in the light emission efficiency, an improvement in the lifespan characteristics or a reduction in the drive voltage of an organic EL element, or an improvement in the conversion efficiency of an organic photoelectric conversion element can be expected.

[Charge Transport Polymer I]

The charge transport polymer I contains at least a structural unit containing an aromatic amine structure substituted with a fluorine atom (hereafter, the "structural unit containing an aromatic amine structure substituted with a fluorine atom" is sometimes referred to as the "structural unit AA"). The charge transport polymer I has the ability to transport charge, and preferably has the ability to transport positive holes. It is thought that by including the structural unit AA, the HOMO level can be deepened without greatly altering the $S_1$ level, and preferably without greatly altering the $S_1$ level or the $T_1$ level. The charge transport polymer I may contain one type of the structural unit AA, or may contain two or more types. Further, the charge transport polymer I may be a linear polymer or a branched polymer. From the viewpoints of facilitating more precise control of the molecular weight and the physical properties of the ink composition, a linear polymer is preferred, but from the viewpoint of making it easier to increase the molecular weight, a branched polymer is preferred. A branched polymer is also preferred from the viewpoint of enhancing the durability of the organic electronic element.

A linear charge transport polymer I has no branch points on the polymer chain, and has two terminals. The linear charge transport polymer I contains a divalent structural units that forms the polymer chain, and a monovalent structural unit that forms the terminals. A branched charge transport polymer I has one or more branch points on the polymer chain, and has three or more terminals. The branched charge transport polymer I contains one a trivalent structural unit that forms the branch points, and a monovalent structural unit that forms the terminals, and may also contain a divalent structural units. The branched charge transport polymer I has a main chain and one or more branch chains (side chains), and each side chain contains either one, or two or more, structural units.

(Structural Unit AA)

The structural unit AA contains an aromatic amine structure substituted with a fluorine atom (hereafter, the "aromatic amine structure substituted with a fluorine atom" is sometimes referred to as the "aromatic amine structure AA"). The aromatic amine has a nitrogen atom and an aromatic hydrocarbon group that is bonded to the nitrogen atom. Here, examples of the "aromatic hydrocarbon"

include monocyclic aromatic hydrocarbons and condensed polycyclic aromatic hydrocarbons. Examples of the condensed polycyclic aromatic hydrocarbons include condensed ring structures containing 2 to 10 benzene rings, and the number of benzene rings is preferably from 2 to 5, and more preferably 2 or 3.

Specific examples of the aromatic hydrocarbon include benzene (1), naphthalene (2), fluorene (2), anthracene (3), tetracene (4), pentacene (5), phenanthrene (3), chrysene (4), triphenylene (4), tetraphene (4), pyrene (4), picene (5), pentaphene (5), perylene (5), pentahelicene (5), hexahelicene (6), heptahelicene (7), coronene (7), fluoranthene (3), acephenanthrylene (3), aceanthrene (3), aceanthrylene (3), pleiadene (4), tetraphenylene (4), cholanthrene (4), dibenzanthracene (5), benzopyrene (5), rubicene (5), hexaphene (6), hexacene (6), trinaphthylene (7), heptaphane (7), heptacene (7), pyranthrene (8) and ovalene (8). The numbers in parentheses indicates the numbers of benzene rings contained in the aromatic hydrocarbons.

From the viewpoint of improving the characteristics of the organic electronic element, the aromatic hydrocarbon is preferably benzene, naphthalene, fluorene, anthracene or phenanthrene, is more preferably benzene or naphthalene, and is even more preferably benzene.

The number of aromatic hydrocarbon groups contained in the aromatic amine structure AA is from 1 to 3. From the viewpoint of obtaining superior charge transport properties, this number is preferably 2 or 3, and more preferably 3. Excluding substituents, the aromatic hydrocarbon groups contained in the aromatic amine structure AA may be the same or different. Preferred examples of the aromatic amine structure AA include diarylamine structures and triarylamine structures. Triarylamine structures are particularly preferred. The term "aryl" means an atom grouping obtained by removing one hydrogen atom from an aforementioned aromatic hydrocarbon.

The aromatic amine structure AA has at least one aromatic hydrocarbon group substituted with a fluorine atom. The number of fluorine atoms contained in a single aromatic hydrocarbon group may be zero, or 1 or more. The upper limit for the number of fluorine atoms contained within a single aromatic hydrocarbon group can be determined with due consideration of the structure of the aromatic hydrocarbon group, and for example is not more than 5 when the aromatic hydrocarbon group is a phenyl group, or not more than 7 in the case of a naphthalene group. There are no particular limitations on the substitution position of the fluorine atom(s). In those cases where the aromatic hydrocarbon group is substituted with one or two fluorine atoms at the ortho position(s) relative to the bonding site of the aromatic hydrocarbon group to another structure, the lowering effect on the HOMO level, or the increase effect on the $S_1$ energy and/or $T_1$ energy tends to be more readily obtained. Examples of preferred forms of the other structure include aromatic hydrocarbon structures and aromatic heterocyclic structures, and aromatic hydrocarbon structures are more preferred, with a benzene structure being particularly desirable. Aromatic hydrocarbon structures and aromatic heterocyclic structures may also be incorporated in other structural units that are bonded to the structural unit AA.

The number of fluorine atoms contained in the aromatic amine structure AA is at least one. Further, from the viewpoint of improving the characteristics of the organic electronic element, the upper limit for the number of fluorine atoms is preferably not more than 8, more preferably not more than 6, even more preferably not more than 4, and particularly preferably 3 or fewer.

In one embodiment, considering the effect of substituent groups, the aromatic amine structure AA may have no substituents other than the fluorine atom(s). Further, in another embodiment, from the viewpoint of imparting a desired function to the charge transport polymer I, the aromatic amine structure AA may have a substituent other than a fluorine atom. Examples of the "substituent other than a fluorine atom" include —$R^1$, —$OR^2$, —$SR^3$, —$OCOR^4$, —$COOR^5$, —$SiR^6R^7R^8$, —CN, —$NO_2$, -Cl, —Br, and groups containing a polymerizable functional group described below. Each of $R^1$ to $R^8$ independently represents a hydrogen atom, a linear, cyclic or branched alkyl group (preferably of 1 to 22 carbon atoms), an aryl group (preferably of 6 to 30 carbon atoms), or a heteroaryl group (preferably of 2 to 30 carbon atoms). However, a hydrogen atom is excluded from the possible examples for —$R^1$. The alkyl group may be further substituted with an aryl group (preferably of 6 to 30 carbon atoms) or a heteroaryl group (preferably of 2 to 30 carbon atoms), and the aryl group or heteroaryl group may be further substituted with a linear, cyclic or branched alkyl group (preferably of 1 to 22 carbon atoms). The alkyl group may be substituted with a halogen atom (for example, —$CF_3$). Further, considering the effect of the aromatic amine structure AA, electron-withdrawing groups may be excluded from the "substituent other than a fluorine atom". For example, the "substituent other than a fluorine atom" may include an electron-donating group. An electron-withdrawing group is a group which tends to draw electrons from the bonded atom side more strongly than a hydrogen atom, and specific examples include —$CF_3$, —CN and —$NO_2$. An electron-donating group is a group which tends to donate electrons to the bonded atom side more readily than a hydrogen atom, and specific examples include alkyl groups and aryl groups. In a preferred embodiment, the "substituent other than a fluorine atom" contains —$R^1$.

Examples of the alkyl group include a methyl group, ethyl group, n-propyl group, n-butyl group, n-pentyl group, n-hexyl group, n-heptyl group, n-octyl group, n-nonyl group, n-decyl group, n-undecyl group, n-dodecyl group, isopropyl group, isobutyl group, sec-butyl group, tert-butyl group, 2-ethylhexyl group, 3,7-dimethyloctyl group, cyclohexyl group, cycloheptyl group and cyclooctyl group. References to alkyl groups in the following description have the same meaning.

The aryl group is an atom grouping in which one hydrogen atom has been removed from an aromatic hydrocarbon. A heteroaryl group is an atom grouping in which one hydrogen atom has been removed from an aromatic heterocycle. Examples of the aromatic hydrocarbon include monocyclic rings, condensed rings, and polycyclic rings in which two or more (but preferably not more than 5, and more preferably 3 or fewer) rings selected from among monocyclic rings and condensed rings are bonded together via single bonds. Examples of the aromatic heterocycles include monocyclic rings, condensed rings, and polycyclic rings in which two or more (but preferably not more than 5, and more preferably 3 or fewer) rings selected from among monocyclic rings and condensed rings are bonded together via single bonds. Specific examples of the aromatic hydrocarbon include benzene, biphenyl, terphenyl, triphenylbenzene, naphthalene, anthracene, tetracene, fluorene and phenanthrene. Examples of the aromatic heterocycle include pyridine, pyrazine, quinoline, isoquinoline, acridine, phenanthroline, furan, pyrrole, thiophene, carbazole, oxazole, oxadiazole, thiadiazole, triazole, benzoxazole, benzoxadiazole, benzothiadiazole, benzotriazole, and benzothiophene. References to aryl groups, heteroaryl groups, aromatic hydrocarbons and aromatic heterocycles in the following description have the same meanings.

For example, in order to impart improved solubility in organic solvents, the aromatic hydrocarbon group in the aromatic amine structure AA may have an alkyl group of 1 to 12 carbon atoms. The number of carbon atoms is preferably from 1 to 10, and more preferably from 1 to 8. There are no particular limitations on the substitution position of the alkyl group, but considering the effects on the element characteristics, a position on the aromatic hydrocarbon group that does not participate in bonding with other structures may be used. The alkyl group is preferably a methyl group, ethyl group, n-propyl group, isopropyl group, isobutyl group, n-butyl group, sec-butyl group, tert-butyl group, n-pentyl group, n-hexyl group, cyclohexyl group, n-heptyl group, n-octyl group, n-decyl group, or 2-ethylhexyl group or the like.

For example, in order to lower the HOMO level or increase the $S_1$ energy and/or $T_1$ energy, the aromatic hydrocarbon group in the aromatic amine structure AA may have an alkyl group of 1 to 6 carbon atoms at the ortho position relative to the bonding site of the aromatic hydrocarbon group to another structure. The number of carbon atoms of the alkyl group is preferably from 1 to 3, and is more preferably 1. The alkyl group is preferably a methyl group, ethyl group, n-propyl group, isopropyl group, isobutyl group, n-butyl group, sec-butyl group, tert-butyl group, n-pentyl group, n-hexyl group, or cyclohexyl group or the like.

The number of "substituents other than a fluorine atom" contained in the aromatic hydrocarbon group may be zero, or one or more. Further, the number of "substituents other than a fluorine atom" contained in the aromatic amine structure AA may be zero, or one or more. From the viewpoint of improving the characteristics of the organic electronic element, the upper limit for the number of "substituents other than a fluorine atom" contained in the aromatic amine structure AA is preferably not more than 8, more preferably not more than 6, even more preferably not more than 4, and particularly preferably 3 or fewer.

The aromatic amine structure AA has one or more bonding sites and is monovalent or higher, with the structure being mutually bonded to another structure at each of these bonding sites. From the viewpoint of improving the characteristics of organic electroluminescent elements and enabling more favorable synthesis of the polymer, the aromatic amine structure AA is preferably hexavalent or lower, more preferably tetravalent or lower, and even more preferably divalent or trivalent.

Examples of the aromatic amine structure AA include the structures shown below. However, the aromatic amine structure AA is not limited to the following structures.

<<Divalent Aromatic Amine Structures AA>>

Examples of divalent aromatic amine structures AA include those shown below.

[Chemical formula 1]

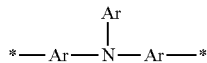

Each Ar independently represents an aromatic hydrocarbon group, and at least one Ar is an aromatic hydrocarbon group substituted with one or more fluorine atoms. Each Ar may be independently substituted with a substituent other than a fluorine atom.

The symbol "*" denotes a bonding site to another structure. This convention is also used in subsequent formulas.

Specific examples include the following structures.

[Chemcial formula 2]

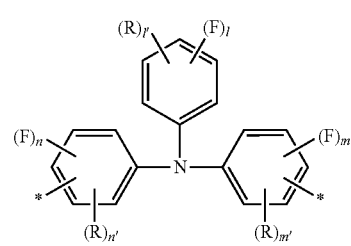

Each R independently represents a substituent other than a fluorine atom, each of l and l' independently represents an integer of 0 to 5, and each of m, m', n and n' independently represents an integer of 0 to 4, provided that l+m+n≥1, l+l'≤5, m+m'≤4, and n+n'≤4.

The subscripts l, l', m, m', n and n' indicate the numbers of F and R. This convention also applies in subsequent formulas.

More specific examples are shown below. In the following examples, * is omitted.

[Chemical formula 3]

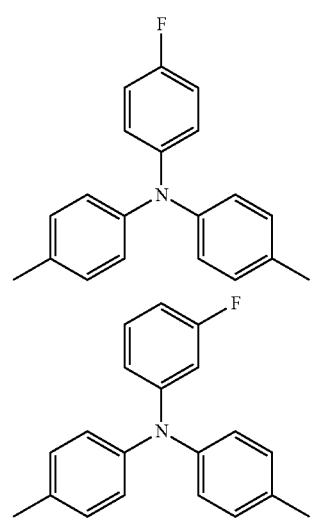

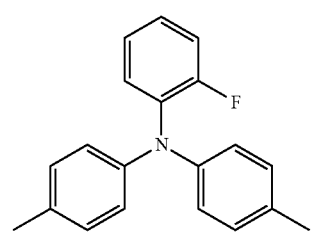

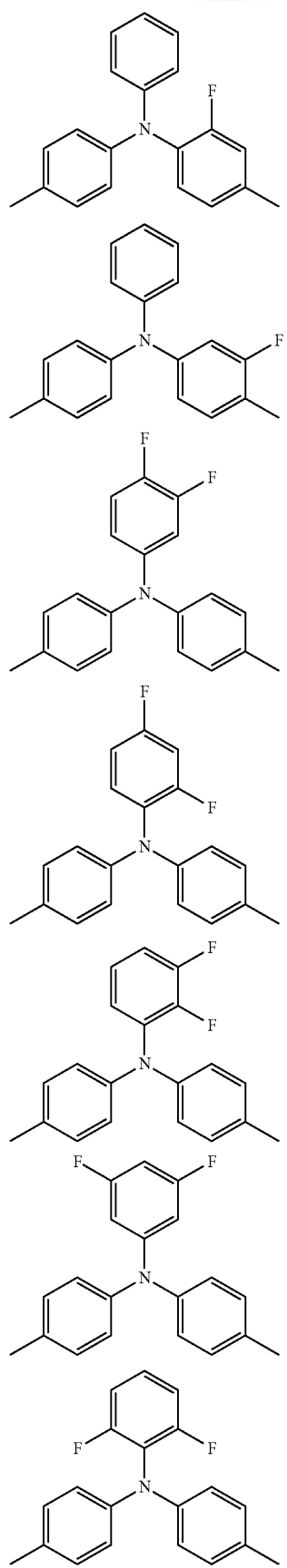
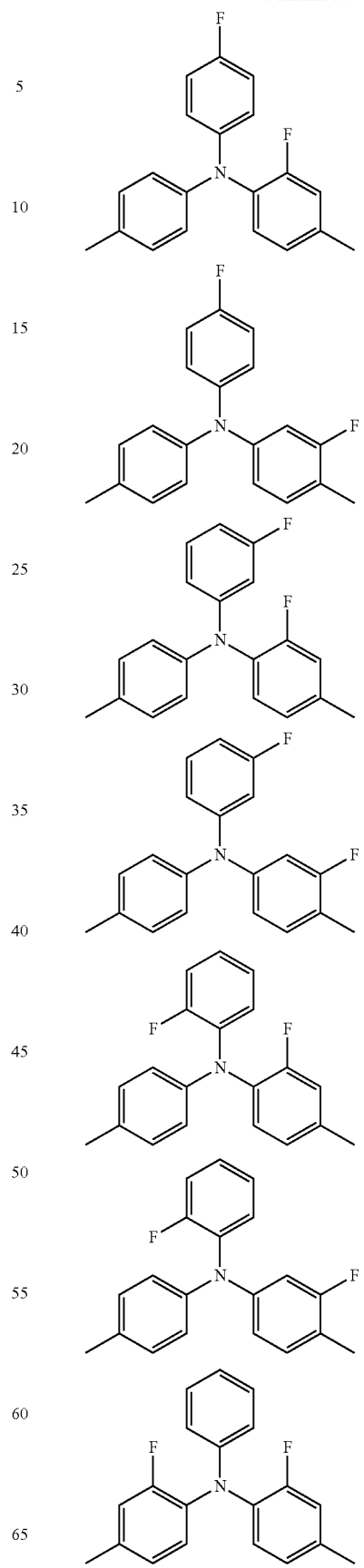

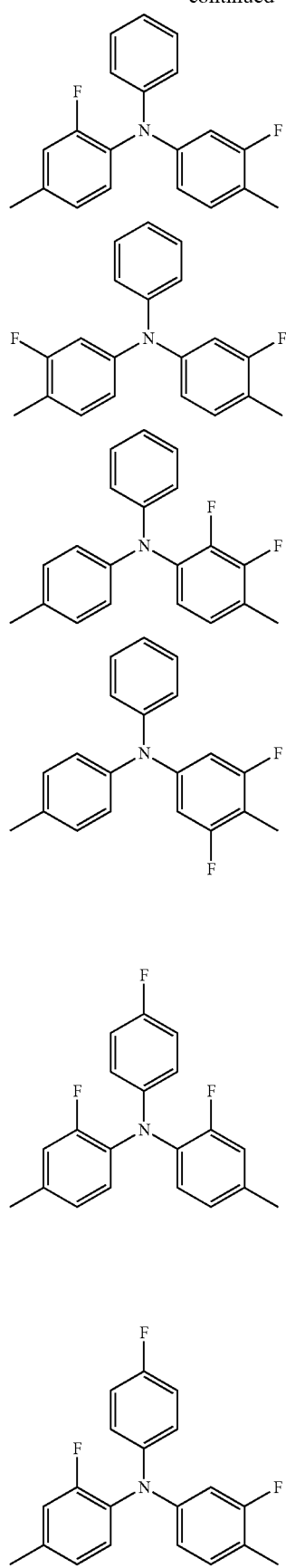
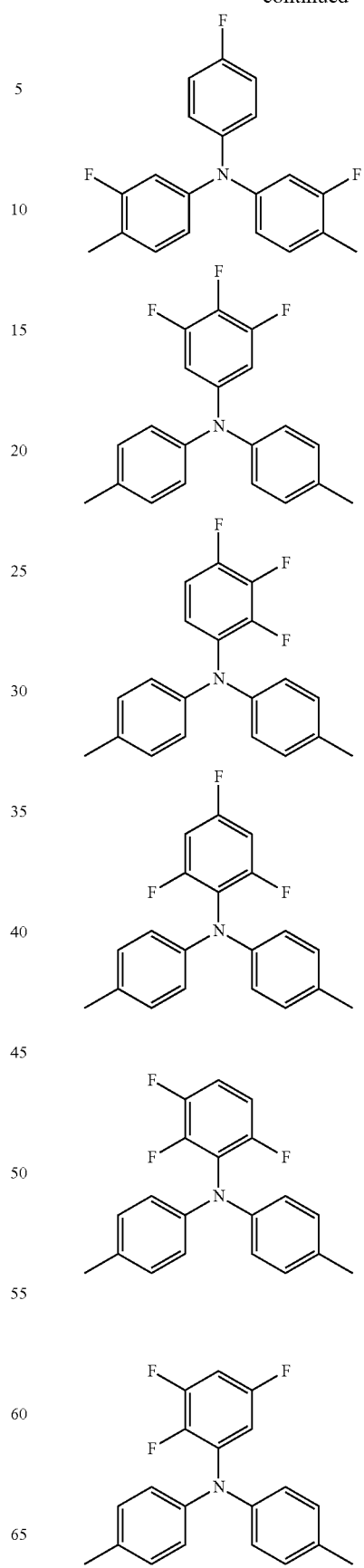

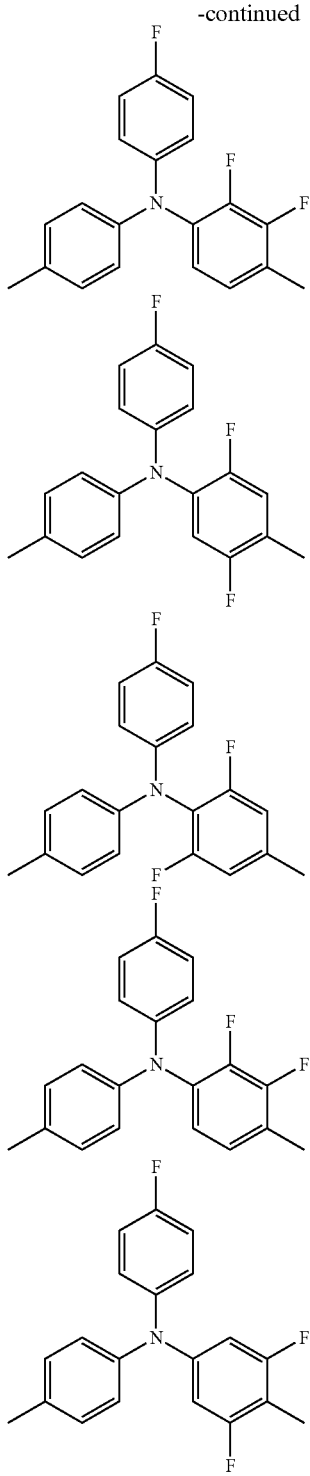

Moreover, structures in which the benzene rings in the above structural formulas are substituted with a substituent other than a fluorine atom are also included within the specific examples of the divalent aromatic amine structures AA. For example, in the above structural formulas, each benzene ring may independently have one or more of the aforementioned R groups.

<<Trivalent Aromatic Amine Structures AA>>

Examples of trivalent aromatic amine structures AA include those shown below.

[Chemical formula 4]

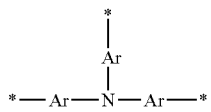

Each Ar independently represents an aromatic hydrocarbon group, and at least one Ar is an aromatic hydrocarbon group substituted with one or more fluorine atoms. Each Ar may be independently substituted with a substituent other than a fluorine atom.

Specific examples include the following structures.

[Chemcial formula 5]

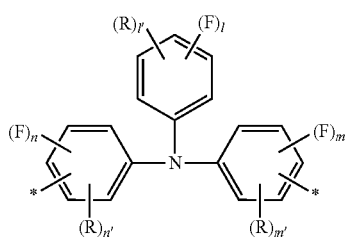

Each R independently represents a substituent other than a fluorine atom, and each of l, l', m, m', n and n' independently represents an integer of 0 to 4, provided that $l+m+n \geq 1$, $l+l' \leq 4$, $m+m' \leq 4$, and $n+n' \leq 4$.

More specific examples are shown below. In the following examples, * is omitted.

[Chemical formula 6]

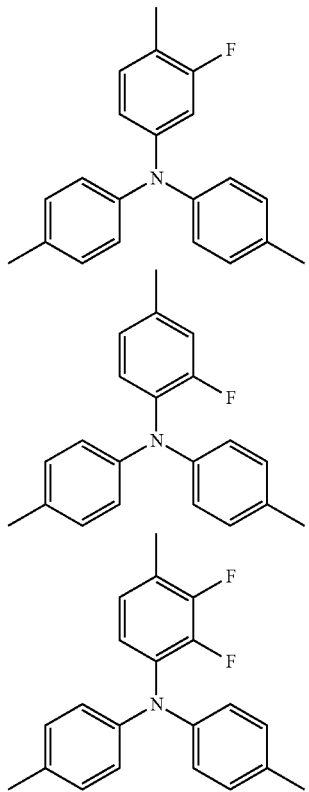

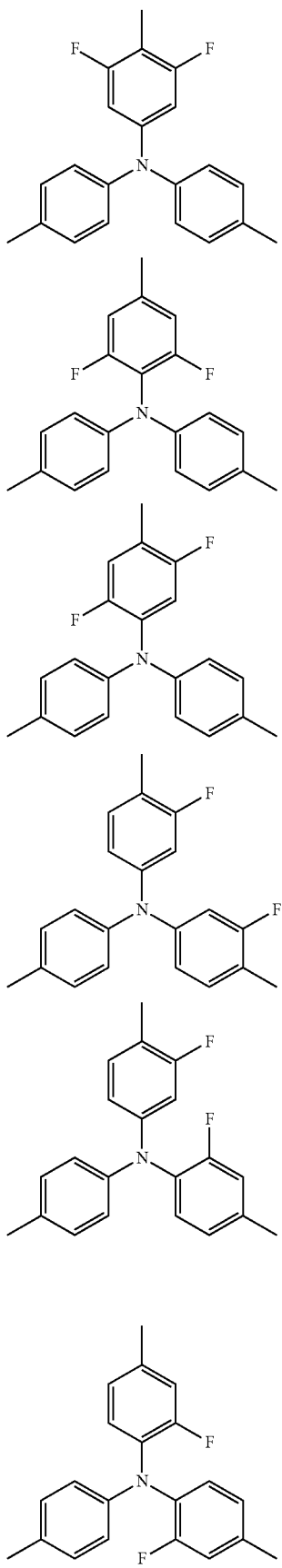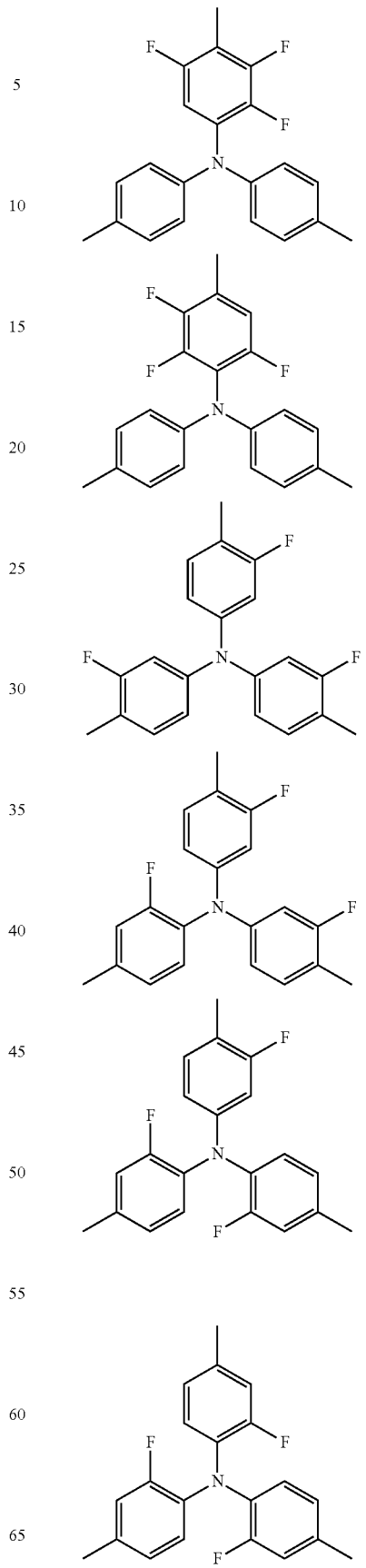

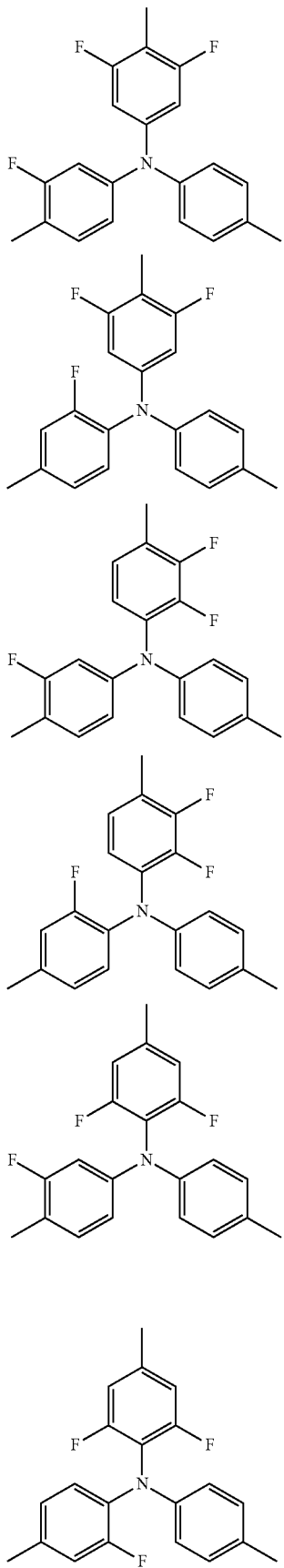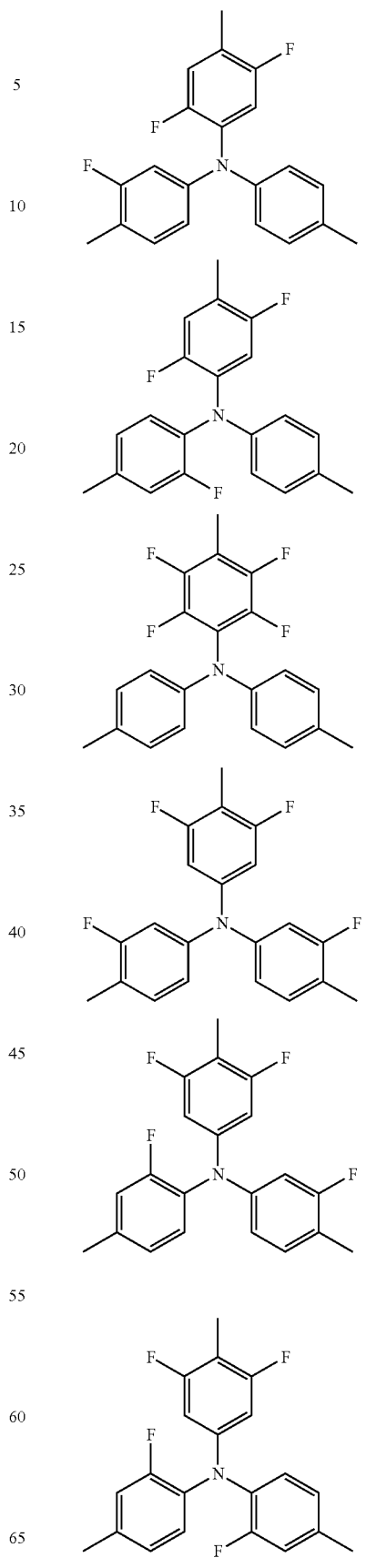

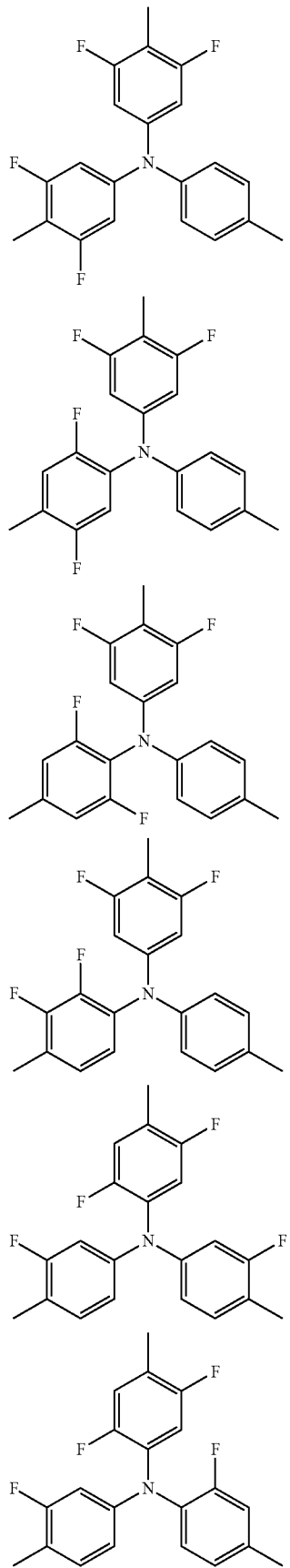
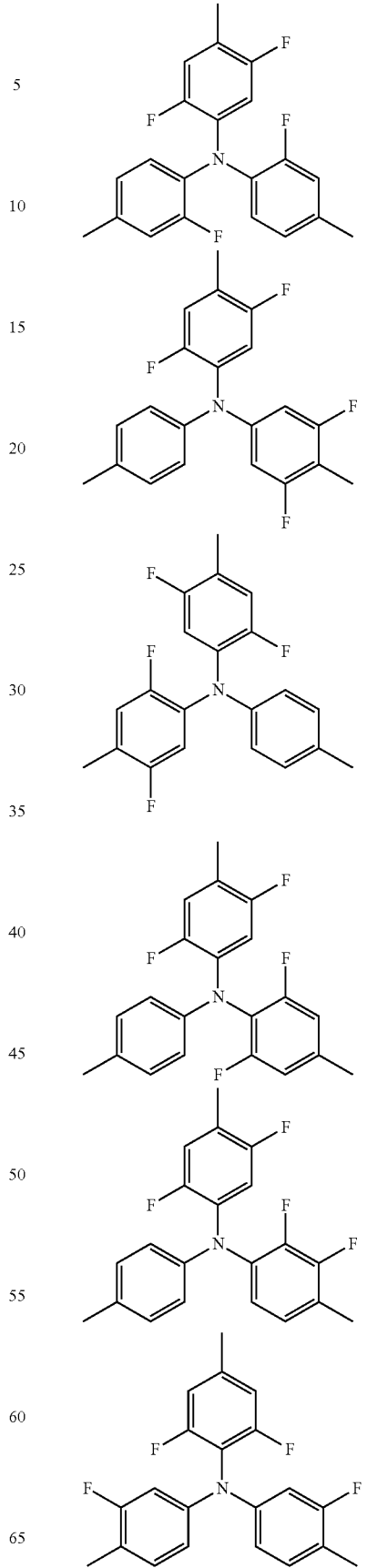
[Chemical formula 7]

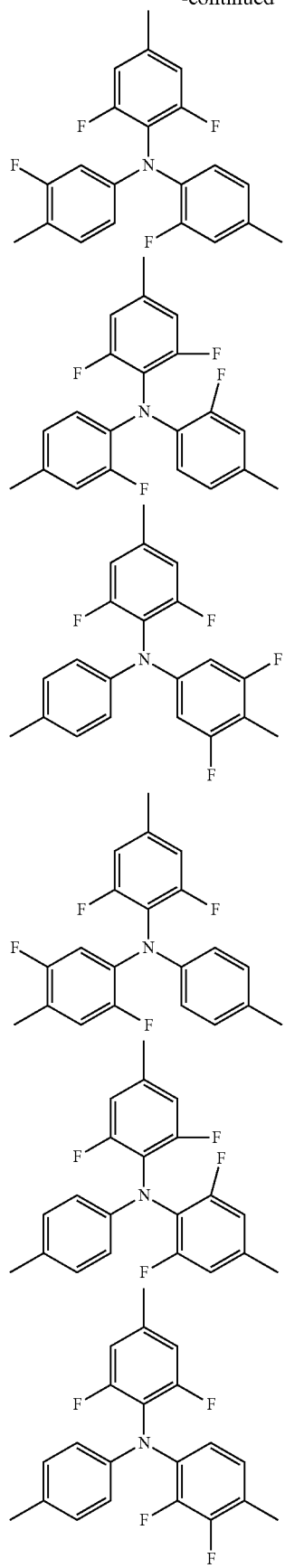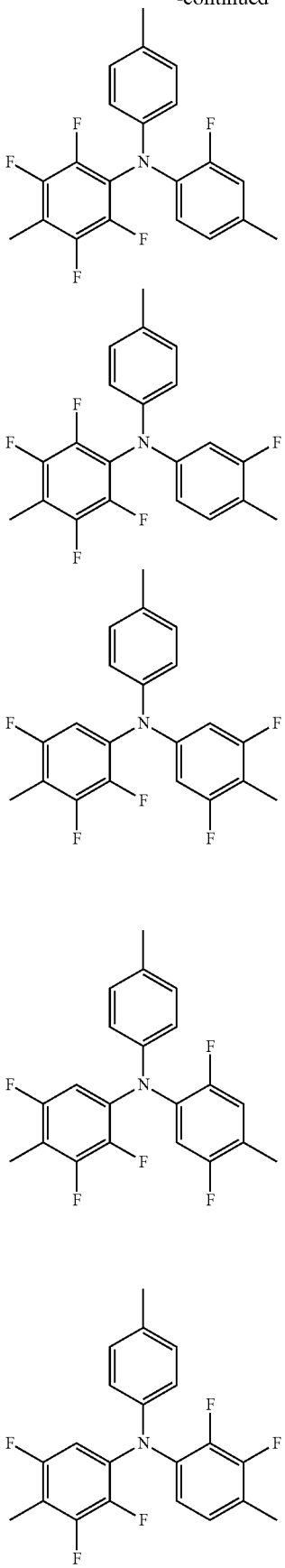

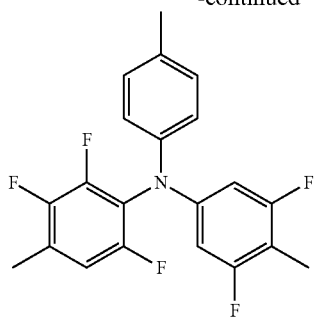
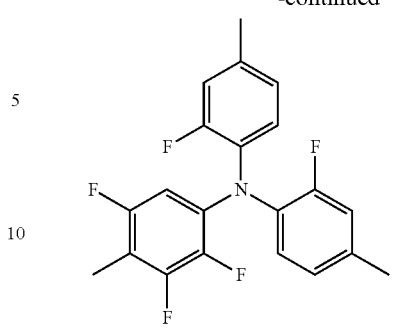
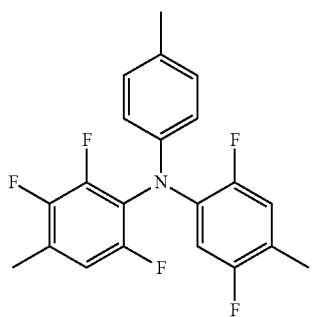
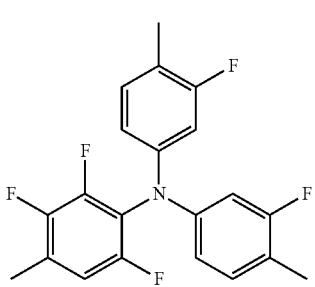
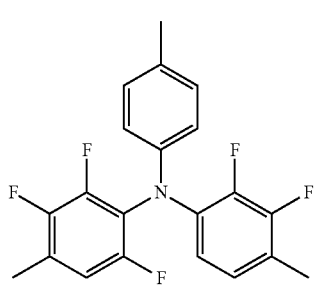
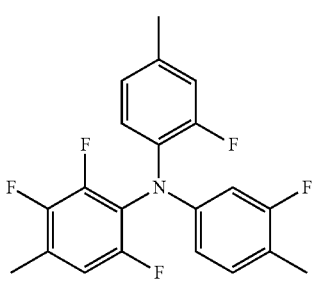
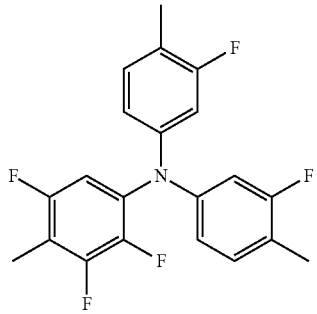
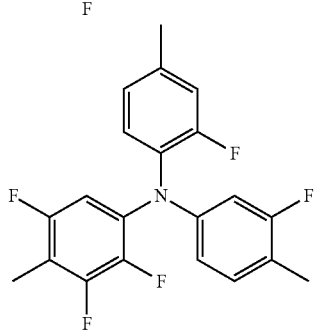
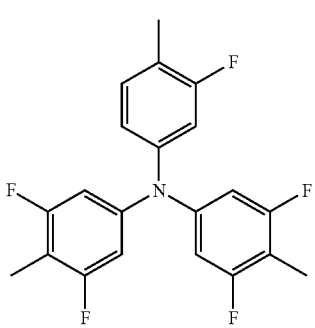

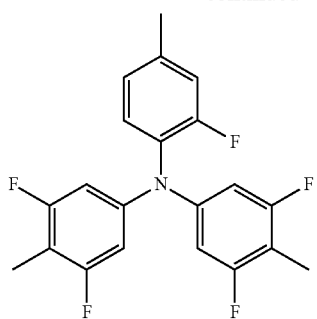
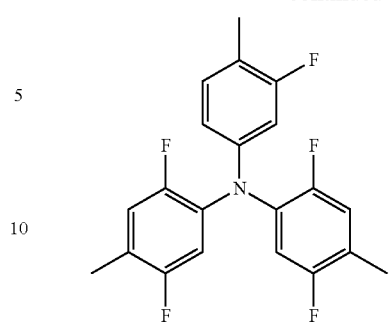
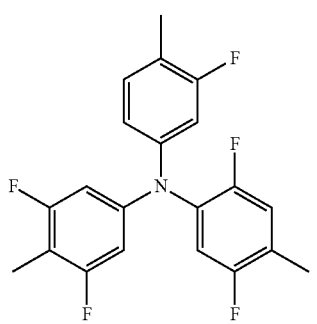
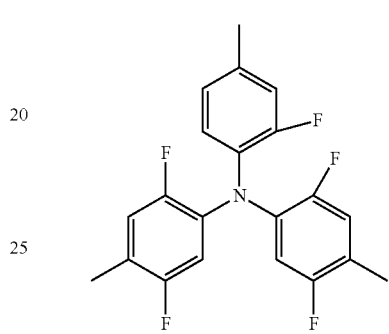
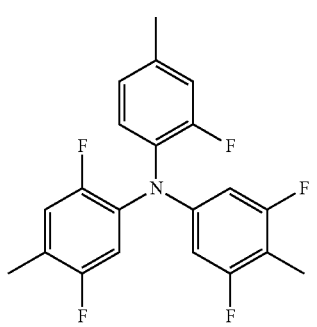
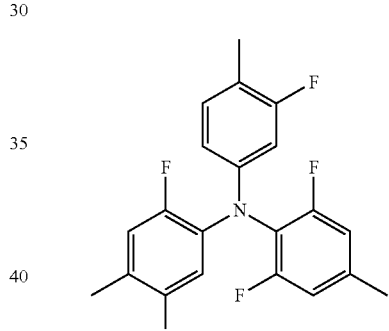
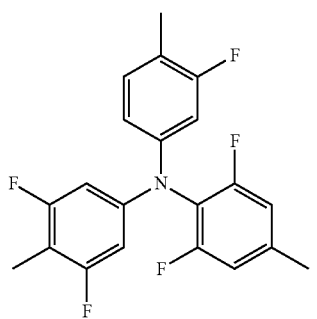
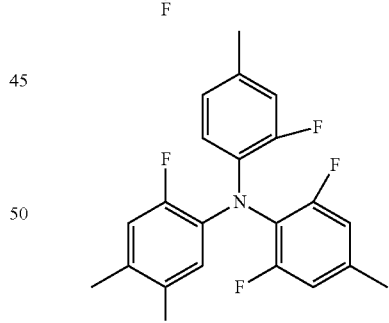
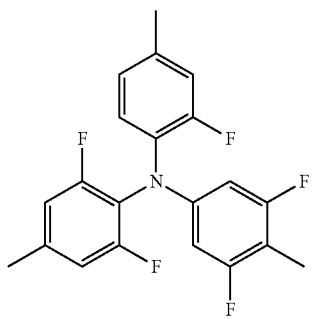
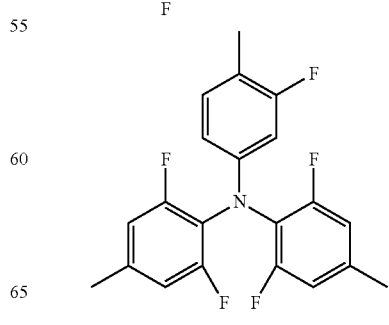

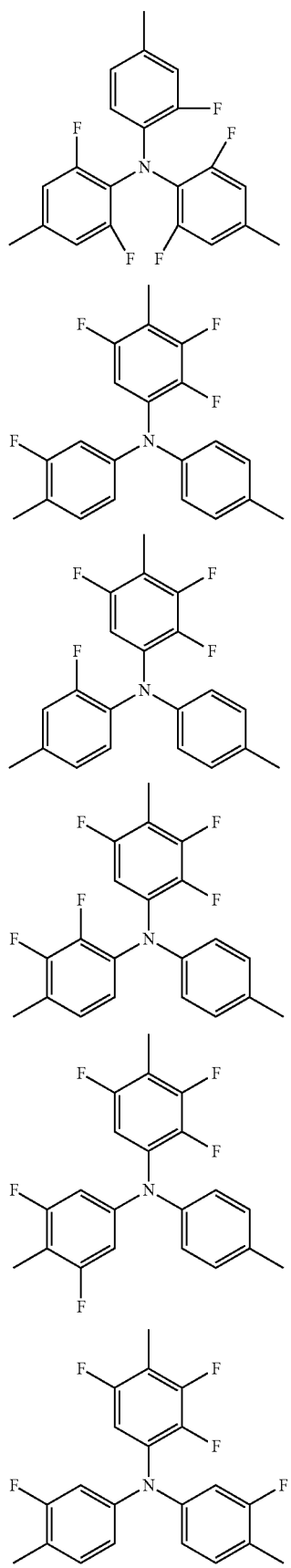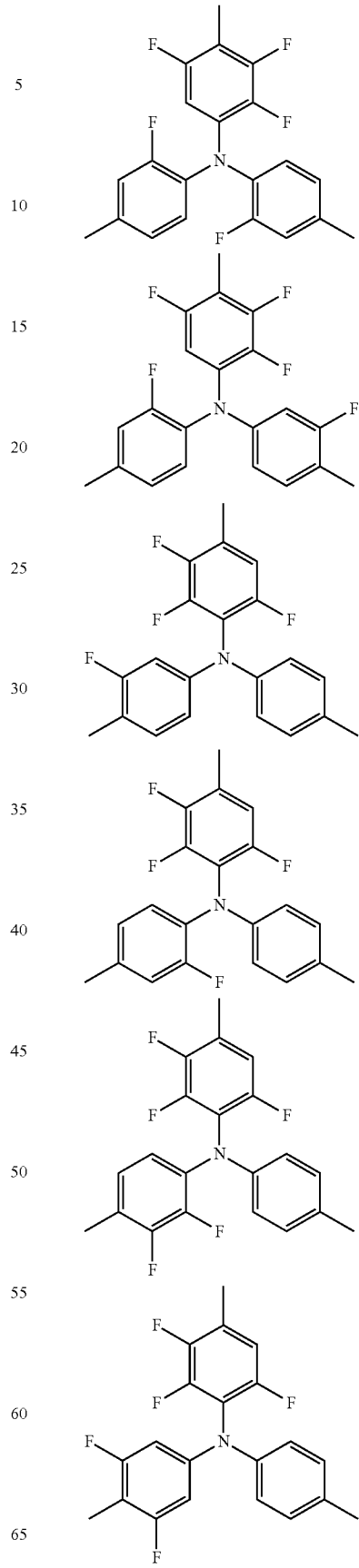

29
-continued
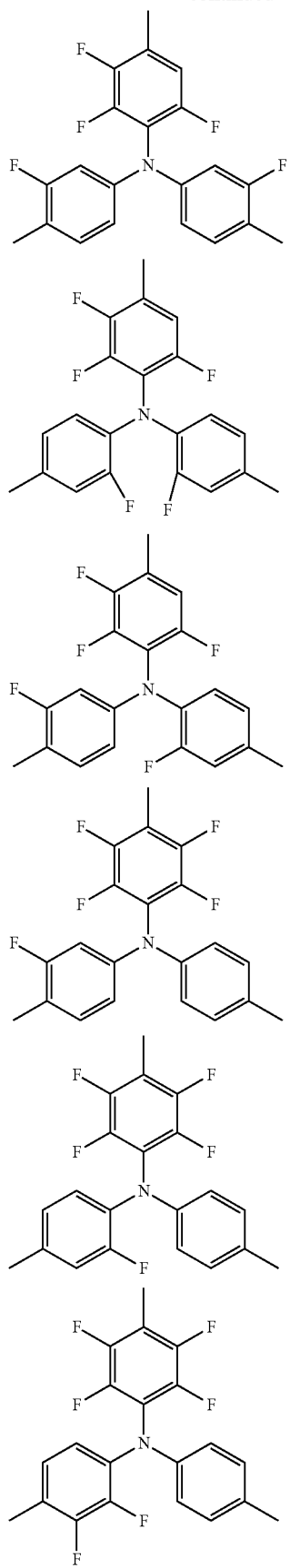
30
-continued
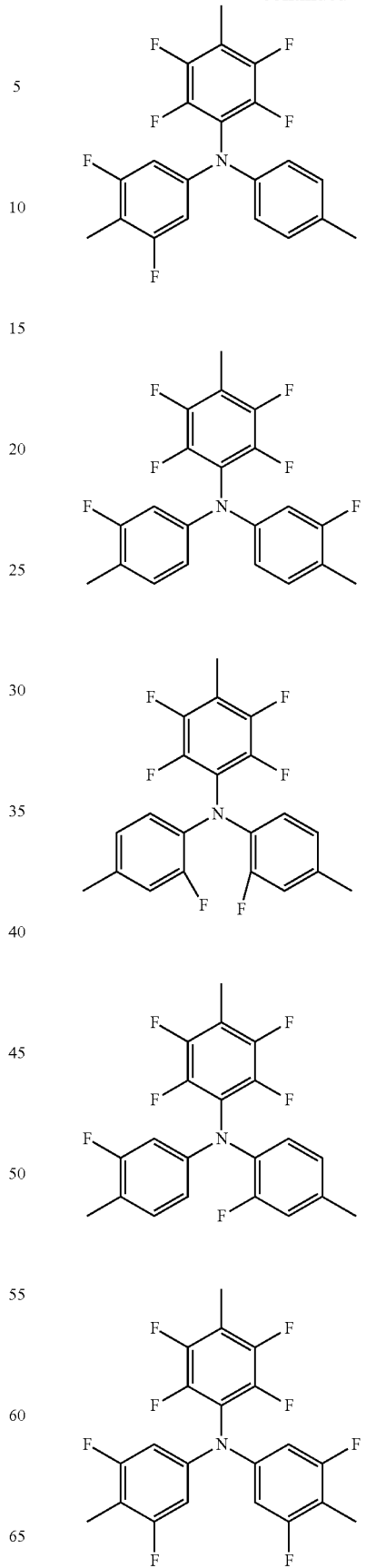

-continued

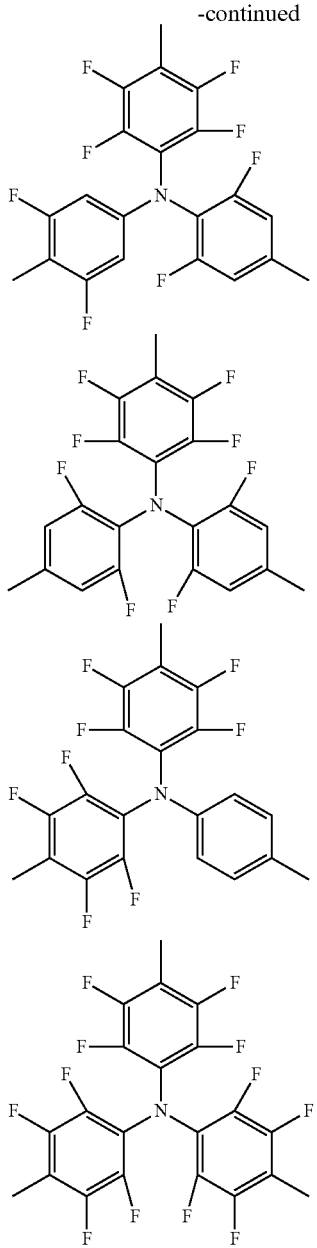

Moreover, structures in which the benzene rings in the above structural formulas are substituted with a substituent other than a fluorine atom are also included within the specific examples of the trivalent aromatic amine structures AA. For example, in the above structural formulas, each benzene ring may independently have one or more of the aforementioned R groups.

<<Monovalent Aromatic Amine Structures AA>>

Examples of monovalent aromatic amine structures AA include those shown below.

[Chemical formula 8]

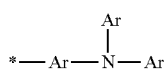

Each Ar independently represents an aromatic hydrocarbon group, and at least one Ar is an aromatic hydrocarbon group substituted with one or more fluorine atoms. Each Ar may be independently substituted with a substituent other than a fluorine atom.

Specific examples include the following structures.

[Chemcial formula 9]

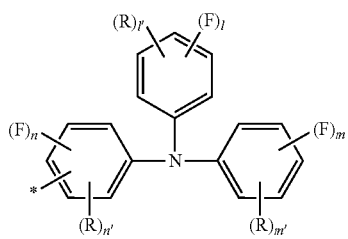

Each R independently represents a substituent other than a fluorine atom, each of l, l', m and m' independently represents an integer of 0 to 5, and each of n and n' independently represents an integer of 0 to 4, provided that l+m+n≥1, l+l'≤5, m+m'≤5, and n+n'≤4.

In the examples shown above, R is preferably an alkyl group, an aryl group or a heteroaryl group, and is more preferably an alkyl group or an aryl group.

The value of l+m+n is preferably not more than 8, more preferably not more than 6, even more preferably not more than 4, and particularly preferably 3 or fewer.

The value of l'+m'+n' is preferably not more than 8, more preferably not more than 6, even more preferably not more than 4, and particularly preferably 3 or fewer.

The structural unit AA contains either one, or two or more, of the aromatic amine structures AA, but preferably contains not more than 5, and more preferably 3 or fewer of these structures. When the structural unit AA has two or more aromatic amine structures AA, the two or more aromatic amine structures AA may be the same or different. The structural unit AA has one or more bonding sites and is monovalent or higher, with the structural unit being mutually bonded to another structural unit at each of these bonding sites. From the viewpoint of improving the characteristics of organic electroluminescent elements and enabling more favorable synthesis of the polymer, the structural unit AA is preferably hexavalent or lower, more preferably tetravalent or lower, and even more preferably divalent or trivalent.

Examples of the structural unit AA are shown below. However, the structural unit AA is not limited to the following structural units.

<<Divalent Structural Units AA>>

[Chemical formula 10]

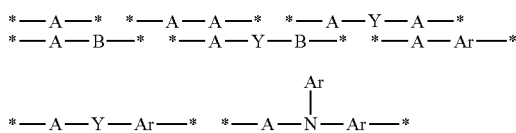

<<Trivalent or Tetravalent Structural Units AA>>

[Chemical formula 11]

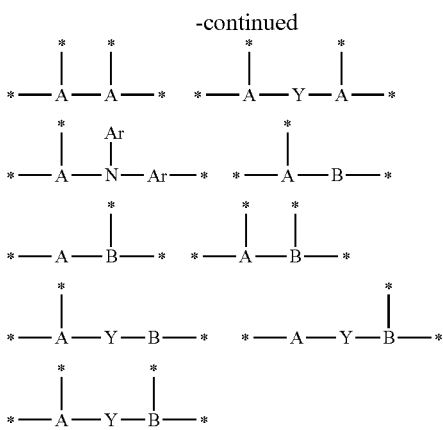

<<Monovalent Structural Units AA>>

*-A  *-A-A  [Chemical formula 12]

In the formulas, each "A" independently represents an aromatic amine structure AA, each "B" independently represents an aromatic amine structure AB described below, each "Ar" independently represents an aryl group (preferably of 6 to 30 carbon atoms), a heteroaryl group (preferably of 2 to 30 carbon atoms), an arylene group (preferably of 6 to 30 carbon atoms), or a heteroarylene group (preferably of 2 to 30 carbon atoms), and "Y" represents a divalent linking group. Ar may have a substituent, and examples of the substituent include the R group in a structural unit C2 described below. Examples of Y include divalent groups in which an additional hydrogen atom has been removed from those groups having one or more hydrogen atoms among the groups listed for R in the structural unit C2 (but excluding groups containing a polymerizable functional group).

An arylene group is an atom grouping in which two hydrogen atoms have been removed from an aromatic hydrocarbon. A heteroarylene group is an atom grouping in which two hydrogen atoms have been removed from an aromatic heterocycle. The following description applies equally to arylene groups and heteroarylene groups.

(Structural Unit AB)

The charge transport polymer I may contain arbitrary other structural units besides the structural unit AA. Examples of these other arbitrary structural units include structural units containing an aromatic amine structure other than the aromatic amine structure AA (hereafter, an "aromatic amine structure other than the aromatic amine structure AA" is also referred to as an "aromatic amine structure AB" and a "structural unit containing an aromatic amine structure other than the aromatic amine structure AA" is also referred to as a "structural unit AB"). The charge transport polymer I may have one type of structural unit AB, or may have two or more types. In those cases where the charge transport polymer I includes an arbitrary structural unit, from the viewpoint of obtaining superior charge transport properties, a structural unit AB is preferred as the arbitrary structural unit.

The aromatic amine structure AB is an aromatic amine structure that is not substituted with a fluorine atom. With the exception that the structure is not substituted with a fluorine atom, the aromatic amine structure AB may have the same structure as the aromatic amine structure AA described above.

In one embodiment, considering the effect of substituent groups, the aromatic amine structure AB may have no substituents. Further, in another embodiment, from the viewpoint of imparting a desired function to the charge transport polymer I, the aromatic amine structure AB may have a substituent other than a fluorine atom. Examples of the substituent other than a fluorine atom include —$R^1$, —$OR^2$, —$SR^3$, —$OCOR^4$, —$COOR^5$, —$SiR^6R^7R^8$, —CN, —$NO_2$, —CL, —Br, and groups containing a polymerizable functional group described below. $R^1$ to $R^8$ are as defined above. Further, considering the effect of the aromatic amine structure AA, electron-withdrawing groups may be excluded from the "substituent other than a fluorine atom". For example, the "substituent other than a fluorine atom" may include an electron-donating group. In a preferred embodiment, the "substituent other than a fluorine atom" contains —$R^1$.

Examples of the aromatic amine structure AB include the structures shown below. However, the aromatic amine structure AB is not limited to the following structures.

<<Divalent Aromatic Amine Structures AB>>

Examples of divalent aromatic amine structures AB include those shown below.

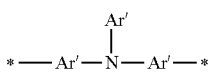

[Chemical formula 13]

Each Ar' independently represents an aromatic hydrocarbon group. Each Ar' may be independently substituted with a substituent other than a fluorine atom.

Specific examples include the following structures.

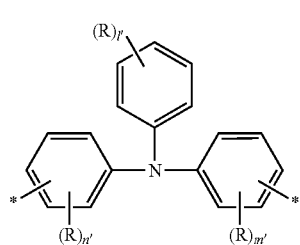

[Chemcial formula 14]

Each R independently represents a substituent other than a fluorine atom, l' represents an integer of 0 to 5, and each of m' and n' independently represents an integer of 0 to 4.

<<Trivalent Aromatic Amine Structures AB>>

Examples of trivalent aromatic amine structures AB include those shown below.

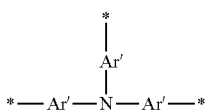

[Chemical formula 15]

Each Ar' independently represents an aromatic hydrocarbon group. Each Ar' may be independently substituted with a substituent other than a fluorine atom.

Specific examples include the following structures.

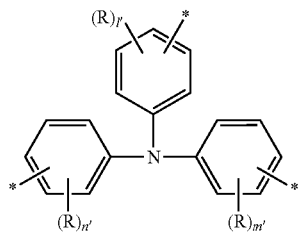

[Chemcial formula 16]

Each R independently represents a substituent other than a fluorine atom, and each of l', m' and n' independently represents an integer of 0 to 4.

<<Monovalent Aromatic Amine Structures AB>>

Examples of monovalent aromatic amine structures AB include those shown below.

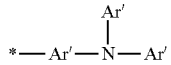

[Chemical formula 17]

Each Ar' independently represents an aromatic hydrocarbon group. Each Ar' may be independently substituted with a substituent other than a fluorine atom.

Specific examples include the following structures.

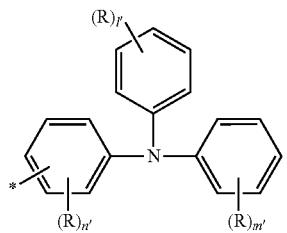

[Chemcial formula 18]

Each R independently represents a substituent other than a fluorine atom, each of l' and m' independently represents an integer of 0 to 5, and n' represents an integer of 0 to 4.

In the examples shown above, R is preferably an alkyl group, an aryl group or a heteroaryl group, and is more preferably an alkyl group or an aryl group.

The value of l'+m'+n' is preferably not more than 8, more preferably not more than 6, even more preferably not more than 4, and particularly preferably 3 or fewer.

The structural unit AB contains either one, or two or more, of the aromatic amine structures AB, but preferably contains not more than 5, and more preferably 3 or fewer of these structures. When the structural unit AB has two or more aromatic amine structures AB, the two or more aromatic amine structures AB may be the same or different. The structural unit AB has one or more bonding sites and is monovalent or higher, with the structural unit being mutually bonded to another structural unit at each of these bonding sites. From the viewpoint of improving the characteristics of organic electroluminescent elements and enabling more favorable synthesis of the polymer, the structural unit AB is preferably hexavalent or lower, more preferably tetravalent or lower, and even more preferably divalent or trivalent.

Examples of the structural unit AB are shown below. However, the structural unit AB is not limited to the following structural units.

<<Divalent Structural Units AB>>

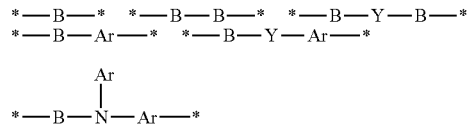

[Chemical formaula 19]

<<Trivalent or Higher Structural Units AB>>

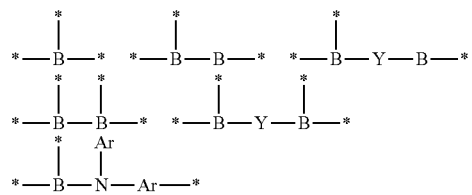

[Chemical formula 20]

<<Monovalent Structural Units AB>>

[Chemical formula 21]

In the formulas, each "B" independently represents an aromatic amine structure AB, each "Ar" independently represents an aryl group (preferably of 6 to 30 carbon atoms), a heteroaryl group (preferably of 2 to 30 carbon atoms), an arylene group (preferably of 6 to 30 carbon atoms), or a heteroarylene group (preferably of 2 to 30 carbon atoms), and "Y" represents a divalent linking group. Ar may have a substituent, and examples of the substituent include the aforementioned R group (a substituent other than a fluorine atom). Examples of Y include divalent groups obtained by removing an additional hydrogen atom from those groups having one or more hydrogen atoms among the aforementioned R groups (substituents other than a fluorine atom (but excluding groups containing a polymerizable functional group)).

(Structural Unit C)

An additional example of an arbitrary structural unit contained in the charge transport polymer I is a structural unit C. The structural unit C is a structural unit that is different from the structural unit AA and the structural unit AB. The structural unit C has one or more bonding sites and is monovalent or higher, with the structural unit being mutually bonded to another structural unit at each of these bonding sites. The structural unit C includes divalent structural units C2, trivalent or higher structural units C3, and monovalent structural units C1. The charge transport polymer I may have only one type of the structural unit C, or may have two or more types. In those cases where the charge transport polymer I includes the structural unit C, from the viewpoint of obtaining superior charge transport properties, a structural unit C1 is preferred as the structural unit C.

<<Structural Unit C2>>

The structural unit C2 is a divalent structural unit. The structural unit C2 preferably includes an atom grouping having the ability to transport an electric charge. For example, the structural unit C2 may be selected from among carbazole structures, thiophene structures, fluorene structures, benzene structures, biphenyl structures, terphenyl structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures, and benzotriazole structures, which may be substituted or unsubstituted, and structures containing one type, or two or more types, of the above structures. When the structural unit C2 contains two or more of the above structures, the two or more structures may be the same or different.

In one embodiment, from the viewpoint of obtaining superior hole transport properties, the structural unit C2 is preferably selected from among substituted or unsubstituted carbazole structures, thiophene structures, fluorene structures, benzene structures, and pyrrole structures, and structures containing one type, or two or more types, of these structures. In another embodiment, from the viewpoint of obtaining superior electron transport properties, the structural unit C2 is preferably selected from among substituted or unsubstituted fluorene structures, benzene structures, phenanthrene structures, pyridine structures, and quinoline structures, and structures containing one type, or two or more types, of these structures.

Specific examples of the structural unit C2 are shown below. However, the structural unit C2 is not limited to the following structures. In the following examples, * is omitted.

[Chemical formula 22]

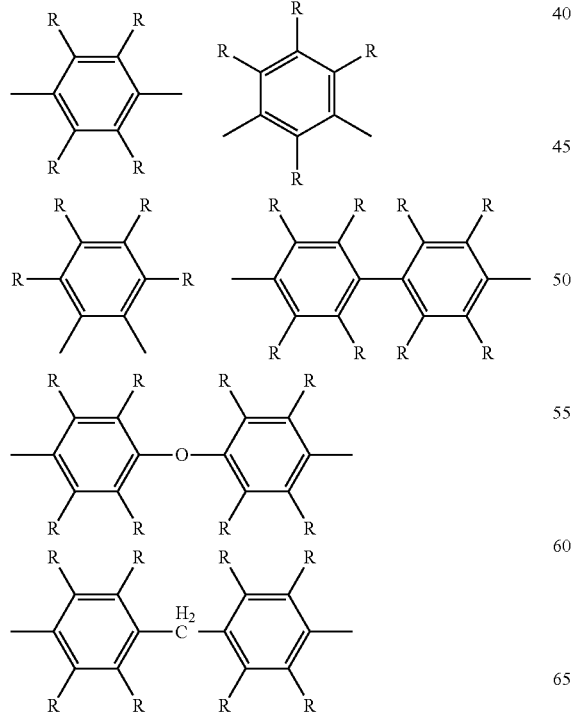

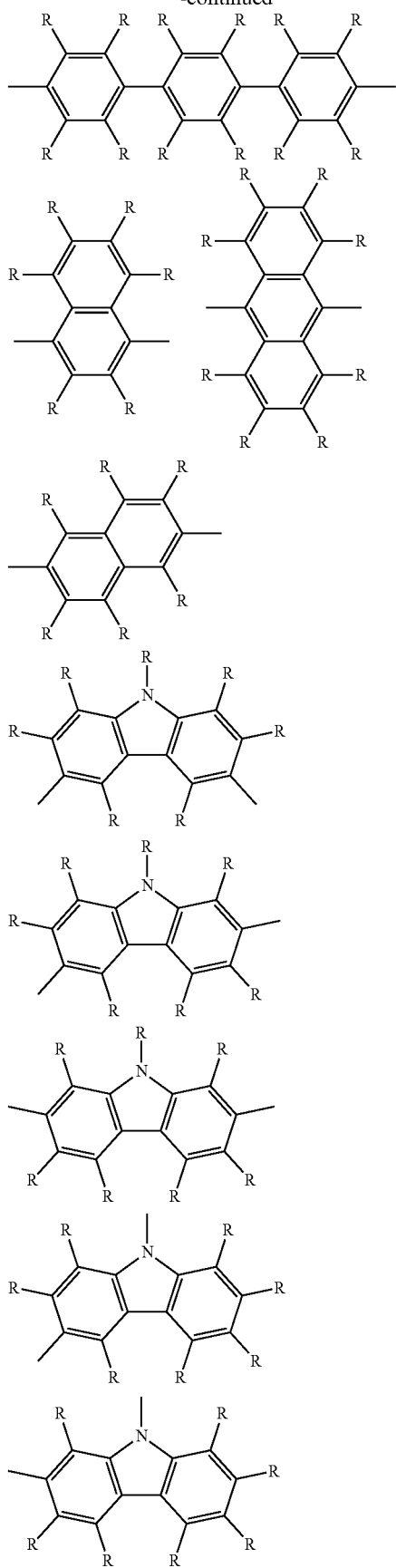

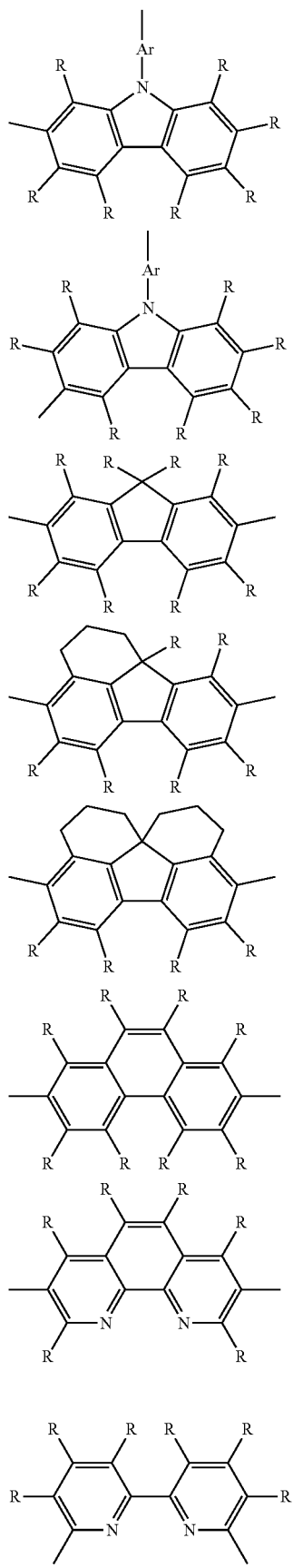
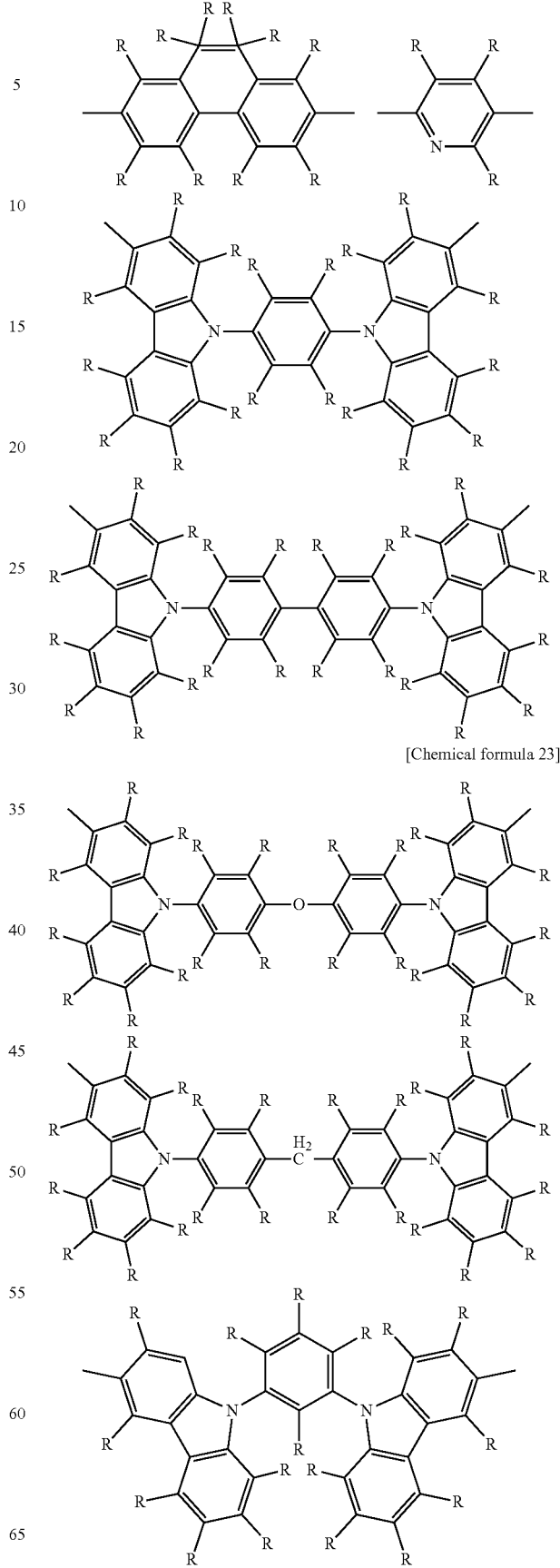

-continued

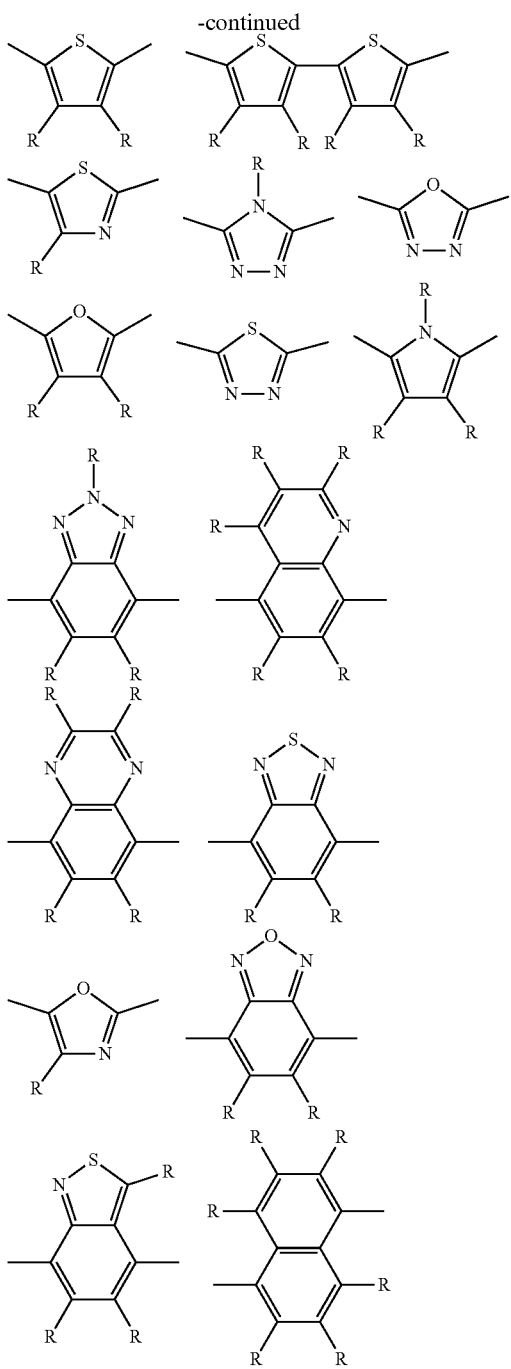

Each R independently represents a hydrogen atom or a substituent. It is preferable that each R is independently selected from a group consisting of —$R^1$, —$OR^2$, —$SR^3$, —$OCOR^4$, —$COOR^5$, —$SiR^6R^7R^8$, —CN, —$NO_2$, halogen atoms (such as —F, —Cl or —Br), and groups containing a polymerizable functional group described below. Each of $R^1$ to $R^8$ independently represents a hydrogen atom, a linear, cyclic or branched alkyl group (preferably of 1 to 22 carbon atoms), an aryl group (preferably of 6 to 30 carbon atoms), or a heteroaryl group (preferably of 2 to 30 carbon atoms). The alkyl group may be further substituted with an aryl group (preferably of 6 to 30 carbon atoms) or a heteroaryl group (preferably of 2 to 30 carbon atoms), and the aryl group or heteroaryl group may be further substituted with a linear, cyclic or branched alkyl group (preferably of 1 to 22 carbon atoms). Further, the alkyl group may be substituted with a halogen atom (for example, —$CF_3$). R is preferably a hydrogen atom, an alkyl group, an aryl group, or an alkyl-substituted aryl group.

Ar represents an arylene group (preferably of 6 to 30 carbon atoms) or a heteroarylene group (preferably of 2 to 30 carbon atoms). Ar may have a substituent, and examples of the substituent include R. Ar is preferably an arylene group, and is more preferably a phenylene group.

<<Structural Unit C3>>

The structural unit C3 is a trivalent or higher structural unit. The structural unit C3 preferably includes an atom grouping that has the ability to transport an electric charge. From the viewpoint of improving the durability of the organic electronic element, the structural unit C3 is preferably no higher than hexavalent, and is more preferably trivalent or tetravalent. For example, from the viewpoint of improving the durability of the organic electronic element, the structural unit C3 may be selected from among substituted or unsubstituted carbazole structures and condensed polycyclic aromatic hydrocarbon structures, and structures containing one type, or two or more types, of these structures. In those cases where the structural unit C3 contains two or more of the above structures, the two or more structures may be the same or different.

Specific examples of the structural unit C3 are shown below. However, the structural unit C3 is not limited to the following structures. In the following examples, * is omitted.

[Chemical formula 24]

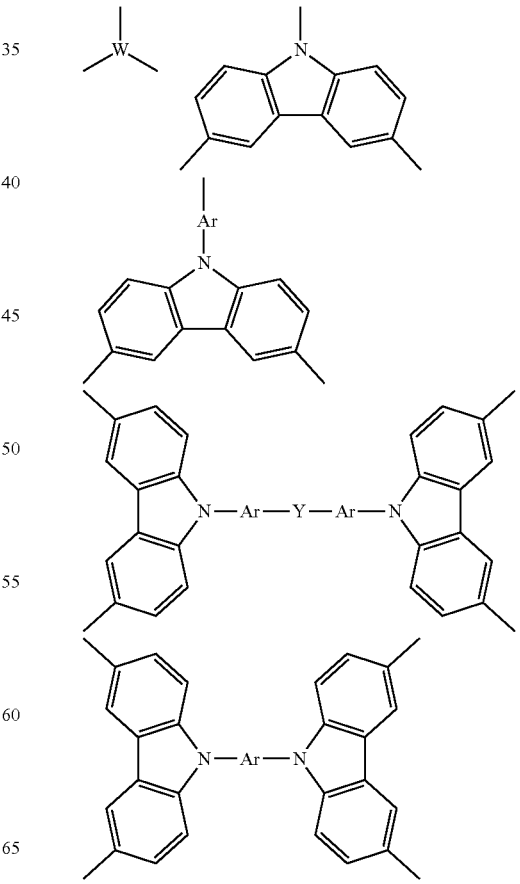

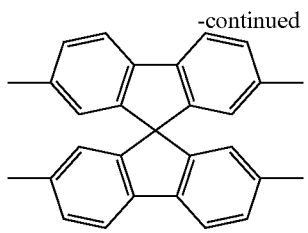 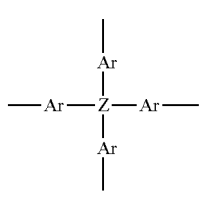 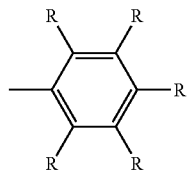

[Chemical formula 25]

W represents a trivalent linking group, and for example, represents an arenetriyl group (preferably of 6 to 30 carbon atoms) or a heteroarenetriyl group (preferably of 2 to 30 carbon atoms). Each Ar independently represents a divalent linking group, and for example, may represent an arylene group or heteroarylene group of 2 to 30 carbon atoms. Ar preferably represents an arylene group, and more preferably a phenylene group. Y represents a divalent linking group, and examples include divalent groups in which an additional hydrogen atom has been removed from those groups having one or more hydrogen atoms among the groups listed for R in the structural unit C2 (but excluding groups containing a polymerizable functional group). Z represents a carbon atom, a silicon atom or a phosphorus atom. In the structural units, the benzene rings and Ar groups may have a substituent, and examples of the substituent include the R groups in the structural unit C2.

An arenetriyl group is an atom grouping in which three hydrogen atoms have been removed from an aromatic hydrocarbon. A heteroarenetriyl is an atom grouping in which three hydrogen atoms have been removed from an aromatic heterocycle.

<<Structural Unit C1>>

The structural unit C1 is a monovalent structural unit. The structural unit C1 preferably includes an atom grouping that has the ability to transport an electric charge. For example, the structural unit C1 may be selected from among substituted or unsubstituted aromatic hydrocarbon structures and aromatic heterocyclic structures, and structures containing one type, or two or more types, of these structures. In those cases where the structural unit C1 contains two or more of the above structures, the two or more structures may be the same or different. In one embodiment, from the viewpoint of imparting durability without impairing the charge transport properties, the structural unit C1 is preferably a substituted or unsubstituted aromatic hydrocarbon structure, and is more preferably a substituted or unsubstituted benzene structure. Further, in another embodiment, when the charge transport polymer I has a polymerizable functional group at a terminal in the manner described below, the structural unit C1 may be a polymerizable structure (for example, a polymerizable functional group such as a pyrrolyl group).

For example, from the viewpoint of enabling functionality such as favorable solubility in solvents and good curability to be imparted easily and effectively, the charge transport polymer I preferably has the structural unit C1 at the terminals.

Specific examples of the structural unit C1 are shown below. However, the structural unit C1 is not limited to the following structures. In the following examples, * is omitted.

R is the same as R described in relation to the structural unit C2. In those cases where the charge transport polymer I has a polymerizable functional group described below at a terminal, it is preferable that at least one R group is a group containing a polymerizable functional group. Further, in those cases where the charge transport polymer I has an alkyl group at a terminal, it is preferable that at least one R group is an alkyl group.

(Proportions of Structural Units AA, AB and C)

From the viewpoint of obtaining satisfactory effects, the proportion of the structural unit AA within the charge transport polymer I, relative to the total of all the structural units, is preferably at least 5 mol %, more preferably at least 10 mol %, and even more preferably 15 mol % or greater. The upper limit may be 100 mol %, but in those cases where the structural unit AB and/or the structural unit C are also included, the upper limit is, for example, not more than 70 mol %, preferably not more than 50 mol %, and more preferably 20 mol % or less.

In those cases where the charge transport polymer I has the structural unit AB, from the viewpoint of improving the characteristics of the organic electronic element, the proportion of the structural unit AB, relative to the total of all the structural units, is preferably not more than 50 mol %, more preferably not more than 30 mol %, and even more preferably 15 mol % or less. The lower limit is 0 mol %, but from the viewpoint of adjusting the HOMO level and the viewpoint of improving the characteristics, the lower limit is, for example, at least 5 mol %, preferably at least 10 mol %, and more preferably 15 mol % or greater.

Furthermore, in those cases where the charge transport polymer I has the structural unit AB, the total proportion of the structural unit AA and the structural unit AB, relative to the total of all the structural units, is preferably at least 10 mol %, more preferably at least 25 mol %, and even more preferably 30 mol % or greater. The upper limit may be 100 mol %, but in those cases where the structural unit C is also included, the upper limit for this total amount is, for example, not more than 85 mol %, and preferably 80 mol % or less. The larger the proportion of the structural unit AA and the structural unit AB within the charge transport polymer I, the better the charge transport properties tend to become. In those cases where the charge transport polymer I has the structural unit AB, then if consideration is given to obtaining particularly superior charge transport properties, the total proportion of the structural unit AA and the structural unit AB, relative to the total of all the structural units, is preferably at least 50 mol %, more preferably at least 55 mol %, and even more preferably 60 mol % or greater. By altering the proportion of the structural unit AA and the structural unit AB, the charge transport properties of the organic electronic material can be adjusted.

In those cases where the charge transport polymer I has the structural unit C, from the viewpoint of improving the characteristics of the organic electronic element, the proportion of the structural unit C, relative to the total of all the structural units, is preferably not more than 50 mol %, more preferably not more than 30 mol %, and even more preferably 20 mol % or less. The lower limit is 0 mol %, but from the viewpoint of adjusting the HOMO level and the viewpoint of introducing substituents at the terminals, the lower limit is, for example, at least 5 mol %, preferably at least 10 mol %, and more preferably 15 mol % or greater.

If due consideration is given to obtaining the effects of the structural unit AA, then the ratio (molar ratio) between the structural unit AA, the structural unit AB and the structural unit C preferably satisfies AA:AB:C=(100 to 5):(0 to 95):(0 to 95), more preferably (100 to 10):(0 to 90):(0 to 90), and even more preferably (100 to 15):(0 to 85):(0 to 85).

In those cases where the charge transport polymer I has the structural unit AB, the ratio between the combination of the structural unit AA and the structural unit AB, and the structural unit C preferably satisfies (AA+AB):C=(100 to 5):(0 to 95), more preferably satisfies (100 to 10):(0 to 90), and more preferably satisfies (100 to 15):(0 to 85). If consideration is given to obtaining particularly superior charge transport properties, then this ratio preferably satisfies (AA+AB):C=(100 to 50):(0 to 50), more preferably (100 to 55):(0 to 45), and even more preferably (100 to 60):(0 to 40).

The proportion of each structural unit can be determined from the amount added of the monomer corresponding with that structural unit during synthesis of the charge transport polymer I. Further, the proportion of each structural unit can also be calculated as an average value using the integral of the spectrum attributable to the structural unit in the $^1$H-NMR (nuclear magnetic resonance) spectrum of the charge transport polymer I. In terms of ease of calculation, if the amount added of the monomer is clear, then the proportion of the structural unit is preferably determined using the amount added of the monomer. This applies to all subsequent determinations of structural unit proportions.

(Polymerizable Functional Group)

From the viewpoints of enabling the polymer to be cured by a polymerization reaction, thereby altering the solubility in solvents, the charge transport polymer I may have at least one polymerizable functional group. A "polymerizable functional group" is a group which is able to form bonds upon the application of heat and/or light.

Examples of the polymerizable functional group include groups having a carbon-carbon multiple bond (such as a vinyl group, allyl group, butenyl group, ethynyl group, acryloyl group, acryloyloxy group, acryloylamino group, methacryloyl group, methacryloyloxy group, methacryloylamino group, vinyloxy group and vinylamino group), groups having a small ring (including cyclic alkyl groups such as a cyclopropyl group and cyclobutyl group; cyclic ether groups such as an epoxy group (oxiranyl group) and oxetane group (oxetanyl group); diketene groups; episulfide groups; lactone groups; lactam groups), and heterocyclic groups (such as a furanyl group, pyrrolyl group, thiophenyl group and siloyl group). Particularly preferred polymerizable functional groups include a vinyl group, acryloyl group, methacryloyl group, epoxy group and oxetane group, and from the viewpoint of improving the reactivity and the characteristics of the organic electronic element, a vinyl group, oxetane group or epoxy group is more preferred, an oxetane group or epoxy group is even more preferred, and an oxetane group is particularly desirable.

From the viewpoints of increasing the degree of freedom associated with the polymerizable functional group and facilitating the polymerization reaction, the main backbone of the charge transport polymer I and the polymerizable functional group are preferably linked via an alkylene chain.

In the case where, for example, the organic layer is to be formed on an electrode, from the viewpoint of enhancing the affinity with hydrophilic electrodes of ITO or the like, the main backbone and the polymerizable functional group are preferably linked via a hydrophilic chain such as an ethylene glycol chain or a diethylene glycol chain. From the viewpoint of simplifying preparation of the monomer used for introducing the polymerizable functional group, the charge transport polymer I may have an ether linkage or an ester linkage at the terminal of the alkylene chain and/or the hydrophilic chain, namely, at the linkage site between these chains and the polymerizable functional group, and/or at the linkage site between these chains and the backbone of the charge transport polymer I. The aforementioned "group containing a polymerizable functional group" includes a polymerizable functional group itself, or a group containing a combination of a polymerizable functional group and an alkylene chain or the like. The polymerizable functional group may have a substituent such as a linear, cyclic or branched alkyl group.

The polymerizable functional group may be introduced at a terminal of the charge transport polymer I (namely, as a monovalent structural unit), at a portion other than a terminal (namely, as a divalent or trivalent or higher structural unit), or at both a terminal and a portion other than a terminal. From the viewpoint of the curability, the polymerizable functional group is preferably introduced at least at a terminal, and from the viewpoint of achieving a combination of favorable curability and charge transport properties, is preferably introduced only at terminals. In those cases where the charge transport polymer I has a branched structure, the polymerizable functional group may be introduced within the main chain of the charge transport polymer I, introduced within a side chain, or introduced within both the main chain and a side chain.

From the viewpoint of contributing to a change in the solubility, the polymerizable functional group is preferably included in the charge transport polymer I in a large amount. On the other hand, from the viewpoint of not impeding the charge transport properties, the amount included in the charge transport polymer I is preferably kept small. The amount of the polymerizable functional group may be set as appropriate with due consideration of these factors.

For example, from the viewpoint of obtaining a satisfactory change in the solubility, the number of polymerizable functional groups per one molecule of the charge transport polymer I is preferably at least 2, and more preferably 3 or greater. Further, from the viewpoint of maintaining good charge transport properties, the number of polymerizable functional groups is preferably not more than 1,000, and more preferably 500 or fewer.

The number of polymerizable functional groups per one molecule of the charge transport polymer I can be determined as an average value from the amount of the polymerizable functional group used in synthesizing the charge transport polymer (for example, the amount added of the monomer having the polymerizable functional group), the amounts added of the monomers corresponding with the various structural units, and the weight average molecular weight of the charge transport polymer I and the like. Further, the number of polymerizable functional groups can also be calculated as an average value using the ratio between the integral of the signal attributable to the polymerizable functional group and the integral of the total spectrum in the $^1$H-NMR (nuclear magnetic resonance) spectrum of the charge transport polymer I. In terms of ease of calculation, if the amounts added of the various components are clear, then the number of polymerizable functional groups is preferably determined from these amounts.

In those cases where the charge transport polymer I has a polymerizable functional group, from the viewpoint of efficiently curing the charge transport polymer I, the proportion of the polymerizable functional group, relative to the total of all the structural units, is preferably at least 0.1 mol %, more preferably at least 1 mol %, and even more preferably 3 mol % or greater. Further, from the viewpoint of obtaining favorable charge transport properties, the proportion of the polymerizable functional group is preferably not more than 70 mol %, more preferably not more than 60 mol %, and even more preferably 50 mol % or less. Here, the "proportion of the polymerizable functional group" refers to the proportion of the structural unit having the polymerizable functional group.

(Structure of Charge Transport Polymer I)

Examples of partial structures contained in the charge transport polymer I are described below. However, the charge transport polymer I is not limited to polymers having the following partial structures.

<<Partial Structures of Linear Charge Transport Polymers I>>

T-L-L-L-L-*      [Chemical formula 26]

<<Partial Structures of Branched Charge Transport Polymers I>>

[Chemical formula 27]

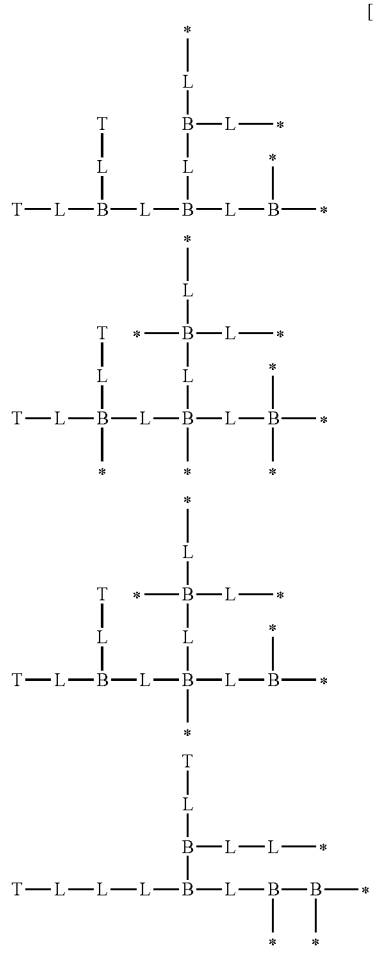

In the above partial structures, "L" represents a divalent structural unit, "B" represents a trivalent or tetravalent structural unit, and "T" represents a monovalent structural unit. The symbol "*" denotes a bonding site to another structure. The plurality of L units may be the same structural units or different structural units. This also applies for the B and T units.

Examples of "L" include divalent structural units AA, divalent structural units AB and divalent structural units C (the structural unit C2), examples of "B" include trivalent or tetravalent structural units AA, trivalent or tetravalent structural units AB, and trivalent or tetravalent structural units C (the structural unit C3), and examples of "T" include monovalent structural units AA, monovalent structural units AB, and monovalent structural units C (the structural unit C1). The partial structures include a structural unit AA as at least one of "L", "B" and "T".

(Proportions of Structural Units L, B and T)

In those cases where the charge transport polymer I contains the structural unit L, from the viewpoint of obtaining satisfactory charge transport properties, the proportion of the structural unit L, relative to the total of all the structural units, is preferably at least 10 mol %, more preferably at least 20 mol %, and even more preferably 30 mol % or greater. Further, considering the structural unit T and the structural unit B that may be introduced as required, the proportion of the structural unit L is preferably not more than 95 mol %, more preferably not more than 90 mol %, and even more preferably 85 mol % or less.

From the viewpoint of enhancing the characteristics of the organic electronic element, or from the viewpoint of suppressing any increase in viscosity, enabling synthesis of the charge transport polymer I to be performed more favorably, the proportion of the structural unit T included in the charge transport polymer I, relative to the total of all the structural units, is preferably at least 5 mol %, more preferably at least 10 mol %, and even more preferably 15 mol % or greater. Further, from the viewpoint of obtaining satisfactory charge transport properties, the proportion of the structural unit T is preferably not more than 60 mol %, more preferably not more than 55 mol %, and even more preferably 50 mol % or less.

In those cases where the charge transport polymer I contains the structural unit B, from the viewpoint of improving the durability of the organic electronic element, the proportion of the structural unit B, relative to the total of all the structural units, is preferably at least 1 mol %, more preferably at least 5 mol %, and even more preferably 10 mol % or greater. Further, from the viewpoint of suppressing any increase in viscosity, enabling synthesis of the charge transport polymer I to be performed more favorably, or from the viewpoint of obtaining satisfactory charge transport properties, the proportion of the structural unit B is preferably not more than 50 mol %, more preferably not more than 40 mol %, and even more preferably 30 mol % or less.

Considering the balance between the charge transport properties, the durability and the productivity, the ratio (molar ratio) between the structural unit L and the structural unit T in a linear charge transport polymer I is preferably L:T=100:(1 to 70), more preferably 100:(3 to 50), and even more preferably 100:(5 to 30). Further, in those cases where the charge transport polymer includes the structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80).

In those cases where superior charge transport properties are desirable, the proportion of the structural unit AA and structural unit AB (the proportion of the structural unit AA in the case of only structural units AA, or the combination of the structural unit AA and the structural unit AB in the case where both structural units are included) included among the structural units L and structural units B, relative to the total of all the structural units L and structural units B, is preferably at least 50 mol %, more preferably at least 55 mol %, even more preferably at least 60 mol %, particularly preferably at least 70 mol %, and most preferably 80 mol % or greater. The upper limit may be 100 mol %.

(Number Average Molecular Weight, Weight Average Molecular Weight)

The number average molecular weight of the charge transport polymer I may be adjusted appropriately with due consideration of the solubility in solvents and the film formability and the like. From the viewpoint of ensuring superior charge transport properties, the number average molecular weight is preferably at least 500, more preferably at least 1,000, even more preferably at least 3,000, particularly preferably at least 5,000, and most preferably 10,000 or greater. Further, from the viewpoints of maintaining favorable solubility in solvents and facilitating the preparation of ink compositions, the number average molecular weight is preferably not more than 1,000,000, more preferably not more than 100,000, even more preferably not more than 70,000, particularly preferably not more than 50,000, and most preferably 45,000 or less.

The weight average molecular weight of the charge transport polymer I may be adjusted appropriately with due consideration of the solubility in solvents and the film formability and the like. From the viewpoint of ensuring superior charge transport properties, the weight average molecular weight is preferably at least 1,000, more preferably at least 5,000, even more preferably at least 10,000, particularly preferably at least 20,000, and most preferably 25,000 or greater. Further, from the viewpoints of maintaining favorable solubility in solvents and facilitating the preparation of ink compositions, the weight average molecular weight is preferably not more than 1,000,000, more preferably not more than 700,000, even more preferably not more than 400,000, particularly preferably not more than 300,000, and most preferably 150,000 or less.

The number average molecular weight and the weight average molecular weight can be measured by gel permeation chromatography (GPC) using a calibration curve of standard polystyrenes.

From the viewpoint of stabilizing the film quality of the coating film, the number of structural units in the charge transport polymer I (the degree of polymerization) is preferably at least 2, more preferably at least 5, and even more preferably 10 or greater. Further, from the viewpoint of the solubility in solvents, the number of units is preferably not more than 1,000, more preferably not more than 700, and even more preferably 500 or fewer.

The number of structural units can be determined as an average value using the weight average molecular weight of the charge transport polymer I, the molecular weight of the various structural units, and the proportions of the various structural units.

(Specific Examples of the Charge Transport Polymer I)

Examples of the charge transport polymer I include polymers containing the structural units shown below. However, the charge transport polymer I is not limited to the following polymers.

[Chemical formula 28]

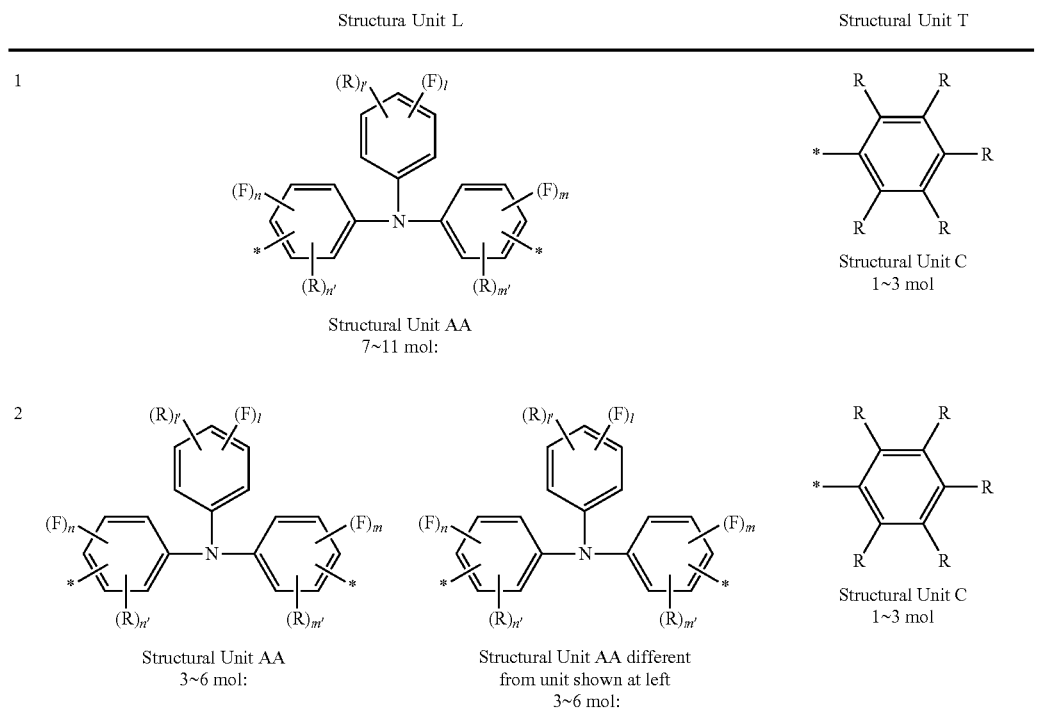

[Chemical formula 28]

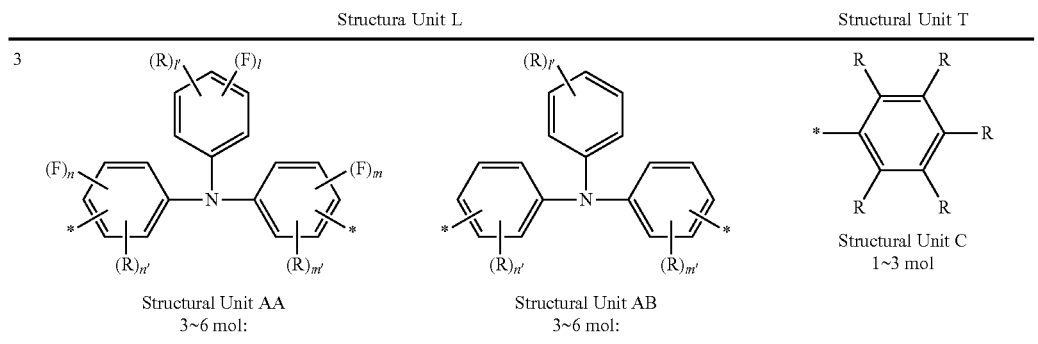

[Chemical formula 29]

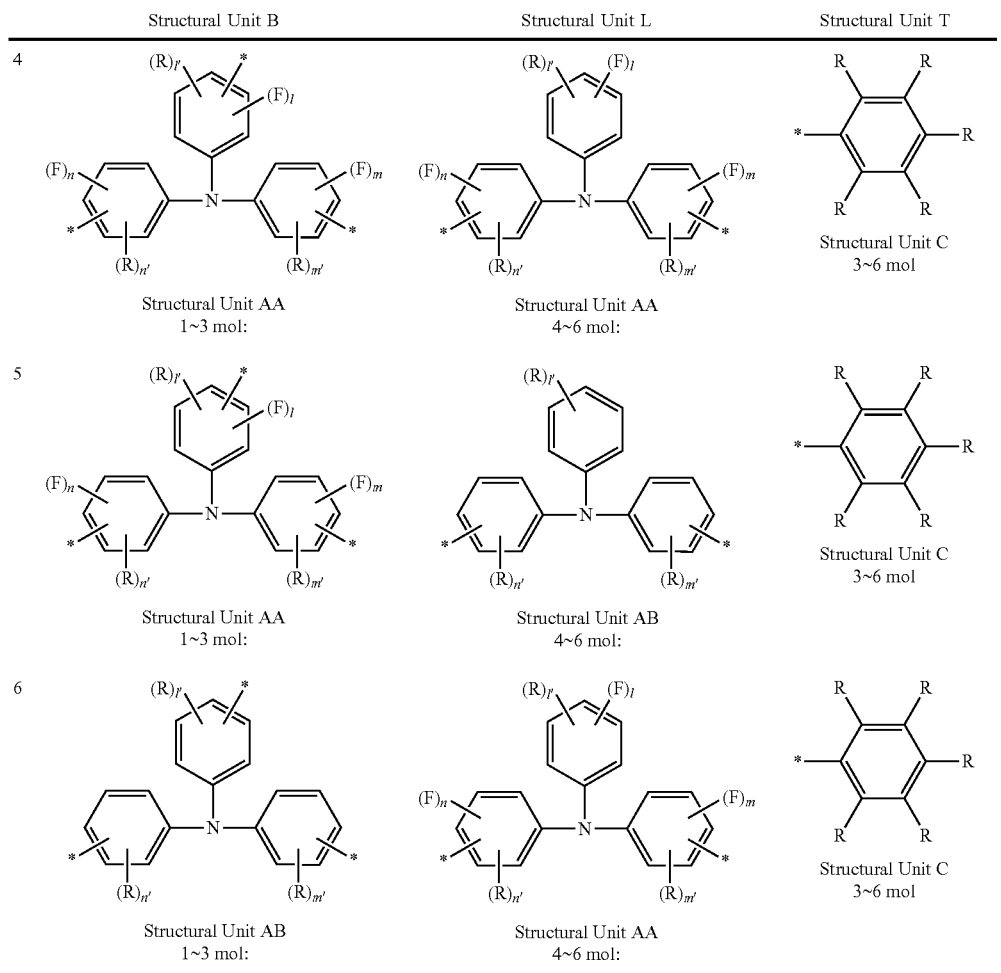

(Production Method)

The charge transport polymer I can be produced by various synthesis methods, and there are no particular limitations. For example, the charge transport polymer I can be produced by a coupling reaction of the monomers used for forming the structural units that constitute the charge transport polymer I. The structural units are the basic units of the chemical structure of the polymer, and in one embodiment, refer to the monomer units derived from the monomers used in the polymer synthesis. Examples of coupling reactions that may be used include conventional reactions such as the Suzuki coupling, Negishi coupling, Sonogashira coupling, Stille coupling and Buchwald-Hartwig coupling reactions. The Suzuki coupling is a reaction in which a cross-coupling reaction is initiated between an aromatic boronic acid derivative and an aromatic halide using a Pd catalyst. By using a Suzuki coupling, the charge transport polymer I can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used.

Examples of monomers that can be used in the Suzuki coupling reaction are shown below.

<<Monomer L>>

[Chemical formula 30]

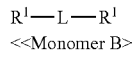

<<Monomer B>>

[Chemical formula 31]

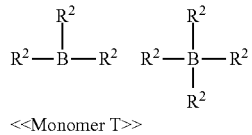

<<Monomer T>>

[Chemical formula 32]

In the formulas, L represents a divalent structural unit, B represents a trivalent or tetravalent structural unit, and T represents a monovalent structural unit. $R^1$ to $R^3$ represent functional groups capable of forming bonds to one another, and each group preferably independently represents one type of group selected from the group consisting of a boronic acid group, a boronate ester group and a halogen group. Among the monomers used, at least one of "L", "B" and "T" includes the structural unit AA.

These monomers can be synthesized by conventional methods. Further, these monomers can also be obtained from Tokyo Chemical Industry Co., Ltd. and Sigma-Aldrich Japan K. K. and the like.

The charge transport polymer I may be a homopolymer of one type of monomer, or may be a copolymer of two or more types of monomer. In those cases where the charge transport polymer I is a copolymer, the copolymer may be an alternating, random, block or graft copolymer, or a copolymer having an intermediate type structure, such as a random copolymer having block-like properties.

The production method for the charge transport polymer I is not limited to the methods described above, and for example, the polymer may also be produced by preparing a charge transport polymer containing an aromatic amine structure, and then introducing a fluorine atom as a substituent into the aromatic hydrocarbon group of the aromatic amine structure. Further, the polymer may also be produced by introducing the structural unit AA into a charge transport polymer.

[Dopant]

The organic electronic material may also include a dopant. There are no particular limitations on the dopant, provided the dopant is a compound that yields a doping effect upon addition to the organic electronic material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant. To improve the hole transport properties, p-type doping is preferably performed, whereas to improve the electron transport properties, n-type doping is preferably performed. The dopant used in the organic electronic material may be a dopant that exhibits either a p-type doping effect or an n-type doping effect. Further, a single type of dopant may be added alone, or a mixture of a plurality of types of dopant may be added.

The dopants used in p-type doping are electron-accepting compounds, and examples include Lewis acids, protonic acids, transition metal compounds, ionic compounds, halogen compounds and π-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_5$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, $TiCl_4$, $ZrCl_4$, $HfCl_4$, $NbF_5$, $AlCl_3$, $NbCl_5$, $TaCl_5$ and $MoF_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, $AsF_6^-$ (hexafluoroarsenate ion), $BF_4^-$ (tetrafluoroborate ion) or $PF_6^-$ (hexafluorophosphate ion), and salts having a conjugate base of an aforementioned protonic acid as an anion; halogen compounds such as $Cl_2$, $Br_2$, $I_2$, ICl, $ICl_3$, IBr and IF; and π-conjugated compounds such as TCNE (tetracyanoethylene) and TCNQ (tetracyanoquinodimethane). Further, the electron-accepting compounds disclosed in JP 2000-36390 A, JP 2005-75948 A, and JP 2003-213002 A and the like can also be used. Lewis acids, ionic compounds, and π-conjugated compounds and the like are preferred, and ionic compounds are more preferred. Among such compounds, onium salts can be used particularly favorably.

Examples of the cations and anions contained in the ionic compound are described below. Examples of the cation include $H^+$, a carbenium ion, ammonium ion, anilinium ion, pyridinium ion, imidazolium ion, pyrrolidinium ion, quinolinium ion, imonium ion, aminium ion, oxonium ion, pyrylium ion, chromenylium ion, xanthylium ion, iodonium ion, sulfonium ion, phosphonium ion, tropylium ion and cations having a transition metal, and of these, a carbenium ion, ammonium ion, anilinium ion, aminium ion, iodonium ion, sulfonium ion or tropylium ion is preferred. From the viewpoint of improving the characteristics of the organic electronic material, an ammonium ion, anilinium ion, iodonium ion or sulfonium ion is more preferable. Examples of the anion include halogen ions such as $F^-$, $Cl^-$, $Br^-$ and $I^-$; $OH^-$; $ClO_4^-$; sulfonate ions such as $FSO_3^-$, $ClSO_3^-$, $CH_3SO_3^-$, $C_6H_5SO_3^-$ and $CF_3SO_3^-$; sulfate ions such as $HSO_4^-$ and $SO_4^{2-}$; carbonate ions such as $HCO_3^-$ and $CO_3^{2-}$; phosphate ions such as $H_2PO_4^-$, $HPO_4^{2-}$ and $PO_4^{3-}$; fluorophosphate ions such as $PF_6^-$ and $PF_5OH^-$; fluoroalkyl fluorophosphate ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$ and $[((CF_3)_2CFCF_2)_2PF_4]^-$; fluoroalkane sulfonyl methide ions such as $(CF_3SO_2)_3C^-$; fluoroalkane sulfonyl imide ions such as $(CF_3SO_2)_2N^-$; borate ions such as $BF_4^-$, $B(C_6H_5)_4^-$ and $B(C_6H_4CF_3)_4^-$; fluoroantimonate ions such as $SbF_6^-$ and $SbF_5OH^-$; fluoroarsenate ions such as $AsF_6^-$ and $AsF_5OH^-$; $AlCl_4^-$ and $BiF_6^-$. From the viewpoint of improving the characteristics of the organic electronic material, fluorophosphate ions, fluoroalkyl fluorophosphate ions, fluoroalkane sulfonyl methide ions, fluoroalkane sulfonyl imide ions, borate ions and fluoroantimonate ions are preferred.

Onium salts are compounds that include an onium ion. Examples of onium salts include salts containing onium ions such as ammonium, phosphonium, oxonium, sulfonium and iodonium ions. For example, an onium salt may be selected from among the above examples of ionic compounds.

The dopants used in n-type doping are electron-donating compounds, and examples include alkali metals such as Li and Cs; alkaline earth metals such as Mg and Ca; salts of alkali metals and/or alkaline earth metals such as LiF and $Cs_2CO_3$; metal complexes; and electron-donating organic compounds.

In those cases where the charge transport polymer I has a polymerizable functional group, in order to facilitate a change in the solubility of the organic layer, the use of a compound that can function as a polymerization initiator for the polymerizable functional group as the dopant is preferred.

[Other Optional Components]

The organic electronic material may also contain other charge transport polymers, and charge transport low-molecular weight compounds and the like.

[Contents]

From the viewpoint of obtaining favorable charge transport properties, the amount of the charge transport polymer I, relative to the total mass of the organic electronic material, is preferably at least 50% by mass, more preferably at least 70% by mass, and even more preferably 80% by mass or greater. The amount may be 100% by mass.

When a dopant is included, from the viewpoint of improving the charge transport properties of the organic electronic material, the amount of the dopant, relative to the total mass of the organic electronic material, is preferably at least 0.01% by mass, more preferably at least 0.1% by mass, and even more preferably 0.5% by mass or greater. Further, form the viewpoint of maintaining favorable film formability, the amount of the dopant, relative to the total mass of the organic electronic material, is preferably not more than 50% by mass, more preferably not more than 30% by mass, and even more preferably 20% by mass or less.

<Ink Composition>

According to one embodiment, an ink composition contains the organic electronic material described above and a solvent capable of dissolving or dispersing the material. By using the ink composition, an organic layer can be formed easily using a simple coating method.

[Solvent]

Water, organic solvents, or mixed solvents thereof can be used as the solvent. Examples of the organic solvent include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride. Preferred solvents include aromatic hydrocarbons, aliphatic esters, aromatic esters, aliphatic ethers, and aromatic ethers and the like.

[Polymerization Initiator]

In those cases where the charge transport polymer I has a polymerizable functional group, the ink composition preferably contains a polymerization initiator. Conventional radical polymerization initiators, cationic polymerization initiators, and anionic polymerization initiators and the like can be used as the polymerization initiator. From the viewpoint of enabling simple preparation of the ink composition, the use of a substance that exhibits both a function as a dopant and a function as a polymerization initiator is preferred. Examples of such substances include the ionic compounds described above.

[Additives]

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

[Contents]

The amount of the solvent in the ink composition can be determined with due consideration of the use of the composition in various application methods. For example, the amount of the solvent is preferably an amount that yields a ratio of the charge transport polymer I relative to the solvent that is at least 0.1% by mass, more preferably at least 0.2% by mass, and even more preferably 0.5% by mass or greater. Further, the amount of the solvent is preferably an amount that yields a ratio of the charge transport polymer I relative to the solvent that is not more than 20% by mass, more preferably not more than 15% by mass, and even more preferably 10% by mass or less.

<Organic Layer>

According to one embodiment, an organic layer is a layer containing the organic electronic material described above. The organic electronic material is contained in the organic layer as the organic electronic material itself, or as a derivative derived from the organic electronic material such as a polymer product, a reaction product or a decomposition product. The organic layer is preferably a layer formed using the organic electronic material or the ink composition described above.

Further, according to one embodiment, a method for producing the organic layer includes a step of applying the ink composition. The production method may also include other optional steps such as a drying step or a step of curing the charge transport polymer. By using the ink composition, the organic layer can be formed favorably using a coating method.

Examples of the coating method include conventional methods such as spin coating methods; casting methods; dipping methods; plate-based printing methods such as relief printing, intaglio printing, offset printing, lithographic printing, relief reversal offset printing, screen printing and gravure printing; and plateless printing methods such as inkjet methods. When the organic layer is formed by a coating method, the organic layer (coating layer) obtained following coating may be dried on a hotplate or in an oven to remove the solvent.

In those cases where the charge transport polymer I has a polymerizable functional group, the charge transport polymer I can be subjected to a polymerization reaction by performing light irradiation or a heat treatment or the like, thereby changing the solubility of the organic layer. By stacking organic layers having changed solubility levels, multilayering of an organic electronic element can be performed with ease.

From the viewpoint of improving the efficiency of charge transport, the thickness of the organic layer obtained following drying or curing is preferably at least 0.1 nm, more preferably at least 1 nm, and even more preferably 3 nm or greater. Further, from the viewpoint of reducing the electrical resistance, the thickness of the organic layer is preferably not more than 300 nm, more preferably not more than 200 nm, and even more preferably 100 nm or less.

<Organic Electronic Element>

According to one embodiment, an organic electronic element has at least the organic layer described above. Examples of the organic electronic element include an organic EL element, an organic photoelectric conversion element, and an organic transistor. The organic electronic element preferably has a structure in which at least an organic layer is disposed between a pair of electrodes. Further, a method for producing the organic electronic element includes at least a step of applying the ink composition described above to form an organic layer. The production method may also include other optional steps such as a drying step, a step of curing the charge transport polymer I, a step of forming another layer, and an encapsulation step.

[Organic EL Element]

According to one embodiment, an organic EL element has at least the organic layer described above. The organic EL element typically includes a light-emitting layer, an anode, a cathode and a substrate, and if necessary, may also have other functional layers such as a hole injection layer, electron injection layer, hole transport layer and electron transport layer. Each layer may be formed by a vapor deposition method, or by a coating method. The organic EL element preferably has the organic layer as the light-emitting layer or as a functional layer, more preferably has the organic layer as a functional layer, and most preferably has the organic layer as at least one of a hole injection layer and a hole transport layer. Further, a method for producing the organic EL element includes at least a step of applying the ink composition described above to form the organic layer. The production method may also include other optional steps such as a drying step, a step of curing the charge transport polymer I, a step of forming another layer, and an encapsulation step.

One example of a preferred aspect of the organic EL element is an element having at least the organic layer described above and a light-emitting layer that contacts the organic layer, and is preferably an element having at least an anode, a hole injection layer, a hole transport layer, a light-emitting layer and a cathode, wherein the hole transport layer is the organic layer described above. Although there are no particular limitations on the light-emitting layer, from the viewpoint of achieving the effects of the organic layer, a light-emitting layer that emits light in the blue to green region (for example, a green peak wavelength of 495 to 570 nm) upon voltage application is preferred. In the latter aspect, the hole injection layer may be an aforementioned organic layer or another organic layer, and in one example, from the viewpoint of improving the characteristics of the organic EL element, is preferably another organic layer.

In those cases where the organic layer described above is used for a layer that exhibits hole transport properties, such as a hole transport layer or a hole injection layer, the organic layer is preferably selected with due consideration of carrier balance. For example, when superior charge transport properties are required for the layer that exhibits hole transport properties, an organic layer formed using a charge transport polymer I containing a high proportion of the structural unit AA, or a high proportion of the structural unit AA and the structural unit AB, can be used particularly favorably.

Figure 2:
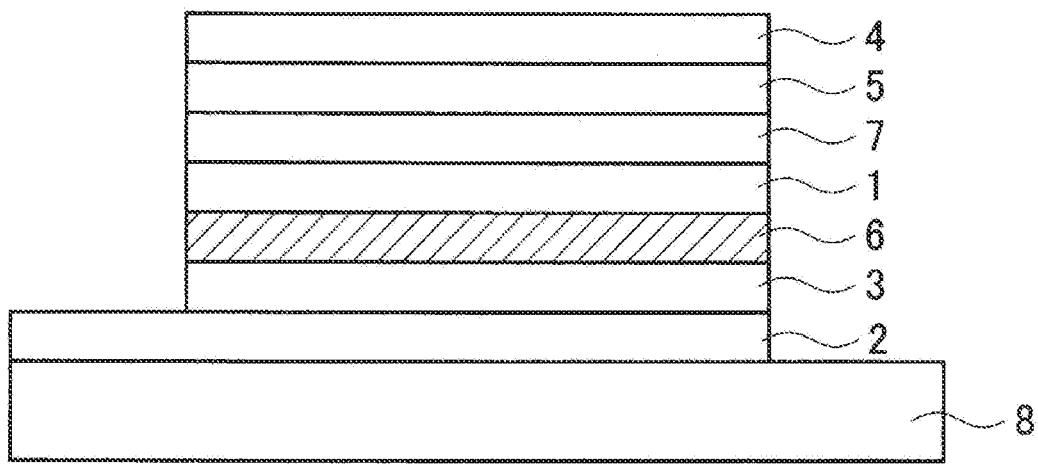
FIG. 2 is a schematic cross-sectional view illustrating one example of an organic EL element of one embodiment.
Figure 3:
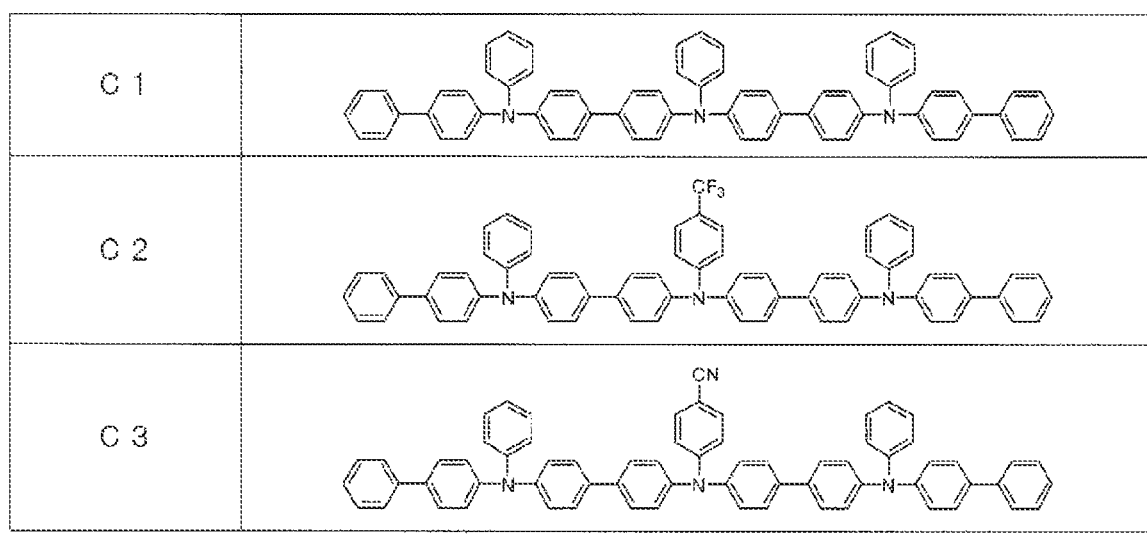
FIG. 3 is a diagram illustrating the structures of charge transport polymers used in simulations.

FIG. 1 is a cross-sectional schematic view illustrating one embodiment of a structure contained in an organic EL element. The structure of FIG. 1 has an organic layer 11 of one embodiment, and a light-emitting layer 12 that contacts the organic layer. FIG. 2 is a cross-sectional schematic view illustrating one embodiment of the organic EL element. The organic EL element in FIG. 2 is an element with a multilayer structure, and has a substrate 8, an anode 2, a hole injection layer 3, a hole transport layer 6 formed from an organic layer of one embodiment, a light-emitting layer 1, an electron transport layer 7, an electron injection layer 5 and a cathode 4 provided in that order.

Each of the layers that may be included in the organic EL element is described below.

[Light-Emitting Layer]

Examples of materials that can be used for the light-emitting layer include light-emitting materials such as low-molecular weight compounds, polymers, and dendrimers and the like. Polymers exhibit good solubility in solvents, meaning they are suitable for coating methods, and are consequently preferred. Examples of the light-emitting material include fluorescent materials, phosphorescent materials, and thermally activated delayed fluorescent materials (TADF).

Specific examples of the fluorescent materials include low-molecular weight compounds such as perylene, coumarin, rubrene, quinacridone, stilbene, color laser dyes, aluminum complexes, and derivatives of these compounds; polymers such as polyfluorene, polyphenylene, polyphenylenevinylene, polyvinylcarbazole, fluorene-benzothiadiazole copolymers, fluorene-triphenylamine copolymers, and derivatives of these polymers; and mixtures of the above materials.

Examples of materials that can be used as the phosphorescent materials include metal complexes and the like containing a metal such as Ir or Pt. Specific examples of Ir complexes include FIr(pic) (iridium(III) bis[(4,6-difluorophenyl)-pyridinato-N,$C^2$] picolinate) which emits blue light, Ir(ppy)$_3$ (fac-tris(2-phenylpyridine)iridium) which emits green light, and (btp)$_2$Ir(acac) (bis[2-(2'-benzo[4,5-a]thienyl)pyridinato-N,$C^3$]iridium(acetyl-acetonate)) and Ir(piq)$_3$ (tris(1-phenylisoqionoline)iridium) which emit red light. Specific examples of Pt complexes include PtOEP (2,3,7,8,12,13,17,18-octaethyl-21H,23H-porphyrin-platinum) which emits red light.

When the light-emitting layer contains a phosphorescent material, a host material is preferably also included in addition to the phosphorescent material. Low-molecular weight compounds, polymers, and dendrimers can be used as this host material. Examples of the low-molecular weight compounds include CBP (4,4'-bis(9H-carbazol-9-yl)-biphenyl), mCP (1,3-bis(9-carbazolyl)benzene), CDBP (4,4'-bis(carbazol-9-yl)-2,2'-dimethylbiphenyl), and derivatives of these compounds. Examples of the polymers include the organic electronic material described above, polyvinylcarbazole, polyphenylene, polyfluorene, and derivatives of these polymers.

Examples of the thermally activated delayed fluorescent materials include the compounds disclosed in Adv. Mater., 21, 4802-4906 (2009); Appl. Phys. Lett., 98, 083302 (2011);

Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); and Chem. Lett., 43, 319 (2014) and the like.

[Hole Transport Layer, Hole Injection Layer]

Examples of materials that can be used for the hole transport layer and the hole injection layer include the organic electronic material described above. Further, other examples of materials that can be used for the hole transport layer and the hole injection layer include charge transport polymers that do not contain the structural unit AA (hereafter, a "charge transport polymer that does not contain the structural unit AA" is also referred to as a "charge transport polymer II"). With the exception of not containing the structural unit AA, the charge transport polymer II may have the same structure as the charge transport polymer I. In other words, the charge transport polymer II has, for example, the structural unit AB and/or the structural unit C.

Moreover, examples of conventional materials that can be used include aromatic amine-based compounds (for example, aromatic diamines such as N,N'-di(naphthalen-1-yl)-N,N'-diphenyl-benzidine (α-NPD)), phthalocyanine-based compounds, and thiophene-based compounds (for example, thiophene-based conductive polymers (such as poly(3,4-ethylenedioxythiophene):poly(4-styrenesulfonate) (PEDOT:PSS) and the like)).

[Electron Transport Layer, Electron Injection Layer]

Examples of materials that can be used for the electron transport layer and the electron injection layer include phenanthroline derivatives, bipyridine derivatives, nitro-substituted fluorene derivatives, diphenylquinone derivatives, thiopyran dioxide derivatives, condensed-ring tetracarboxylic acid anhydrides of naphthalene and perylene and the like, carbodiimides, fluorenylidenemethane derivatives, anthraquinodimethane and anthrone derivatives, oxadiazole derivatives, thiadiazole derivatives, benzimidazole derivatives, quinoxaline derivatives, and aluminum complexes. Further, the organic electronic material described above may also be used.

[Cathode]

Examples of the cathode material include metals or metal alloys, such as Li, Ca, Mg, Al, In, Cs, Ba, Mg/Ag, LiF and CsF.

[Anode]

Examples of the anode material include metals (for example, Au) or other materials having conductivity. Examples of the other materials include oxides (for example, ITO: indium oxide/tin oxide), and conductive polymers (for example, polythiophene-polystyrene sulfonate mixtures (PEDOT:PSS)).

[Substrate]

Glass and plastics and the like can be used as the substrate. The substrate is preferably transparent, and preferably has flexibility. Quartz glass and light-transmitting resin films and the like can be used particularly favorably.

Examples of the resin films include films containing polyethylene terephthalate, polyethylene naphthalate, polyethersulfone, polyetherimide, polyetheretherketone, polyphenylene sulfide, polyarylate, polyimide, polycarbonate, cellulose triacetate or cellulose acetate propionate.

In those cases where a resin film is used, an inorganic substance such as silicon oxide or silicon nitride may be coated onto the resin film to inhibit the transmission of water vapor and oxygen and the like.

[Emission Color]

There are no particular limitations on the color of the light emission from the organic EL element. White organic EL elements can be used for various illumination fixtures, including domestic lighting, in-vehicle lighting, watches and liquid crystal backlights, and are consequently preferred.

The method used for forming a white organic EL element involves using a plurality of light-emitting materials to emit a plurality of colors simultaneously, and then mixing the emitted colors to obtain a white light emission. There are no particular limitations on the combination of the plurality of emission colors, and examples include combinations that include three maximum emission wavelengths for blue, green and red, and combinations that include two maximum emission wavelengths such as blue and yellow, or yellowish green and orange. Control of the emission color can be achieved by appropriate adjustment of the types and amounts of the light-emitting materials.

[Display Element, Illumination Device, Display Device]

According to one embodiment, a display element includes the organic EL element described above. For example, by using the organic EL element as the element corresponding with each color pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned on, and drives, each element.

Further, according to one embodiment, an illumination device includes the organic EL element described above. Moreover, according to one embodiment, a display device includes the illumination device and a liquid crystal element as a display unit. For example, the display device may be a device that uses the illumination device as a backlight, and uses a conventional liquid crystal element as the display unit, namely a liquid crystal display device.

EXAMPLES

The embodiments of the present invention are described below in further detail using a series of examples. However, the embodiments of the present invention are not limited by the following examples.

Example I

[Production of Charge Transport Polymers]
<Preparation of Pd Catalyst>

In a glove box under a nitrogen atmosphere and at room temperature, tris(dibenzylideneacetone)dipalladium (73.2 mg, 80 µmol) was weighed into a sample tube, anisole (15 mL) was added, and the resulting mixture was agitated for 30 minutes. In a similar manner, tri-tert-butylphosphine (129.6 mg, 640 µmol) was weighed into a sample tube, anisole (5 mL) was added, and the resulting mixture was agitated for 5 minutes. The two solutions were then mixed together and stirred for 30 minutes at room temperature to obtain a Pd catalyst solution. All the solvents used in the catalyst preparation were deaerated by nitrogen bubbling for at least 30 minutes prior to use.

(Charge Transport Polymer c1)

A three-neck round-bottom flask was charged with the monomers shown below and anisole (20 mL), and the Pd catalyst solution (7.5 mL) was then added. After stirring for 30 minutes, a 10% aqueous solution of tetraethylammonium hydroxide (20 mL) was added to the flask. The resulting mixture was heated under reflux for 2 hours. All the operations up to this point were conducted under a stream of nitrogen. Further, all of the solvents were deaerated by nitrogen bubbling for at least 30 minutes prior to use.

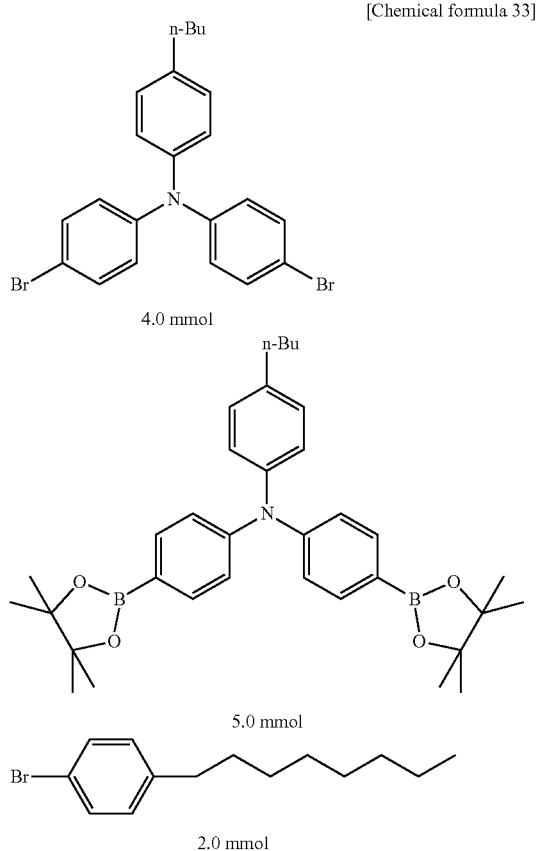

[Chemical formula 33]

After completion of the reaction, the organic layer was washed with water, and the organic layer was then poured into methanol-water (9:1). The precipitate that was produced was collected by suction filtration, and washed with methanol-water (9:1). The thus obtained precipitate was dissolved in toluene, and re-precipitated from methanol. The resulting precipitate was collected by suction filtration and dissolved in toluene, and a metal adsorbent ("Triphenylphosphine, polymer-bound on styrene-divinylbenzene copolymer", manufactured by Strem Chemicals Inc., 200 mg per 100 mg of the precipitate) was added to the solution and stirred overnight. Following completion of the stirring, the metal adsorbent and other insoluble matter were removed by filtration, and the filtrate was concentrated using a rotary evaporator. The concentrate was dissolved in toluene, and then re-precipitated from methanol-acetone (8:3). The thus produced precipitate was collected by suction filtration and washed with methanol-acetone (8:3). The thus obtained precipitate was then dried under vacuum to obtain a charge transport polymer c1. The number average molecular weight was 5,500 and the weight average molecular weight was 8,000. Further, the ratio (molar ratio) between the structural unit AB and the structural unit C was AB:C=9:2, the ratio (molar ratio) between the structural unit L and the structural unit T was L:T=9:2, and the average degree of polymerization was 29.

(Charge Transport Polymer e1)

With the exception of altering the monomers to the monomers shown below, the same procedure as that described for the production of the charge transport polymer c1 was used to obtain a charge transport polymer e1 (number average molecular weight: 8,500, weight average molecular weight: 12,000). The ratio (molar ratio) between the structural unit AA, the structural unit AB and the structural unit C was AA:AB:C=4:5:2, the ratio (molar ratio) between the structural unit L and the structural unit T was L:T=9:2, and the average degree of polymerization was 45.

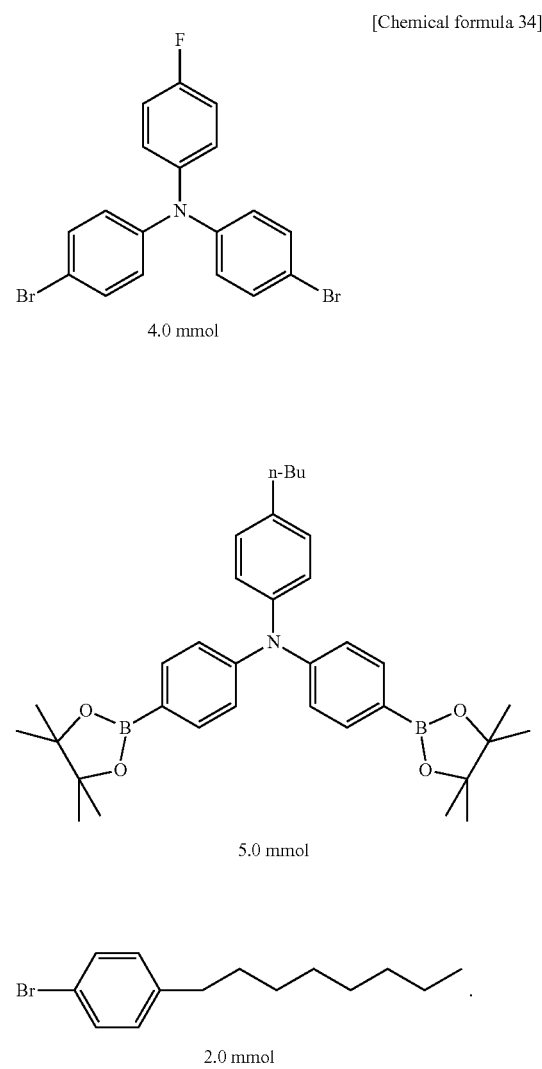

[Chemical formula 34]

(Charge Transport Polymer e2)

With the exception of altering the monomers to the monomers shown below, the same procedure as that described for the production of the charge transport polymer c1 was used to obtain a charge transport polymer e2 (number average molecular weight: 4,500, weight average molecular weight: 7,000). The ratio (molar ratio) between the structural unit AA, the structural unit AB and the structural unit C was AA:AB:C=4:5:2, the ratio (molar ratio) between the structural unit L and the structural unit T was L:T=9:2, and the average degree of polymerization was 24.

[Chemical formula 35]

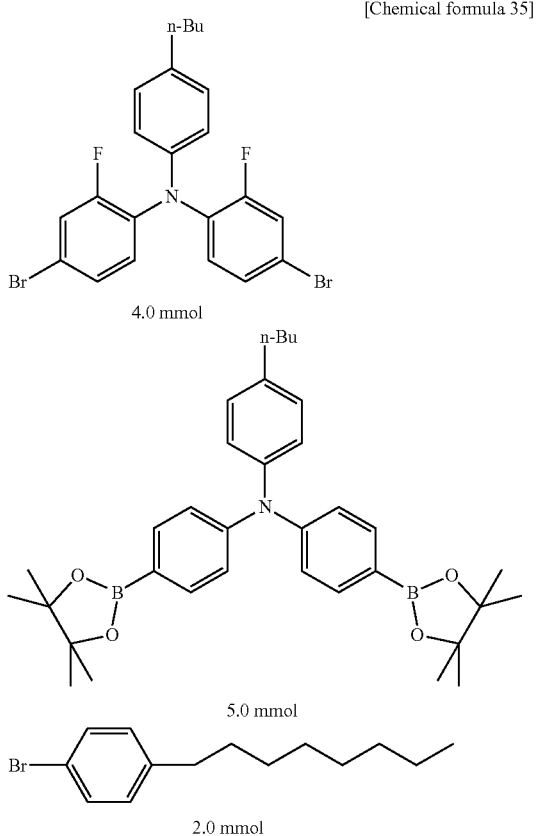

4.0 mmol 5.0 mmol 2.0 mmol (Number Average Molecular Weight and Weight Average Molecular Weight)

The measurement conditions for the number average molecular weight and the weight average molecular weight were as follows.

Apparatus: High-performance liquid chromatograph "Prominence", manufactured by Shimadzu Corporation
  Feed pump (LC-20AD)
  Degassing unit (DGU-20A)
  Autosampler (SIL-20AHT)
  Column oven (CTO-20A)
  PDA detector (SPD-M20A)
  Refractive index detector (RID-20A)
Columns:
  Gelpack (a registered trademark)
  GL-A160S (product number: 686-1J27)
  GL-A150S (product number: 685-1J27)
  manufactured by Hitachi Chemical Co., Ltd.
Eluent: Tetrahydrofuran (THF) (for HPLC, contains stabilizers), manufactured by Wako Pure Chemical Industries, Ltd.
Flow rate: 1 mL/min
Column temperature: 40° C.
Detection wavelength: 254 nm
Molecular weight standards: PStQuick AB/C, manufactured by Tosoh Corporation

[Evaluations of Charge Transport Polymers]

For each charge transport polymer, the methods described below were used to measure the HOMO energy level, the energy gap between the $S_0$ level and the $S_1$ level, and the energy gap between the $S_0$ level and the $T_1$ level. The evaluation results are shown in Table 1.

(HOMO Energy Level)

A toluene solution of the charge transport polymer (concentration: 1.0% by mass) was filtered through a polytetrafluoroethylene filter (13JP020AN, pore size: 0.2 μm, manufactured by the Advantec Group) under normal atmospheric conditions. Further, a quartz glass substrate (22 mm×29 mm×0.7 mm) was irradiated with ultraviolet light for 10 minutes using a desktop light surface processing unit (SSP16-110, manufactured by Sen Lights Corporation, light source: PL16-110A), thereby removing organic matter from the quartz glass substrate. A few drops of the toluene solution of the charge transport polymer were then dripped onto the qua quartz glass substrate, spin coating was performed under conditions including 3,000 $min^{-1}$ for 60 seconds, and the quartz glass substrate was then baked at 120° C. for 10 minutes to form an organic thin film with a thickness of 50 nm. The ionization potential of the organic thin film was then measured using a photoelectron spectrometer (AC-5, manufactured by Riken Keiki Co., Ltd.). The thus obtained value was deemed the HOMO energy level.

($S_1$ Energy)

For an organic thin film obtained using the same method as that described above, the absorption in the wavelength range from 200 to 600 nm was measured using a spectrophotometer (U-3900H, manufactured by Hitachi High-Tech Science Corporation). The $S_1$ energy was determined from the absorption edge wavelength on the long wavelength side of the obtained UV-Vis absorption spectrum.

($T_1$ Energy)

A 2-methyltetrahydrofuran solution of the charge transport polymer (concentration: $1.0 \times 10^{-4}$% by mass) was deoxygenated in a glass measurement tube by performing nitrogen bubbling, and the sample was then gradually immersed in liquid nitrogen and frozen. Using a fluorescence spectrophotometer (F-7000, manufactured by Hitachi High-Tech Science Corporation) and the attached phosphorescence measuring unit, the phosphorescence of the frozen solution was measured in the wavelength range from 400 to 700 nm, and the $T_1$ energy was determined from the peak wavelength at the short wavelength side.

TABLE 1

| Charge transport polymer | HOMO level (absolute value) [eV] | ΔF (S0-S1) [eV] | ΔF (S0-T1) [eV] |
|---|---|---|---|
| c1 | 5.1 | 2.90 | 2.33 |
| e1 | 5.4 | 2.95 | 2.36 |
| e2 | 5.4 | 2.95 | 2.34 |

Compared with the charge transport polymer c1, the charge transport polymers e1 and e2 had deeper HOMO levels, and the $S_1$ energy and $T_1$ energy were larger.

Example II

[Production of Charge Transport Polymers]
(Charge Transport Polymer C1)

With the exception of altering the monomers to the monomers shown below, the same procedure as Example I was used to obtain a charge transport polymer C1 (number average molecular weight: 19,500, weight average molecular weight: 88,000). The ratio (molar ratio) between the structural unit AB and the structural unit C was AB:C=7:4, the ratio (molar ratio) between the structural unit L, the structural unit T and the structural unit B was L:T:B=5:4:2, and the average degree of polymerization was 340.

[Chemical formula 36]

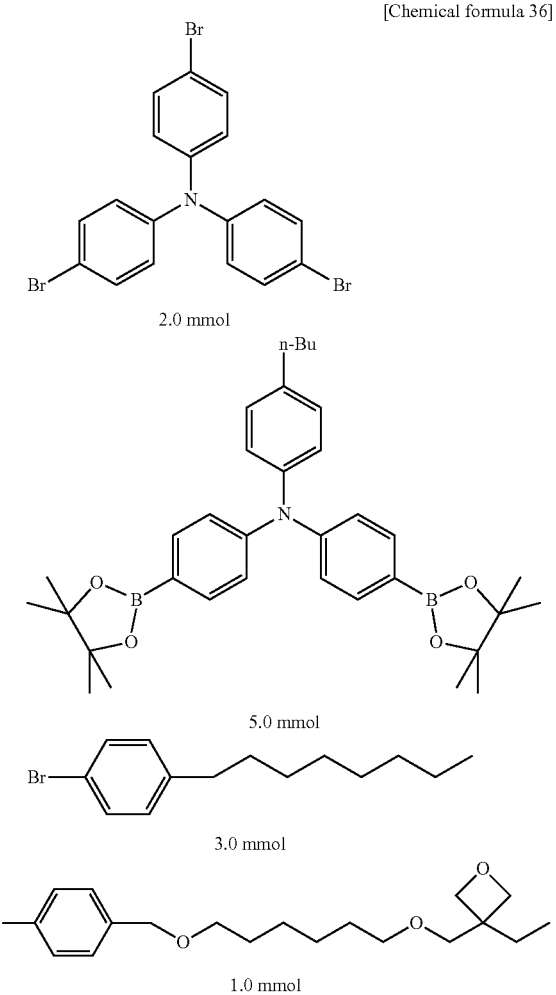

2.0 mmol 5.0 mmol 3.0 mmol 1.0 mmol

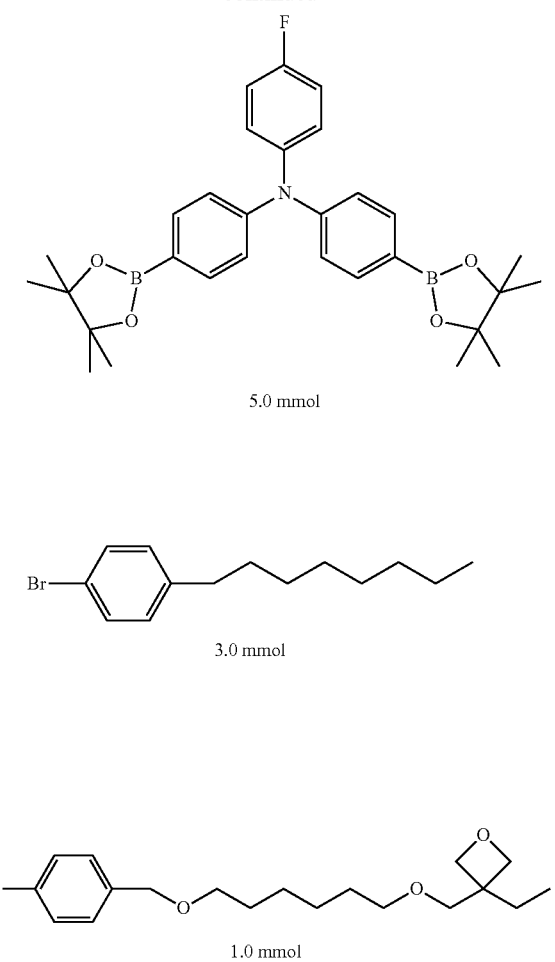

5.0 mmol 3.0 mmol 1.0 mmol (Charge Transport Polymer E1)

With the exception of altering the monomers to the monomers shown below, the same procedure as Example I was used to obtain a charge transport polymer E1 (number average molecular weight: 31,000, weight average molecular weight: 96,500). The ratio (molar ratio) between the structural unit AA, the structural unit AB and the structural unit C was AA:AB:C=5:2:4, the ratio (molar ratio) between the structural unit L, the structural unit T and the structural unit B was L:T:B=5:4:2, and the average degree of polymerization was 399.

(Charge Transport Polymer E2)

With the exception of altering the monomers to the monomers shown below, the same procedure as Example I was used to obtain a charge transport polymer E2 (number average molecular weight: 40,000, weight average molecular weight: 101,000). The ratio (molar ratio) between the structural unit AA, the structural unit AB and the structural unit C was AA:AB:C=5:2:4, the ratio (molar ratio) between the structural unit L, the structural unit T and the structural unit B was L:T:B=5:4:2, and the average degree of polymerization was 367.

[Chemical formula 37]

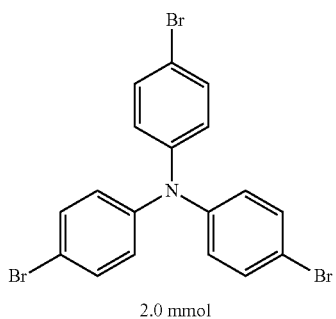

2.0 mmol

[Chemical formula 38]

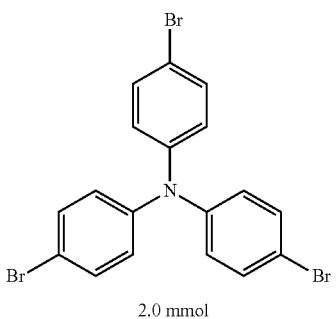

2.0 mmol

-continued

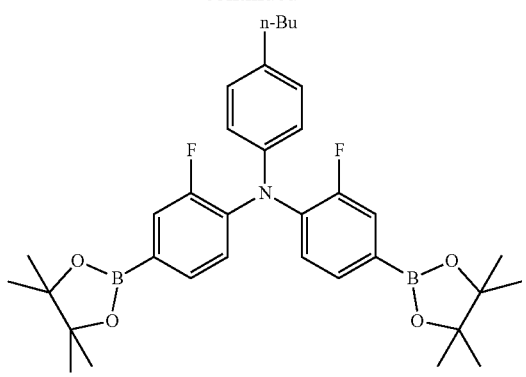

5.0 mmol

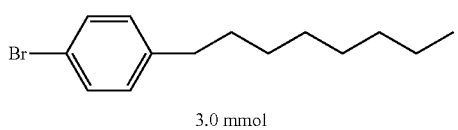

3.0 mmol

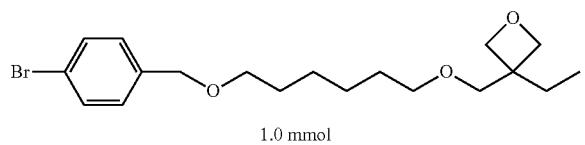

1.0 mmol (Charge Transport Polymer E3)

With the exception of altering the monomers to the monomers shown below, the same procedure as Example I was used to obtain a charge transport polymer E3 (number average molecular weight: 42,000, weight average molecular weight: 105,000). The ratio (molar ratio) between the structural unit AA, the structural unit AB and the structural unit C was AA:AB:C=5:2:4, the ratio (molar ratio) between the structural unit L, the structural unit T and the structural unit B was L:T:B=5:4:2, and the average degree of polymerization was 407.

[Chemical formula 39]

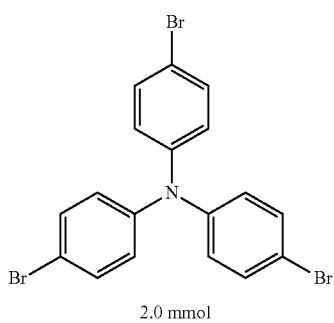

2.0 mmol

-continued

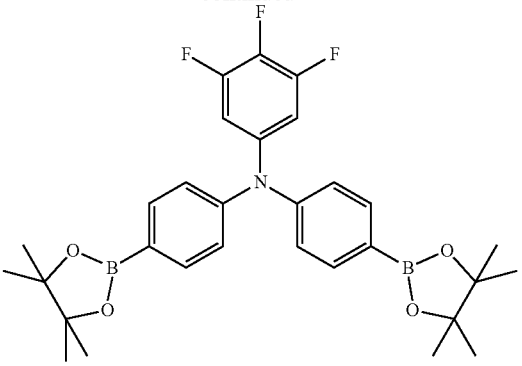

5.0 mmol

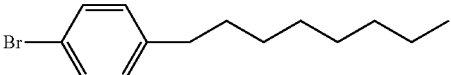

3.0 mmol

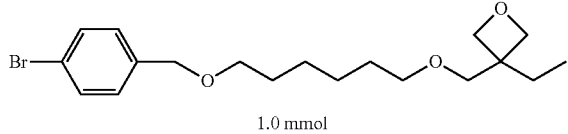

1.0 mmol

[Evaluations of Charge Transport Polymers]

The charge transport polymers were evaluated in the same manner as Example I. The evaluation results are shown in Table 2.

TABLE 2

| Charge transport polymer | Number of fluorine atoms [number] | HOMO level (absolute value) [eV] | ΔE (S0-S1) [eV] | ΔF (S0-T1) [eV] |
|---|---|---|---|---|
| C1 | 0 | 5.1 | 2.88 | 2.31 |
| E1 | 1 | 5.4 | 2.94 | 2.35 |
| E2 | 2 | 5.4 | 2.94 | 2.34 |
| E3 | 3 | 5.7 | 2.97 | 2.34 |

In the table, the number of fluorine atoms indicates the number of fluorine atoms contained in the aromatic amine structure AA. This also applies below. Compared with the charge transport polymer C1, the charge transport polymers E1 to E3 had deeper HOMO levels, and the $S_1$ energy and $T_1$ energy values were larger. In the charge transport polymer E3 in which the number of fluorine atoms was 3, the HOMO level was particularly low, and the $S_1$ energy was particularly large. By introducing fluorine atoms, the HOMO level and the $S_1$ energy and $T_1$ energy can be adjusted.

[Production of Organic EL Elements]

(Organic EL Element C1)

The charge transport polymer C1 (10.0 mg), an electron-accepting compound 1 shown below (0.5 mg) and toluene (2.3 mL) were mixed together under a nitrogen atmosphere to prepare an ink composition. This ink composition was spin-coated at a rotational rate of 3,000 min$^{-1}$ onto a glass substrate (22 mm×29 mm) on which ITO had been patterned with a width of 1.6 mm, and the ink composition was then cured by heating on a hotplate at 220° C. for 10 minutes, thus forming a hole injection layer (25 nm).

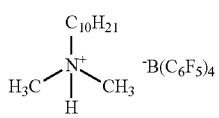

Electron-accepting compound 1

Next, the charge transport polymer C1 (10.0 mg), the electron-accepting compound 1 (0.1 mg) and toluene (1.15 mL) were mixed together to prepare an ink composition. This ink composition was spin-coated at a rotational rate of 3,000 min$^{-1}$ onto the hole injection layer formed in the manner described above, and was then cured by heating on a hotplate at 200° C. for 10 minutes, thus forming a hole transport layer (30 nm). The hole transport layer was able to be formed without dissolving the hole injection layer.

The thus obtained glass substrate was transferred into a vacuum deposition apparatus, layers of CBP:Ir(ppy)$_3$ (94:6, 30 nm), BAlq (10 nm), TPBi (30 nm), LiF (0.8 nm) and Al (100 nm) were deposited by vacuum deposition in that order on top of the hole transport layer, and an encapsulation treatment was then performed to complete production of an organic EL element C1.

(Organic EL Elements E1 to E3)

With the exception of altering the charge transport polymer used in the formation of the hole transport layer to the various charge transport polymers shown in Table 3, Organic EL elements E1 to E3 were produced using the same method as the organic EL element C1.

[Evaluations of Organic EL Elements]

When a voltage was applied to the organic EL elements C1 and E1 to E3, a green light emission was confirmed in each case. For each of these organic EL elements, the emission efficiency (current efficiency) at an emission luminance of 1,000 cd/m$^2$, the drive voltage, and the emission lifespan were measured. The results of the measurements are shown in Table 3 as relative values relative to the organic EL element C1. The current-voltage characteristics were measured using a microammeter (4140B, manufactured by The Hewlett-Packard Company), and the emission luminance was measured using a luminance meter (Pritchard 1980B, manufactured by Photo Research Inc.). Further, the emission lifespan was measured by using a luminance meter (BM-7, manufactured by Topcon Corporation) to measure the luminance while a constant current was applied, and determining the time taken for the luminance to decrease by 30% from the initial luminance (5,000 cd/m$^2$) (the time required to reach a luminance of initial luminance×0.7).

TABLE 3

| Organic EL element | Hole transport layer Charge transport polymer | Number of fluorine atoms [number] | Emission efficiency | Drive voltage | Emission lifespan |
|---|---|---|---|---|---|
| C1 | C1 | 0 | 1.00 | 1.00 | 1.00 |
| E1 | E1 | 1 | 1.26 | 0.97 | 2.53 |
| E2 | E2 | 2 | 1.22 | 1.04 | 1.46 |
| E3 | E3 | 3 | 1.56 | 0.94 | 1.80 |

The organic EL elements E1 to E3 exhibited improved emission efficiency and an increased emission lifespan compared with the organic EL element C1. For the organic EL element E3, the emission efficiency was particularly improved, whereas for the organic EL element E1, the improvement effect on the emission lifespan was particularly large.

Example III

[Production of Charge Transport Polymers]
(Charge Transport Polymer E4)

With the exception of altering the monomers to the monomers shown below, the same procedure as Example I was used to obtain a charge transport polymer E4 (number average molecular weight: 11,000, weight average molecular weight: 66,000). The ratio (molar ratio) between the structural unit AA, the structural unit AB and the structural unit C was AA:AB:C=2:5:4, the ratio (molar ratio) between the structural unit L, the structural unit T and the structural unit B was L:T:B=5:4:2, and the average degree of polymerization was 248.

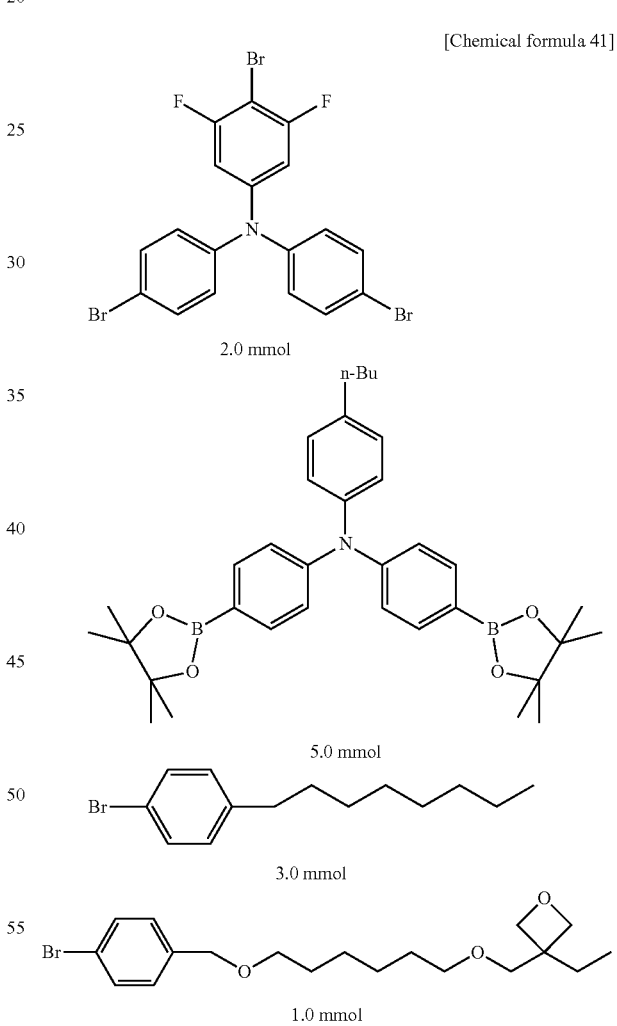

[Chemical formula 41]

(Charge Transport Polymer E5)

With the exception of altering the monomers to the monomers shown below, the same procedure as Example I was used to obtain a charge transport polymer E5 (number average molecular weight: 20,000, weight average molecular weight: 60,000). The ratio (molar ratio) between the structural unit AA, the structural unit AB and the structural unit C was AA:AB:C=2:5:4, the ratio (molar ratio) between the structural unit L, the structural unit T and the structural unit B was L:T:B=5:4:2, and the average degree of polymerization was 222.

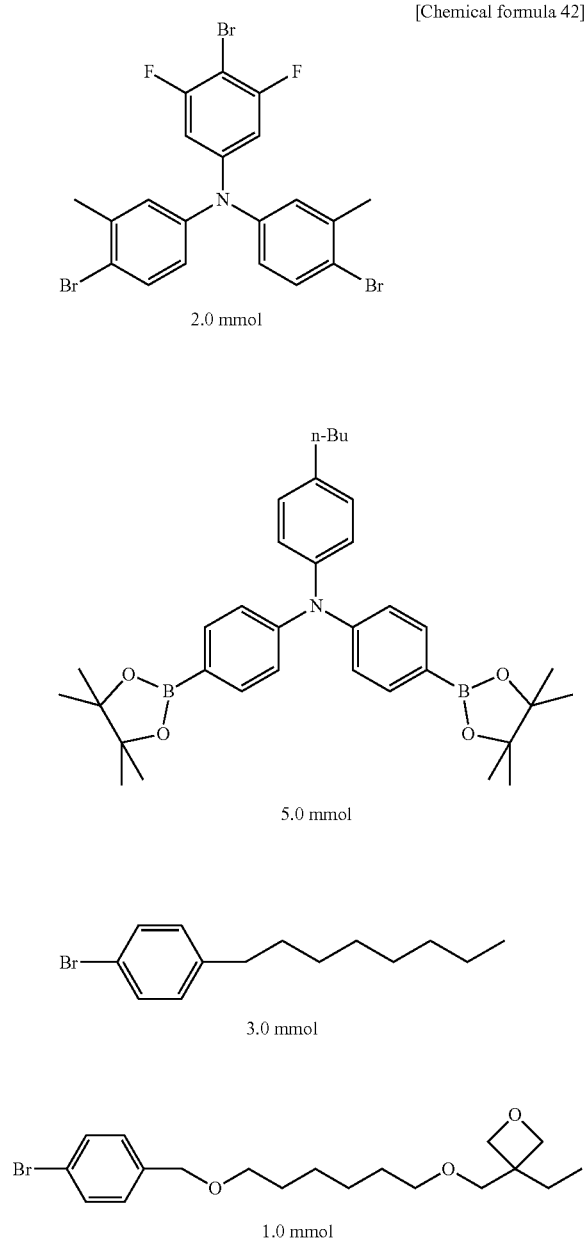

(Charge Transport Polymer E6)

With the exception of altering the monomers to the monomers shown below, the same procedure as Example I was used to obtain a charge transport polymer E6 (number average molecular weight: 11,500, weight average molecular weight: 28,500). The ratio (molar ratio) between the structural unit AA, the structural unit AB and the structural unit C was AA:AB:C=5:2:4, the ratio (molar ratio) between the structural unit L, the structural unit T and the structural unit B was L:T:B=5:4:2, and the average degree of polymerization was 92.

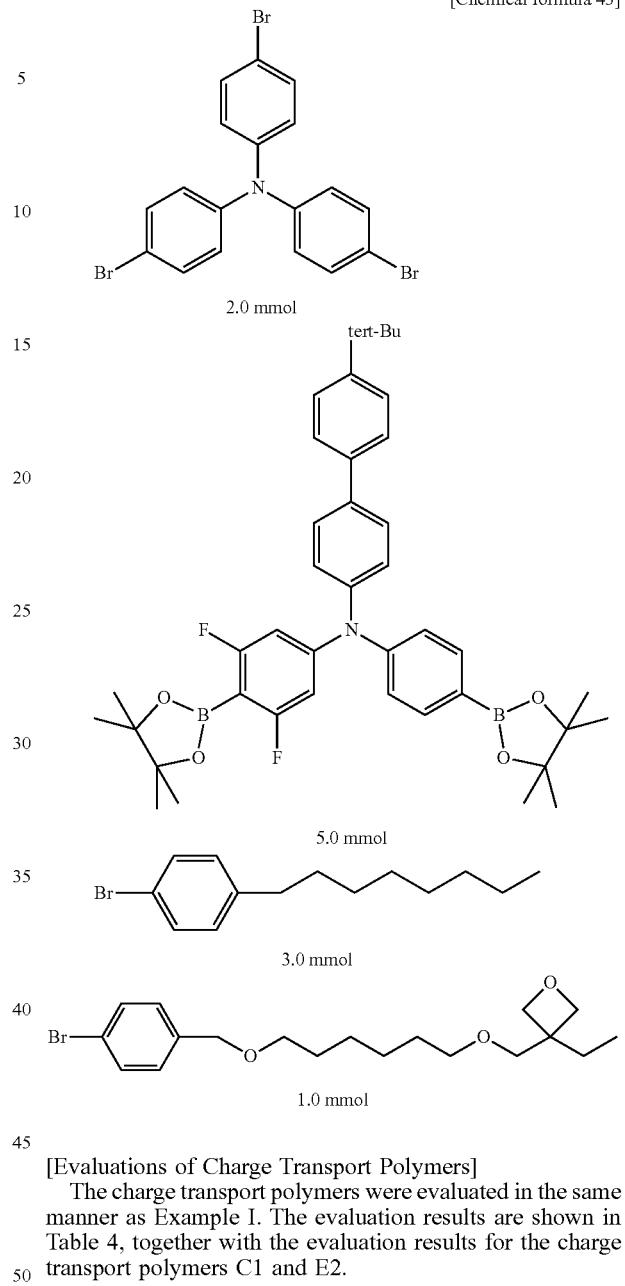

[Evaluations of Charge Transport Polymers]

The charge transport polymers were evaluated in the same manner as Example I. The evaluation results are shown in Table 4, together with the evaluation results for the charge transport polymers C1 and E2.

TABLE 4

| Charge transport polymer | Number of fluorine atoms [number] | HOMO level (absolute value) [eV] | ΔE (S0-S1) [eV] | ΔE (S0-T1) [eV] |
|---|---|---|---|---|
| C1 | 0 | 5.1 | 2.88 | 2.31 |
| E2 | 2 | 5.4 | 2.94 | 2.34 |
| E4 | 2 | 5.3 | 2.98 | 2.36 |
| E5 | 2 | 5.4 | 3.16 | 2.50 |
| E6 | 2 | 5.5 | 2.97 | 2.38 |

Compared with the charge transport polymer C1, the charge transport polymers E4 to E6 had deeper HOMO levels, and the $S_1$ energy and $T_1$ energy values were larger. In the charge transport polymers E4 to E6, the aromatic amine structure AA had fluorine atoms on a phenyl group at the two ortho positions relative to a bonding site to another structure. Compared with the charge transport polymer E2, the charge transport polymers E4 to E6 exhibited larger $S_1$ energy and $T_1$ energy values. Further, in the charge transport polymer E5, the aromatic amine structure AA also had methyl groups on phenyl groups at the ortho positions relative to bonding sites to other structures. The charge transport polymer E5 exhibited particularly large $S_1$ energy and $T_1$ energy values.

[Production of Organic EL Elements]

With the exception of altering the charge transport polymer used in the formation of the hole transport layer to the charge transport polymers shown in Table 5, organic EL elements E4 to E6 were produced using the same method as Example II.

[Evaluations of Organic EL Elements]

The organic EL elements were evaluated in the same manner as Example II. The evaluation results are shown in Table 5, together with the evaluation results for the organic EL elements C1 and E2.

TABLE 5

| Organic EL element | Hole transport layer Charge transport polymer | Number of fluorine atoms [number] | Emission efficiency | Drive voltage | Emission lifespan |
|---|---|---|---|---|---|
| C1 | C1 | 0 | 1.00 | 1.00 | 1.00 |
| E2 | E2 | 2 | 1.22 | 1.04 | 1.46 |
| E4 | E4 | 2 | 1.74 | 0.97 | 3.16 |
| E5 | E5 | 2 | 2.63 | 0.99 | 2.11 |
| E6 | E6 | 2 | 1.80 | 1.00 | 3.79 |

The organic EL elements E4 to E6 exhibited improved emission efficiency and an increased emission lifespan compared with the organic EL elements C1 and E2. For the organic EL element E5, the emission efficiency improved dramatically. On the other hand, for the organic EL elements E4 and E6, the emission lifespan improved significantly compared with that of the organic EL element E5.

Example IV

[Production of Charge Transport Polymer]
(Charge Transport Polymer E7)

With the exception of altering the monomers to the monomers shown below, the same procedure as Example I was used to obtain a charge transport polymer E7 (number average molecular weight: 18,500, weight average molecular weight: 55,500). The ratio (molar ratio) between the structural unit AA and the structural unit C was AA:C=7:4, the ratio (molar ratio) between the structural unit L, the structural unit T and the structural unit B was L:T:B=5:4:2, and the average degree of polymerization was 223.

[Chemical formula 44]

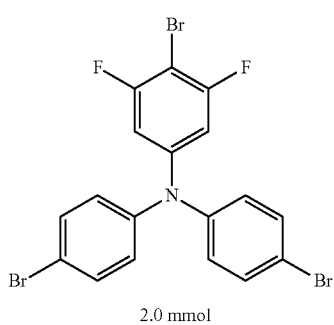

2.0 mmol

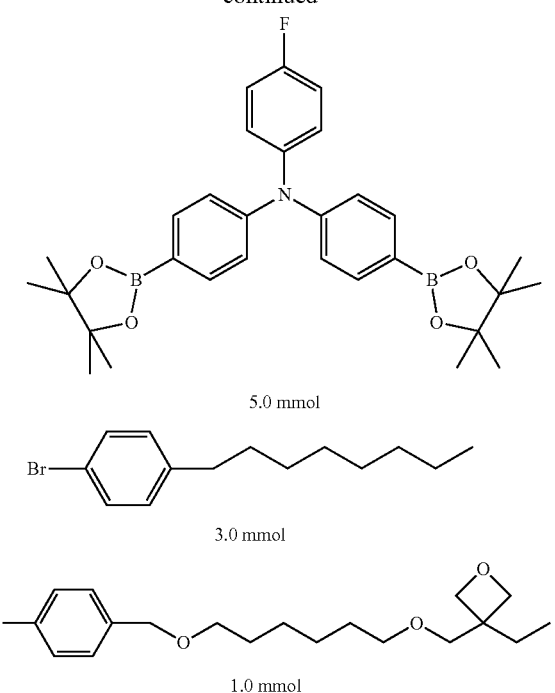

5.0 mmol 3.0 mmol 1.0 mmol

[Evaluations of Charge Transport Polymer]

The charge transport polymer was evaluated in the same manner as Example I. The evaluation results are shown in Table 6, together with the evaluation results for the charge transport polymers C1, E1 and E4.

TABLE 6

| Charge transport polymer | Number of fluorine atoms [number] | HOMO level (absolute value) [eV] | ΔE (S0-S1) [eV] | ΔE (S0-T1) [eV] |
|---|---|---|---|---|
| C1 | 0 | 5.1 | 2.88 | 2.31 |
| E1 | 1 | 5.4 | 2.94 | 2.35 |
| E4 | 2 | 5.3 | 2.98 | 2.36 |
| E7 | 2/1 | 5.6 | 3.01 | 2.38 |

Compared with the charge transport polymer C1, the charge transport polymer E7 had a deeper HOMO level, and the $S_1$ energy and $T_1$ energy values were larger. In the charge transport polymer E7, in which the proportion of the aromatic amine structure AA was high, the HOMO level was deeper than those of the charge transport polymers E1 and E4, and the $S_1$ energy and $T_1$ energy values were also larger.

[Production of Organic EL Element]

With the exception of altering the charge transport polymer used in the formation of the hole transport layer to the charge transport polymer shown in Table 7, an organic EL element E7 was produced using the same method as Example II.

[Evaluations of Organic EL Element]

The organic EL element was evaluated in the same manner as Example II. The evaluation results are shown in Table 7, together with the evaluation results for the organic EL elements C1, E1 and E4.

TABLE 7

| Organic EL element | Hole transport layer Charge transport polymer | Number of fluorine atoms [number] | Emission efficiency | Drive voltage | Emission lifespan |
|---|---|---|---|---|---|
| C1 | C1 | 0 | 1.00 | 1.00 | 1.00 |
| E1 | E1 | 1 | 1.26 | 0.97 | 2.53 |
| E4 | E4 | 2 | 1.74 | 0.97 | 3.16 |
| E7 | E7 | 2/1 | 2.11 | 0.99 | 2.03 |

The organic EL element E7 exhibited improved emission efficiency and an increased emission lifespan compared with the organic EL element C1. Compared with the organic EL elements E1 and E4, the organic EL element E7 exhibited a further improvement in the emission efficiency. On the other hand, the organic EL elements E1 and E4 exhibited a greater improvement effect in the emission lifespan than the organic EL element E7.

Example V

[Production and Evaluation of Organic Layers]
(Organic Layer E1)

The charge transport polymer E1 (10.0 mg), the electron-accepting compound 1 (0.5 mg) and toluene (2.3 mL) were mixed together under a nitrogen atmosphere to prepare an ink composition. This ink composition was spin-coated at a rotational rate of 3,000 min-1 onto a quartz glass substrate (22 mm×29 mm×0.7 mm), and was then cured by heating on a hotplate at 220° C. for 10 minutes, thus forming an organic layer E1 (25 nm). Using the method described below, the residual film ratio of the organic layer E1 was measured to evaluate the solvent resistance of the organic layer E1. The residual film ratio was 95% or higher, indicating that the organic layer E1 had excellent solvent resistance.
(Measurement of Residual Film Ratio)

The quartz glass substrate was grasped with a pair of tweezers, and immersed for one minute in a 200 mL beaker filled with toluene (25° C.). The absorbance (Abs) at the absorption maximum (λmax) in the UV-vis spectrum of the organic layer was measured before and after the immersion, and the residual film ratio of the organic layer was determined from the ratio between the two absorbance values using the formula below. The measurement conditions for the absorbance involved using a spectrophotometer (U-3310, manufactured by Hitachi, Ltd.), and measuring the absorbance of the organic layer at the maximum absorption wavelength within the wavelength range from 300 to 500 nm.

Residual film ratio (%)=Abs of organic layer after immersion/Abs of organic layer before immersion×100 [Numerical Formula 1]

(Organic Layers E2 to E7)

Organic layers E2 to E7 were produced using the charge transport polymers E2 to E7 respectively, and the residual film ratios were measured in the same manner as described above. In each case the residual film ratio was at least 95%. The organic layers E2 to E7 exhibited excellent solvent resistance.

The organic layers E1 to E7 had excellent solvent resistance. The organic layer according to one embodiment can be used as the lower layer beneath an upper layer that is applied by coating (for example, a coated light-emitting layer).

Example VI

[Simulations by Molecular Orbital Method based on Density Functional Theory]

Using a molecular orbital method based on density functional theory, the HOMO energy level, the energy gap between the $S_1$ level and the $S_0$ level, and the energy gap between the $T_1$ level and the $S_0$ level were determined and compared for the various charge transport polymers.

In the density functional method, a typical local density approximation was employed, and a valence electron dual basis composed of a Slater type basis was used as the basis function to determine the total energy of the molecule. A detailed description of the calculation method for the total energy of a molecule using a molecular orbital method based on density functional theory is disclosed, for example, in JP 2010-174051 A. By using density functional theory, the molecular structure can be calculated by calculating the forces acting between atoms, and then optimizing the coordinates for each atom so that the forces between the atoms that constitute the molecule (the total energy of the molecule) reach a minimum.

Figure 4:
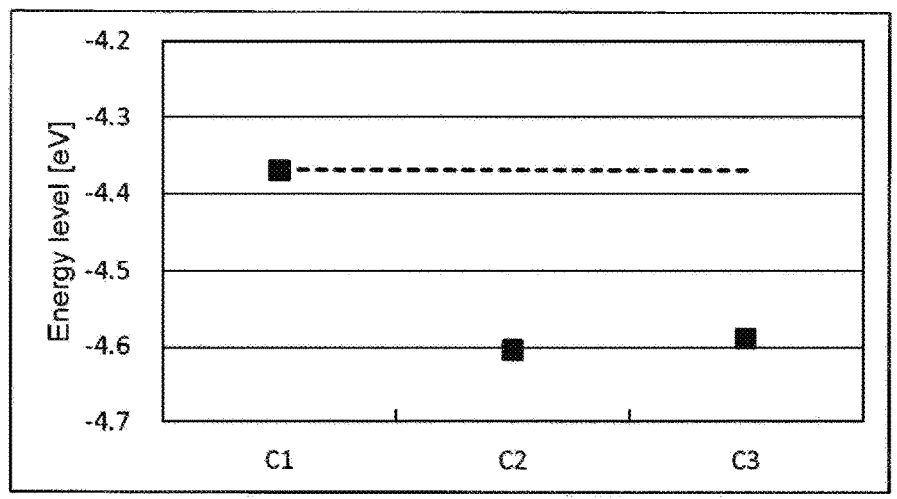
FIG. 4 is a diagram illustrating the simulation results.
Figure 4:
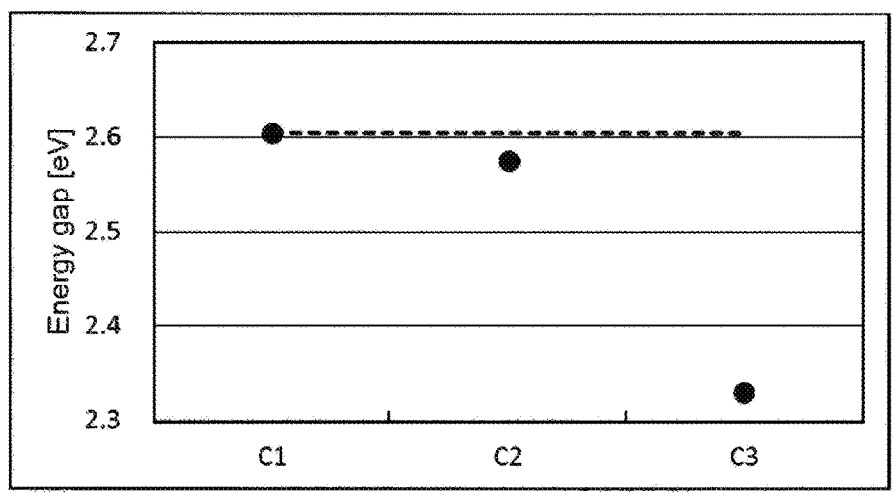
Figure 4:
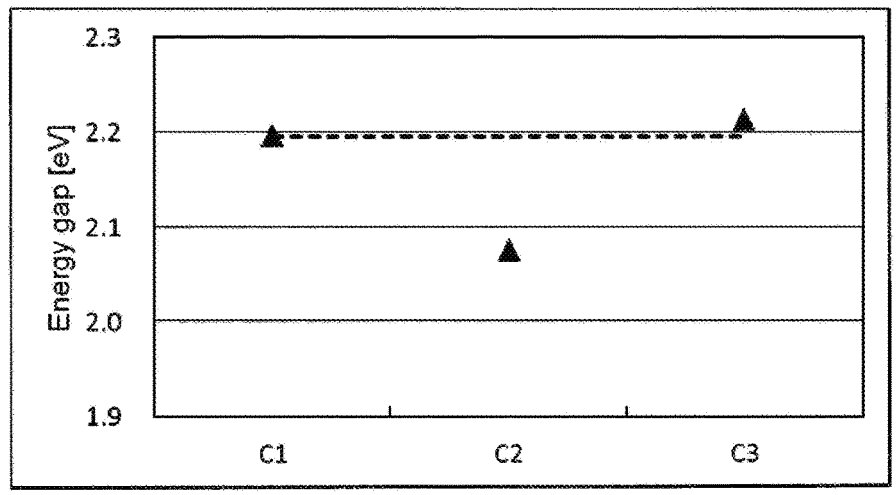
Figure 5:
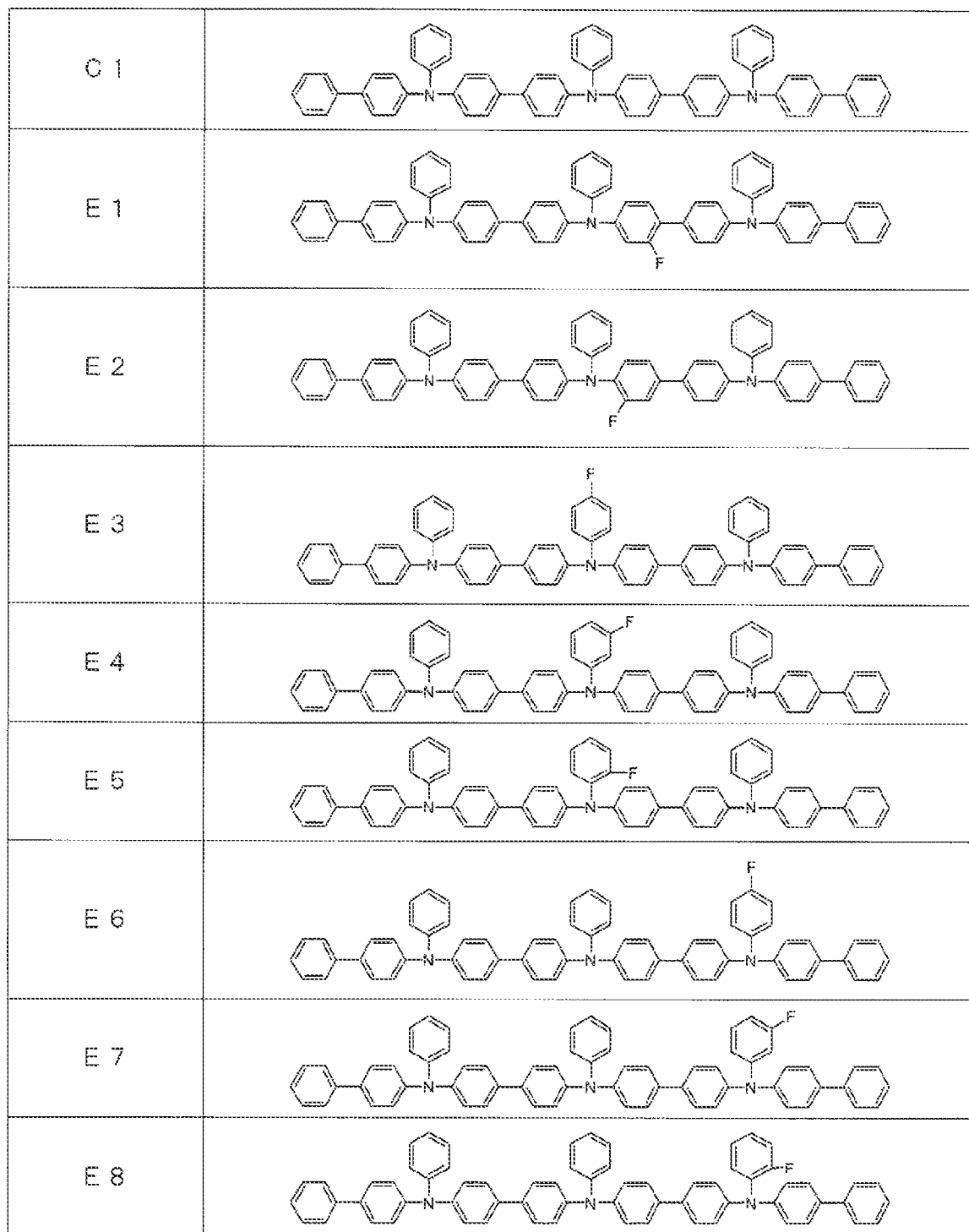
FIG. 5 is a diagram illustrating the structures of charge transport polymers used in simulations.
Figure 6:
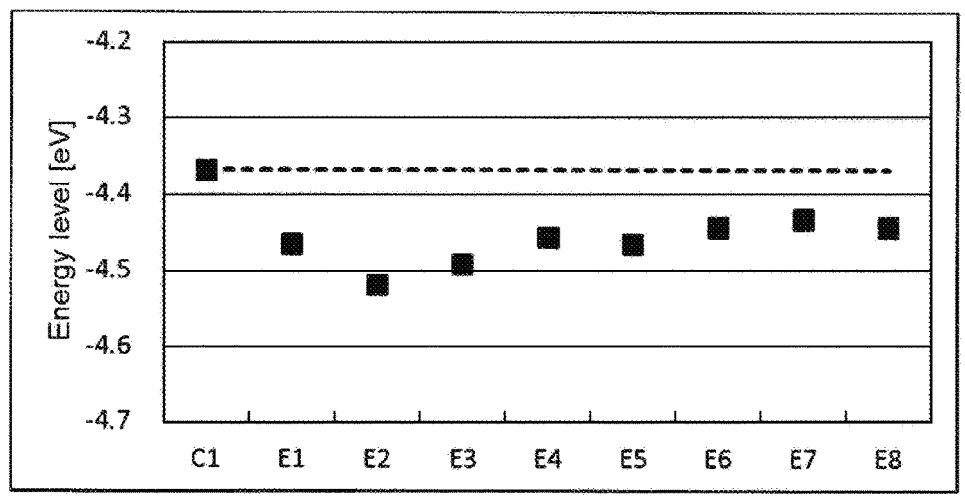
FIG. 6 is a diagram illustrating the simulation results.
Figure 6:
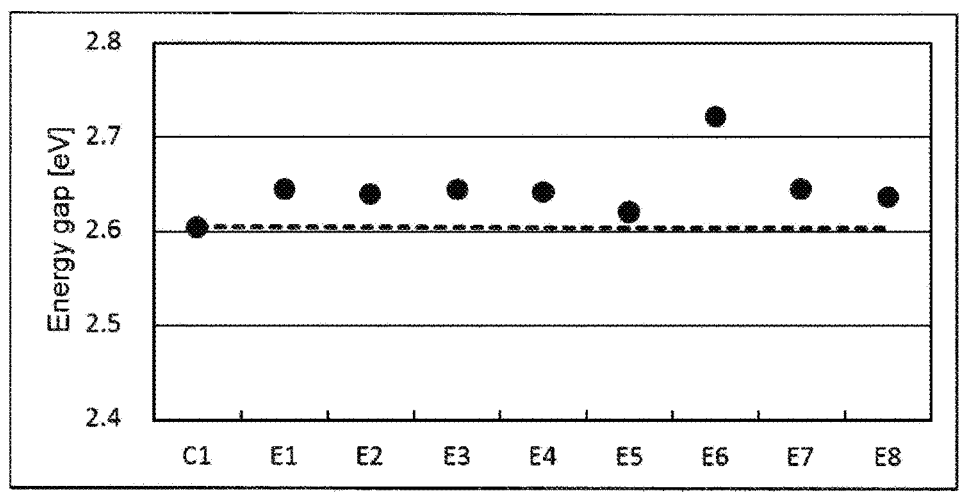
Figure 6:
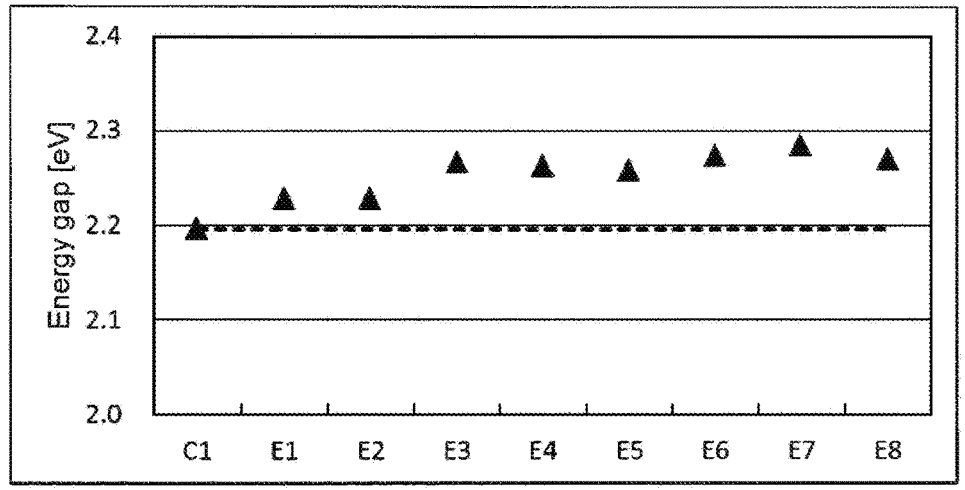
Figure 7A:
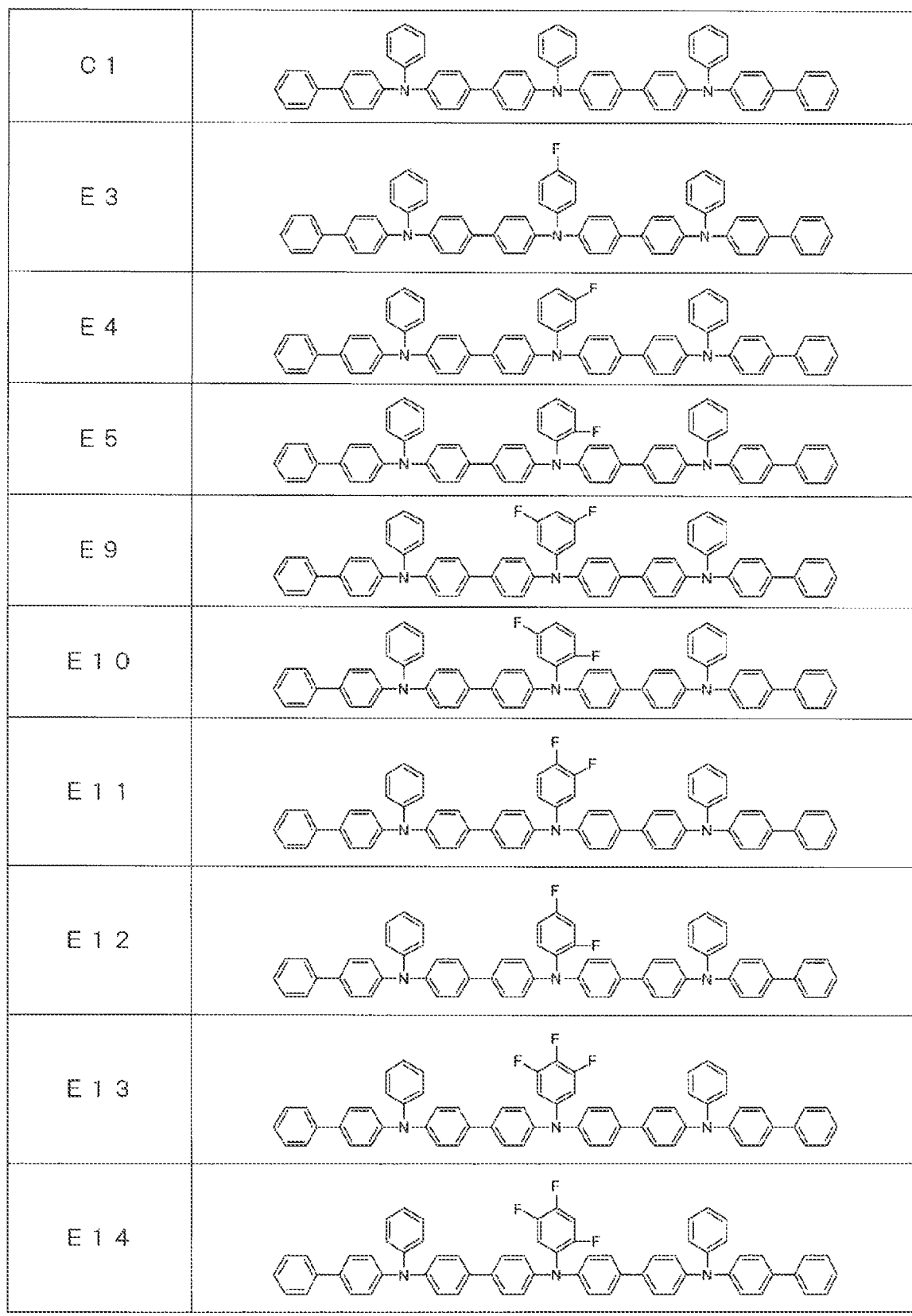
FIG. 7A is a diagram illustrating the structures of charge transport polymers used in simulations.
Figure 7B:
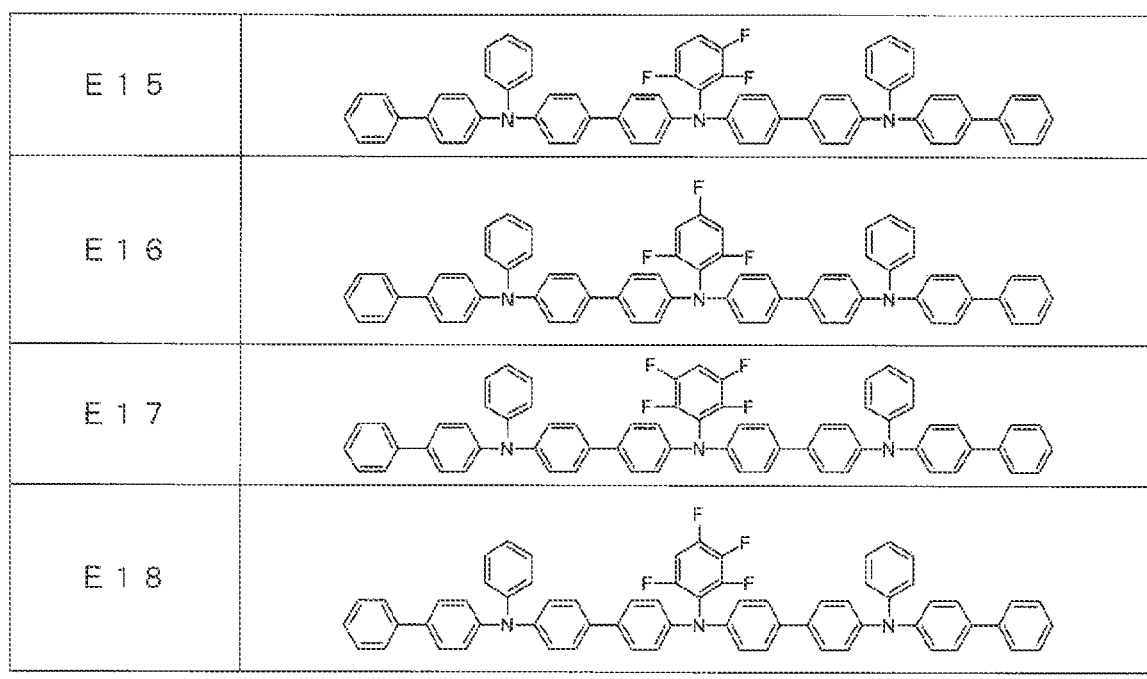
FIG. 7B is a diagram illustrating the structures of charge transport polymers used in simulations.
Figure 8:
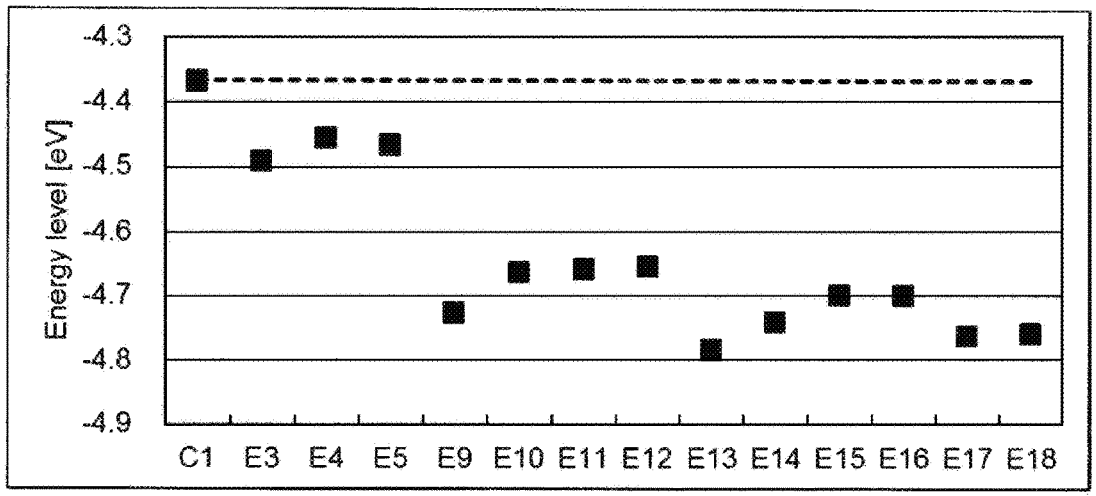
FIG. 8 is a diagram illustrating the simulation results.
Figure 8:
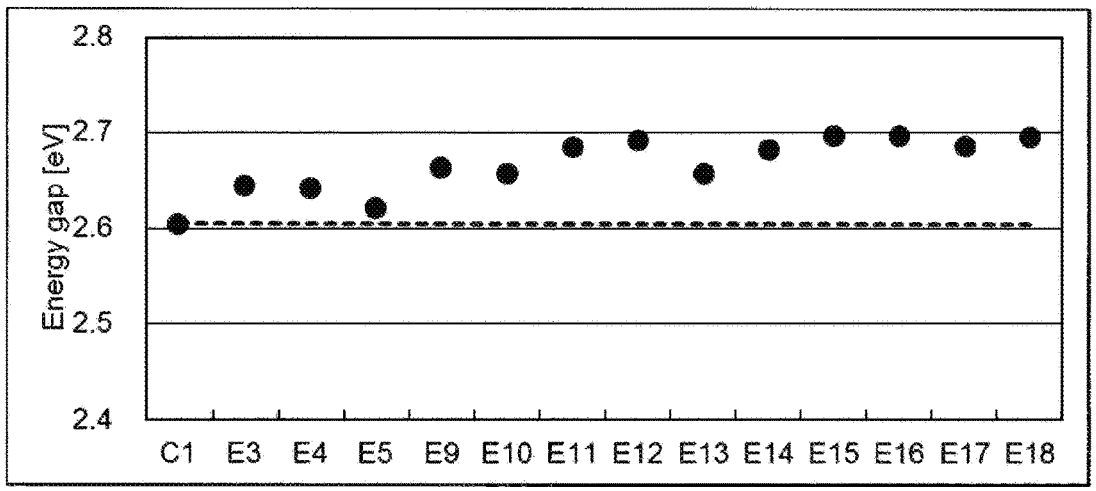
Figure 8:
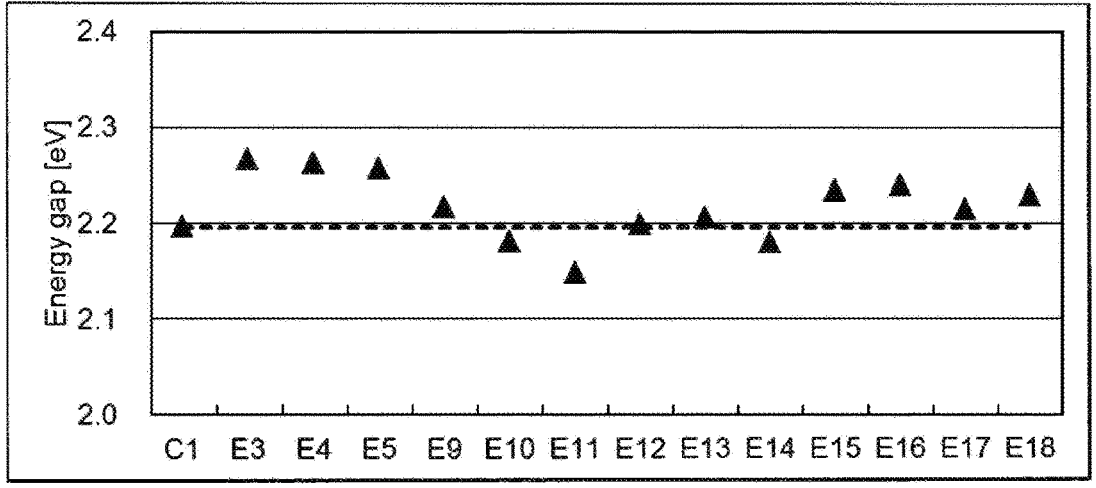

The structures of the charge transport polymers used in the simulations are shown in FIGS. 3, 5, 7A and 7B, and the results of the simulations are shown in FIGS. 4, 6 and 8. In the structure of C1, no electron-withdrawing groups have been introduced into the triphenylamine structure. In the structures of C2 and C3, electron-withdrawing groups other than a fluorine group have been introduced into the triphenylamine structure. The structures of E1 to E18 all have triphenylamine structures substituted with one or more fluorine atoms.

As illustrated in FIG. 4, for C2 and C3, the HOMO level deepened compared with C1, but the $S_1$ energy was smaller.

As illustrated in FIG. 6, for E1 to E8, the HOMO level deepened compared with C1, and the $S_1$ energy and $T_1$ energy values were greater.

As illustrated in FIG. 8, for E9 to E18, the HOMO level deepened compared with C1, and at least the $S_1$ energy was greater. As the number of introduced fluorine atoms increased, the HOMO level tended to deepen, and the $S_1$ energy also tended to be greater.

The tendency for the HOMO level to deepen further and the $S_1$ energy to become greater in those cases where the number of introduced fluorine atoms is large matches the tendency observed in Example II. Further, Examples II to IV also indicate that by using a charge transport polymer having a deep HOMO level and a large $S_1$ energy, the characteristics of the organic EL element can be improved. Based on the results of the simulations, it can be presumed that by introducing aromatic amine structures AA of all manner of embodiments, the energy levels and energy gaps of the charge transport polymer can be adjusted, and an effect can be obtained that improves the characteristics of organic EL elements.

INDUSTRIAL APPLICABILITY

According to one embodiment, an organic electronic material is a material that is suitable for coating methods, and can be used favorably in the production of an organic electronic element using a wet process. Further, according to another embodiment, by including the organic electronic material as an organic layer, the characteristics of an organic electronic element can be improved.

REFERENCE SIGNS LIST

1: Light-emitting layer
2: Anode

3: Hole injection layer
4: Cathode
5: Electron injection layer
6: Hole transport layer
7: Electron transport layer
8: Substrate
11: Organic layer
12: Light-emitting layer

The invention claimed is:

1. An organic electronic material comprising a charge transport polymer or oligomer, wherein the charge transport polymer or oligomer has a structural unit containing an aromatic amine structure substituted with a fluorine atom and also has a structural unit containing an aromatic amine structure that is not substituted with a fluorine atom,
wherein the aromatic amine structure substituted with a fluorine atom includes at least one type of structure selected from the group consisting of the structures shown below:

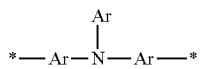

wherein each Ar independently represents an aromatic hydrocarbon group, and at least one Ar is an aromatic hydrocarbon group substituted with one or more fluorine atoms, and each Ar may be independently substituted with a substituent other than a fluorine atom,

wherein each Ar independently represents an aromatic hydrocarbon group, and at least one Ar is an aromatic hydrocarbon group substituted with one or more fluorine atoms, and each Ar may be independently substituted with a substituent other than a fluorine atom, and

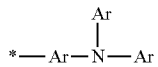

wherein each Ar independently represents an aromatic hydrocarbon group, and at least one Ar is an aromatic hydrocarbon group substituted with one or more fluorine atoms, and each Ar may be independently substituted with a substituent other than a fluorine atom,
wherein the aromatic amine structure that is not substituted with a fluorine atom includes at least one type of structure selected from the group consisting of the structures shown below:

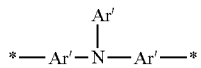

wherein each Ar' independently represents an aromatic hydrocarbon group, and each Ar' may be independently substituted with a substituent other than a fluorine atom,

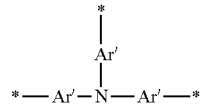

wherein each Ar' independently represents an aromatic hydrocarbon group, and each Ar' may be independently substituted with a substituent other than a fluorine atom, and

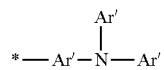

wherein each Ar' independently represents an aromatic hydrocarbon group, and each Ar' may be independently substituted with a substituent other than a fluorine atom, and
wherein the number average molecular weight of the charge transport polymer or oligomer is 3,000 or greater.

2. An organic electronic material comprising a charge transport polymer or oligomer, wherein the charge transport polymer or oligomer has a structural unit containing an aromatic amine structure substituted with a fluorine atom and also has a structural unit containing an aromatic amine structure that is not substituted with a fluorine atom,
wherein the aromatic amine structure substituted with a fluorine atom includes at least one type of structure selected from the group consisting of the structures shown below:

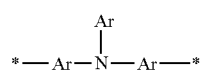

wherein each Ar independently represents an aromatic hydrocarbon group, and at least one Ar is an aromatic hydrocarbon group substituted with one or more fluorine atoms, and each Ar may be independently substituted with a substituent other than a fluorine atom,

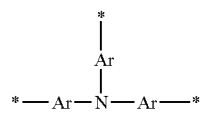

wherein each Ar independently represents an aromatic hydrocarbon group, and at least one Ar is an aromatic hydrocarbon group substituted with one or more fluorine atoms, and each Ar may be independently substituted with a substituent other than a

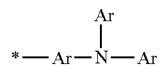

wherein each Ar independently represents an aromatic hydrocarbon group, and at least one Ar is an aromatic hydrocarbon group substituted with one or more fluorine atoms, and each Ar may be independently substituted with a substituent other than a fluorine atom, and wherein the aromatic amine structure that is not substituted with a fluorine atom includes at least one type of structure selected from the group consisting of the structures shown below:

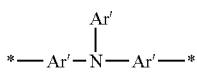

wherein each Ar' independently represents an aromatic hydrocarbon group, and each Ar' may be independently substituted with a substituent other than a fluorine atom,

wherein each Ar' independently represents an aromatic hydrocarbon group, and each Ar' may be independently substituted with a substituent other than a fluorine atom, and

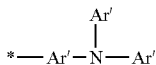

wherein each Ar' independently represents an aromatic hydrocarbon group, and each Ar' may be independently substituted with a substituent other than a fluorine atom.

3. The organic electronic material according to claim 2, wherein the charge transport polymer or oligomer has a polymerizable functional group.

4. The organic electronic material according to claim 2, further comprising an onium salt.

5. An ink composition comprising the organic electronic material according to claim 2 and a solvent.

6. A method for producing an organic layer comprising a step of applying the ink composition according to claim 5.

7. A method for producing an organic electronic element comprising a step of applying the ink composition according to claim 5.

8. A method for producing an organic electroluminescent element comprising a step of applying the ink composition according to claim 5.

9. An organic layer comprising the organic electronic material according to claim 2.

10. An organic electronic element comprising at least one of the organic layer according to claim 9.

11. An organic electroluminescent element comprising at least the organic layer according to claim 9 and a light-emitting layer that contacts the organic layer.

12. An organic electroluminescent element comprising at least an anode, a hole injection layer, a hole transport layer, a light-emitting layer and a cathode, wherein the hole transport layer is the organic layer according to claim 9.

13. An organic electroluminescent element comprising at least one of the organic layer according to claim 9.

14. The organic electroluminescent element according to claim 13, further comprising a flexible substrate.

15. The organic electroluminescent element according to claim 13, further comprising a resin film substrate.

16. A display element comprising the organic electroluminescent element according to claim 13.

17. An illumination device comprising the organic electroluminescent element according to claim 13.

18. A display device comprising the illumination device according to claim 17, and a liquid crystal element as a display unit.

19. The organic electronic material according to claim 2, wherein the aromatic amine structure substituted with a fluorine atom includes at least one type of structure selected from the group consisting of the structures shown below:

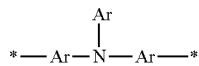

wherein each Ar independently represents an aromatic hydrocarbon group, and at least one Ar is an aromatic hydrocarbon group substituted with one or more fluorine atoms, and each Ar may be independently substituted with a substituent other than a fluorine atom, and

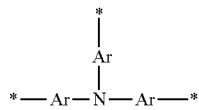

wherein each Ar independently represents an aromatic hydrocarbon group, and at least one Ar is an aromatic hydrocarbon group substituted with one or more fluorine atoms, and each Ar may be independently substituted with a substituent other than a fluorine atom.

20. The organic electronic material according to claim 19, wherein the number of substituents other than a fluorine atom contained in the aromatic amine structure is 3 or fewer.

21. The organic electronic material according to claim 19, wherein the number average molecular weight of the charge transport polymer or oligomer is 5,000 or greater.

22. The organic electronic material according to claim 19, wherein the number average molecular weight of the charge transport polymer or oligomer is 10,000 or greater.

23. The organic electronic material according to claim 2, wherein the number of substituents other than a fluorine atom contained in the aromatic amine structure is 3 or fewer.

24. The organic electronic material according to claim 2, wherein the number average molecular weight of the charge transport polymer or oligomer is 5,000 or greater.

25. The organic electronic material according to claim 2, wherein the number average molecular weight of the charge transport polymer or oligomer is 10,000 or greater.

* * * * *